US007127694B2

(12) United States Patent
Watanabe et al.

(10) Patent No.: US 7,127,694 B2
(45) Date of Patent: Oct. 24, 2006

(54) COMPUTER IMPLEMENTED DESIGN SYSTEM, A COMPUTER IMPLEMENTED DESIGN METHOD, A RETICLE SET, AND AN INTEGRATED CIRCUIT

(75) Inventors: Atsushi Watanabe, Yokohama (JP); Mutsunori Igarashi, Yokohama (JP)

(73) Assignee: Kabushiki Kaisha Toshiba(JP)

( * ) Notice: Subject to any disclaimer, the term of this patent is extended or adjusted under 35 U.S.C. 154(b) by 317 days.

(21) Appl. No.: 10/842,210

(22) Filed: May 10, 2004

(65) Prior Publication Data

US 2005/0166176 A1 Jul. 28, 2005

(30) Foreign Application Priority Data

Jan. 26, 2004 (JP) ............................ P2004-016869

(51) Int. Cl.
*G06F 17/50* (2006.01)

(52) U.S. Cl. .............................. 716/9; 716/10; 716/11; 716/12

(58) Field of Classification Search ............... 716/8–13
See application file for complete search history.

(56) References Cited

U.S. PATENT DOCUMENTS

| 6,436,804 B1 | 8/2002 | Igarashi et al. | |
|---|---|---|---|
| 7,051,308 B1* | 5/2006 | McManus et al. | ............. 716/9 |
| 2003/0005390 A1 | 1/2003 | Hashimoto et al. | |
| 2003/0005399 A1* | 1/2003 | Igarashi et al. | ................ 716/8 |

* cited by examiner

Primary Examiner—Paul Dinh
(74) Attorney, Agent, or Firm—DLA Piper US LLP

(57) ABSTRACT

A reticle set includes a first reticle including a first wiring pattern having a first termination pattern; a second reticle including a plurality of via patterns; and a third reticle including a second wiring pattern having a second termination pattern and a second line pattern connected to an end of the second termination pattern.

4 Claims, 71 Drawing Sheets

ENVIRONMENT PROFILES
(POSITIONAL RELATIONSHIP c)

ENVIRONMENT PROFILE (DISTANCE r)

FIG. 9

| ENVIRONMENT PROFILE OF OPTIMAL VIA LIST | | | |
|---|---|---|---|
| POSITIONAL RELATIONSHIP c \ DISTANCE r | 1-5 | 5-10 | 10-∞ |
| 0000001 | 0 (MAGNITUDE) | 5 | 20 |
| 0000010 | 0 | 5 | 25 |
| 0000100 | 0 | 5 | 20 |
| ⋮ | ⋮ | ⋮ | ⋮ |
| 1111111 | 0 | 0 | 5 |

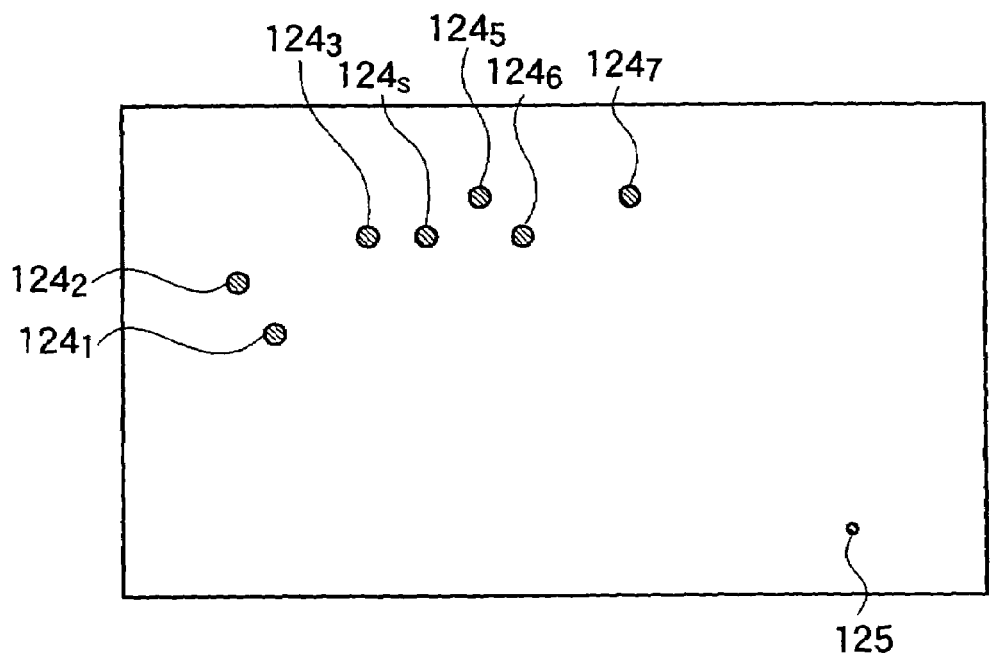
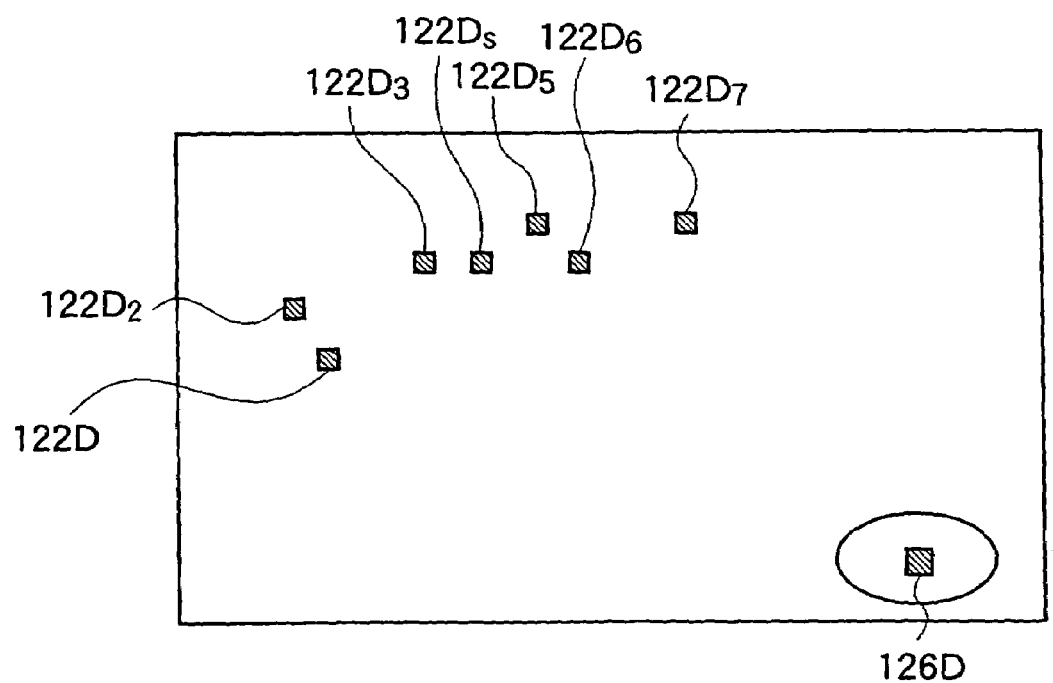

FIG. 31
(a)
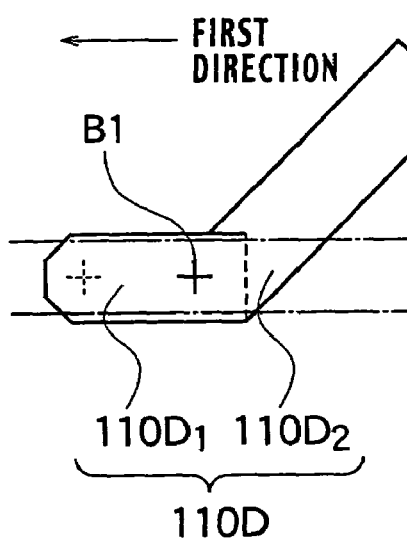
(b)
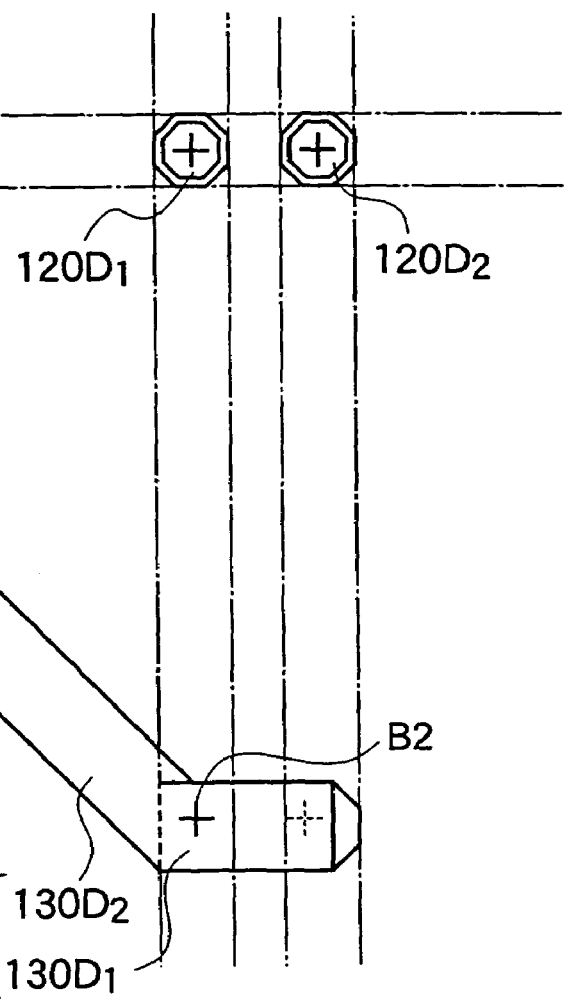
(c)
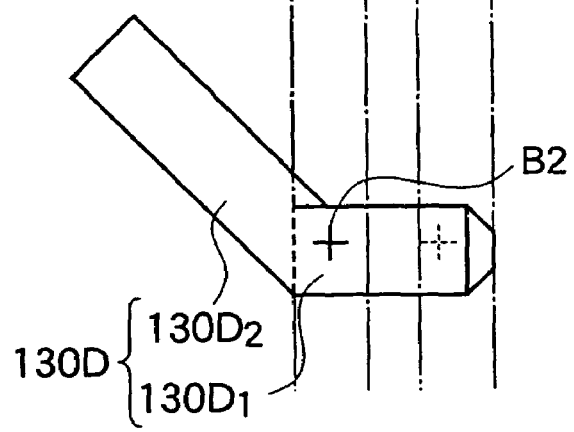

FIG. 32
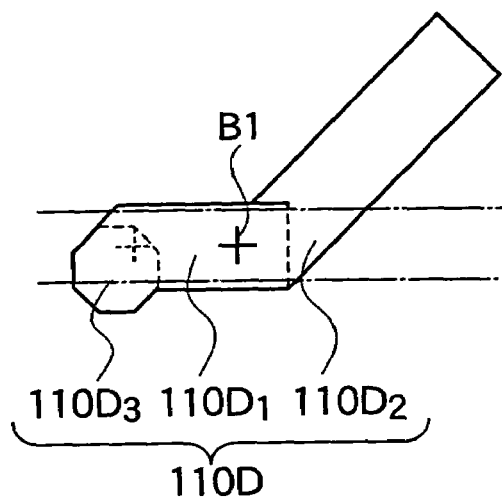
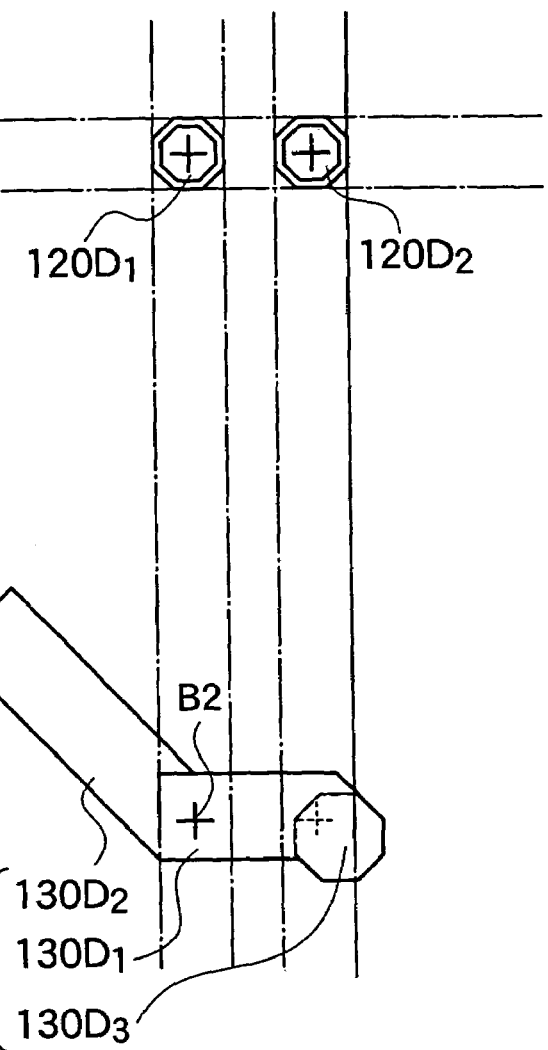

COMPUTER IMPLEMENTED DESIGN SYSTEM, A COMPUTER IMPLEMENTED DESIGN METHOD, A RETICLE SET, AND AN INTEGRATED CIRCUIT

CROSS REFERENCE TO RELATED APPLICATIONS

This application is based upon and claims the benefit of priority from the prior Japanese Patent Applications No. P2004-016869, filed on Jan. 26, 2004; the entire contents of which are incorporated herein by reference.

BACKGROUND OF THE INVENTION

1. Field of the Invention

The present invention relates to a computer implemented design system, more specifically to a computer implemented design system and computer implemented design method for manufacturing a reticle set and an integrated circuit using diagonal wiring techniques.

2. Description of the Related Art

With the increased miniaturization of an semiconductor integrated circuit (semiconductor IC), it becomes difficult to manufacture a semiconductor device on a silicon substrate as designed. Therefore, various methodologies are developed to fabricate the semiconductor device as designed, so as to achieve high manufacturing yield and high reliability of the device.

When producing a mask of the semiconductor IC using fine wiring patterns with a width of not more than 0.2 μm, optical proximity correction (OPC) associated with pattern density is widely applied. As for the so-called "isolated wiring pattern" located in the region with sparse patterns, the wiring pattern width of a reticle is increased here to prevent defects in the course of the process such as the reduction in width of isolated wiring patterns. The defect of the width of isolated wiring patterns exists also in case of the isolated vias connecting different wiring layers. Especially, in designs using a rule with a line width of not more than 0.14 μm, there have been various techniques proposed in OPC such as the replacement of an isolated via with a via pattern optimized in advance.

When connecting wirings of a semiconductor IC, up to this time, only a single via has been used when connecting a wiring layer and another layer. However, in recent years, a measure has been employed that improves the reliability of wiring by arranging a plurality of vias in positions which have less influence on the degree of integration of the semiconductor circuit even if the wiring efficiency is lowered.

In order to manufacture the semiconductor IC as designed and improve the reliability, there is a method of adding dummy patterns to a design pattern after the wiring design. This method assists the manufacturing of the semiconductor IC by generating dummy patterns on a design pattern to keep the density distribution of the pattern uniform in metallic wiring layers. This is generally known as a "metal fill process". The earlier techniques of the metal fill process are to generate dummy patterns by performing a logical operation of topology for blank area on a design layout or to generate an array of rectangles in the regions without wiring.

There is a demand for a basic cell mounted on the semiconductor IC to have a basic transistor with increased driving capability. The "increase in driving capability" means an increase in the gate width of the transistor. This generates a demand for cell size to be increased. A method of increasing the cell size in a gate width direction to improve the driving capability or a method of increasing the gate length and using bent gates or branch gates inside the cell has up to this time, employed.

However, the aforementioned methods were inadequate as countermeasures were needed to manufacture the semiconductor IC according to design values or increase the amount of production reliability.

In the OPC process which increases wiring width or via size for an isolated wiring generated on an existing pattern, a large amount of data is processed, and this processing time is increased. Using a technique of replacing an isolated via isolated from other wiring with a via pattern optimized in advance on a layout, the processing time can be shortened. However, sufficient examination has not been made on the optical proximity effect on the relationship between an isolated via and other vias in the vicinity of the isolated via. In some cases, the isolated via pattern is reduced in size after exposure, and the yield thereof is lowered.

In the earlier method of connecting wirings, when a plurality of vias are used, a line segment bent at 90 degrees is generated in any one of the wiring layers. To delineated the angle of 90 degrees according to the design value, various measures have been performed by OPC, mask data preparation (MDP), or the like. However, roundness is produced in the portion bent at 90 degrees on the substrate actually formed. Therefore, when metallic wirings of upper and lower wiring layers are connected by use of a plurality of vias, a phenomenon, which is called as "shortening", occurs in which a metallic wiring does not reach the place where a via is located, thus causing a connection defect.

The method of performing logical operations of a layout topology desired to be designed to generate dummy patterns in a region with no wiring, is effective in the case where the object figures are basically rectangles. However, when a number of diagonal figures are included in the design pattern by employment of the diagonal wiring, simple topological operations generate controversial figures in the course of the process. Therefore, a further process is required to modify the controversial figures, thus the process becomes complicated. The method of arranging rectangles in an array cannot generate any desired dummy patterns but in some cases it can, depending on the combinations with a diagonal figure.

By the earlier technique to increase the cell size in the gate width direction to improve the driving capability or the earlier technique to increase the cell length in the gate length direction and to employ bent gates or branch gates inside the cell, the degree of integration of wirings arranged in each cell is lowered.

SUMMARY OF THE INVENTION

An aspect of the present invention inheres in a reticle set encompassing a first reticle including a first reticle including a first wiring pattern having a strip-shaped first termination pattern; a second reticle including a plurality of via patterns so as to overlap with the first termination pattern; and a third reticle including a second wiring pattern having a strip-shaped second termination pattern and a second line pattern connected to an end of the second termination pattern, the second termination pattern being extended in the same direction as the first termination pattern so as to overlap with the first termination pattern, and the second line pattern extends diagonal to the direction the second termination pattern extends.

Another aspect of the present invention inheres in a integrated circuit encompassing a first wiring including a strip-shaped first termination; an interlayer dielectric arranged on the first wiring; a plurality of via plugs embedded in the interlayer dielectric and connected to the first termination; and a second wiring including a strip-shaped second termination and a second line on the interlayer dielectric, the second termination being extended in the same direction as the first termination so as to overlap with the first termination, and the second line connected to an end of the second termination and extends diagonal to the direction the second termination extends.

Still another aspect of the present invention inheres in a computer implemented design system encompassing a library information storage section configured to store geometry information of a cell disposed on a substrate, a plurality of wirings connected to the cell, and a provisional via between the wirings; a layout design information storage section configured to store design information of the cell, the wirings, and the provisional via; an optimal via list creating unit configured to read the geometry information from the library information storage section and the design information from the layout design information storage section, and to create an optimal via list by optimizing the geometry and size of the provisional via based on environment profiles of the provisional via; an optimal via list storage section configured to store the optimal via list; a layout design unit configured to design an integrated circuit by reading the geometry information from the library information storage section and the design information from the layout design information storage section and arrange the cell, the wirings and the provisional via on a layout; and an optimal via replacement unit configured to extract the provisional via from the layout and replace the provisional via with the optimal via stored in the optimal via list storage section based on the environment profiles of the provisional via.

Still another aspect of the present invention inheres in a computer implemented design method encompassing storing geometry information of a cell disposed on a substrate, a plurality of wirings connected to the cell, and a provisional via between the wirings in a library information storage section; storing design information of the cell, the wirings, and the provisional via in a layout design information storage section; reading the geometry information and the design information and creating an optimal via list by optimizing the geometry and size of the provisional via based on environment profiles of the provisional via by an optimal via list creating unit; storing the optimal via list in an optimal via list storage section; designing an integrated circuit by reading the geometry information from the library information storage section and the design information from the layout design information storage section and arrange the cell, the wirings and the provisional via on a layout by a layout design unit; and extracting the provisional via from the layout and replacing the provisional via with the optimal via stored in the optimal via list storage section based on the environment profiles of the provisional via by an optimal via replacement unit.

BRIEF DESCRIPTION OF DRAWINGS

FIG. 9 is a conceptual diagram illustrating an example of optimal via list according to the first embodiment of the present invention.

FIG. 18 is a plane view illustrating a part of a integrated circuit manufactured by using the reticle as shown in FIG. 17.

FIG. 19 is plane view illustrating an example of a layout designed by the computer implemented design system and replacing the provisional via with the optimal via by the optimal via replacing unit as shown in FIG. 1.

FIGS. 31 and 32 are plane views illustrating an example of a layout designed by the layout design unit according to the second embodiment of the present invention.

DETAILED DESCRIPTION OF THE INVENTION

Figure 1:
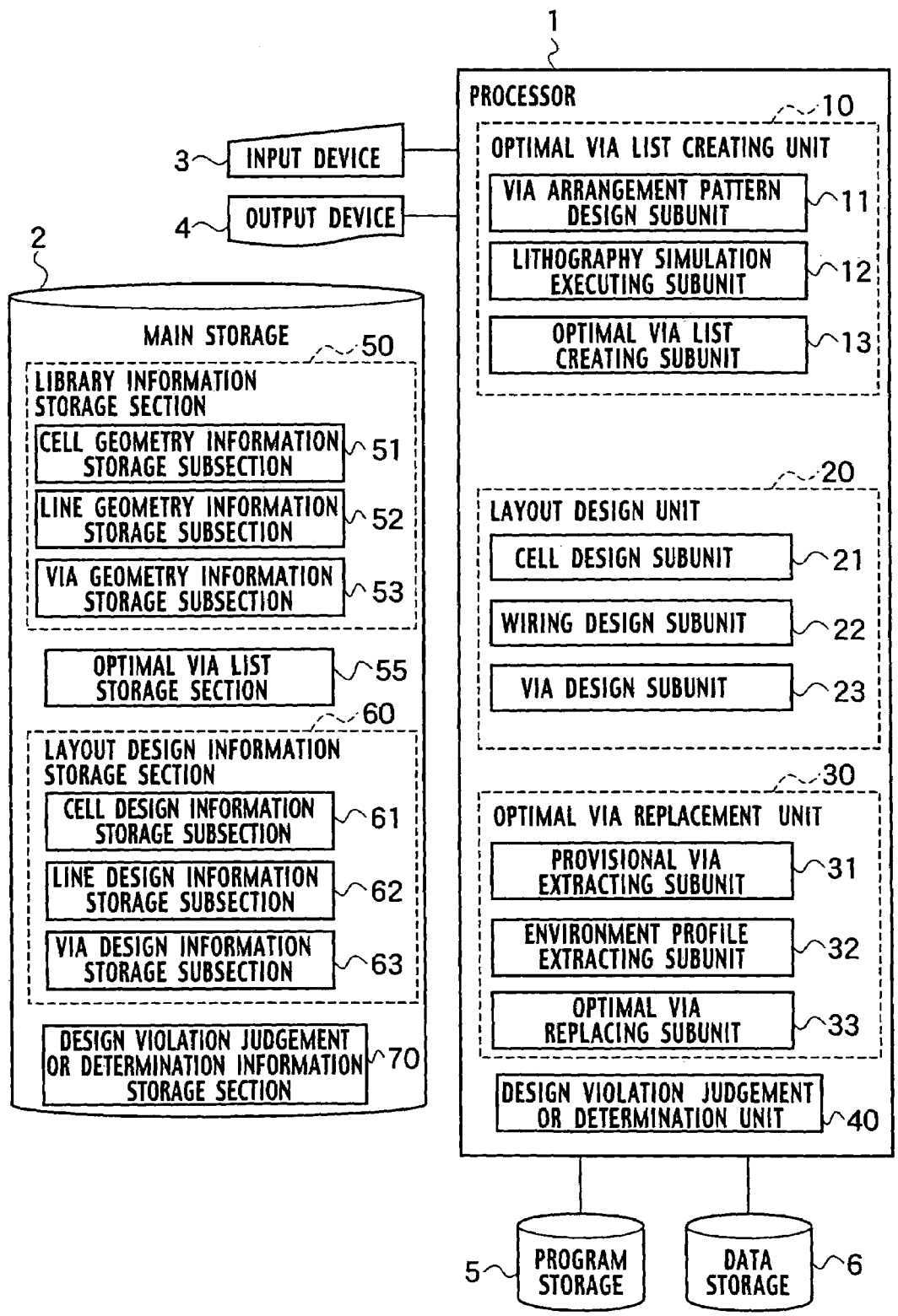
FIG. 1 is a block diagram illustrating a computer implemented design system according to a first embodiment of the present invention.

Various embodiments of the present invention will be described with reference to the accompanying drawings. It is to be noted that the same or similar reference numerals are applied to the same or similar parts and elements throughout the drawings, and the descriptions of the same or similar parts and elements will be omitted or simplified. Generally, and as it is earlier technique in the representation of semiconductor ICs, it will be appreciated that the various drawings are not drawn to scale from one figure to another nor inside a given figure, and in particular that the layer thicknesses are arbitrarily drawn for facilitating the reading of the drawings. In the following descriptions, numerous details are set forth such as specific signal values, etc. to provide a thorough understanding of the present invention. However, it will be obvious to those skilled in the art that the present invention may be practiced without such specific details. Hereinafter, the words "upper", "lower", "right", and "left" will designate directions in the drawings to which reference is made.

(First Embodiment)

-Computer Implemented Design System-

As shown in FIG. 1, computer implemented design system according to a first embodiment of the present invention includes a computer system having an input device 3, a processor (CPU) 1, an output device 4, a main storage 2, a program storage 5, and a data storage 6. The input device 3 accepts input of data, instructions, and the like from an operator. The processor (CPU) 1 executes various operations such as layout design. The output device 4 outputs a layout result and the like. The main storage 2 stores predetermined data necessary for layout design of a semiconductor IC and the like. The main storage 2, the input device 3, the output device 4, the program storage 5, and the data storage 6 are individually connected to the CPU 1.

The CPU 1 includes an optimal via list creating unit 10, a layout design unit 20, an optimal via replacement unit 30, and a design violation judging or determination unit 40. The "optimal via list" is a file including "optimal vias" listed in terms of arrangement environment of the design layout. The geometry and size of each optimal via are optimized as a result of execution of lithography simulation based on consideration of an arrangement environment such as positional relationships and distances between a via (hereinafter, referred to as a "provisional via") which can be automatically designed by the layout design unit 20 and other vias (hereinafter, referred to as "adjacent vias") located around the provisional via.

The optimal via list creating unit 10 includes a via arrangement pattern design subunit 11, a lithography simulation subunit 12, and an optimal via list creating subunit 13. The via arrangement pattern design subunit 11 performs an automatic arrangement process based on via geometry information and via design information stored in the main storage 2 and generates a via arrangement pattern example of all provisional vias which can be designed by the layout design unit 20. The lithography simulation subunit 12 performs lithography simulation based on the via arrangement pattern example of the provisional vias designed by the via arrangement pattern design subunit 11.

Figure 4:
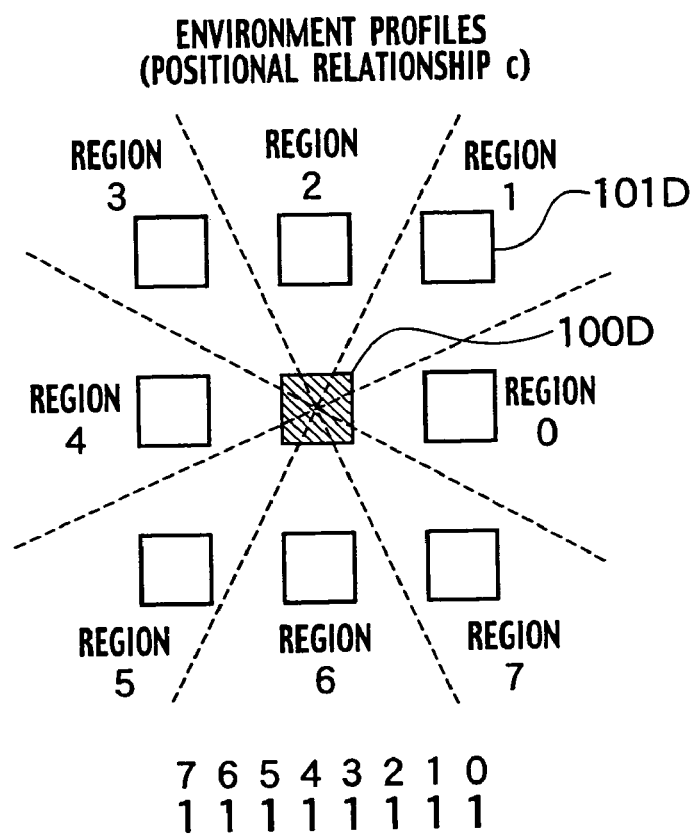
FIG. 4 shows an example of the extracting method of an environment profiles (the positional relationships c) to create an optimal via list with the computer implemented design system according to the first embodiment of the present invention.
Figure 5:
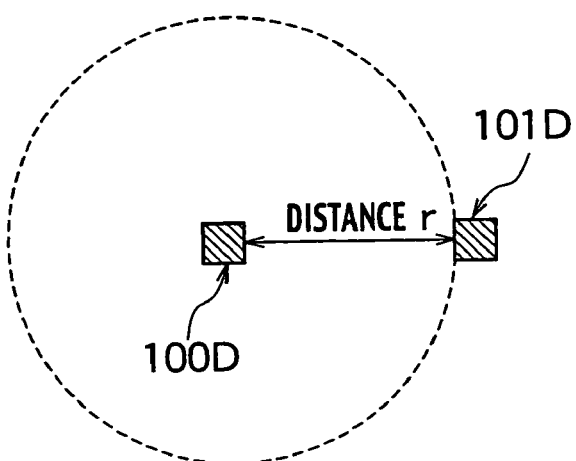
FIG. 5 shows an example diagram of the extracting method of an environment profile (the distance r) to create the optimal via list with the computer implemented design system according to the first embodiment of the present invention.

As shown in FIGS. 4 and 5, the lithography simulation subunit 12 extracts, as "environment profiles," an "arrangement relationship" between a provisional via 100D and each adjacent vias 101D located around the provisional via 100D in the arrangement pattern. Namely, "positional relationship c and distance r" between the provisional via 100D and each adjacent via 101D in the arrangement pattern. As shown in FIG. 4, the environment profile indicating the "positional relationship c" can be determined by dividing the region around the provisional via 100D into eight regions and evaluating with bit flags "1" and "0" whether each of the eight divided regions includes the adjacent via 101D.

For example, in FIG. 4, a "region 0", which is one of the eight regions obtained by dividing the region around the provisional via 100D, includes the adjacent via 101D. Accordingly, the lithography simulation subunit 12 evaluates the "region 0" as "1". Similarly, the lithography simulation subunit 12 evaluates a "region 1" as "1" since the "region 1" includes the adjacent via 101D. In this manner, the lithography simulation subunit 12 extracts the environment profiles for all other regions 2 to 7 around the provisional via 100D and digitalizes the positional relationships between the provisional via 100D and the adjacent vias 101D with a bit flag of eight digits. Accordingly, the environment profile indicating the positional relationship c is "11111111" in FIG. 4.

The lithography simulation subunit 12 extracts an environment profile indicating the "distance r" between the provisional via 100D and each adjacent via 101D. As shown in FIG. 5, the distance r can be evaluated by extracting a distance between the right side of the provisional via 100D and the left side of the adjacent via 101D shown in the drawing. This distance is the shortest distance between the provisional via 100D and the adjacent via 101D.

Figure 6:
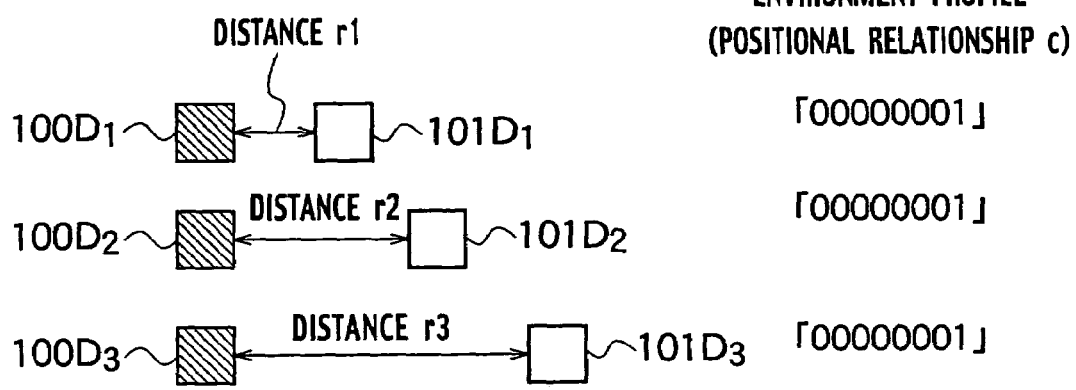
FIGS. 6 to 8 are conceptual diagrams illustrating the lithography simulation method that the lithography simulation subunit as shown in FIG. 1 executes.
Figure 7:
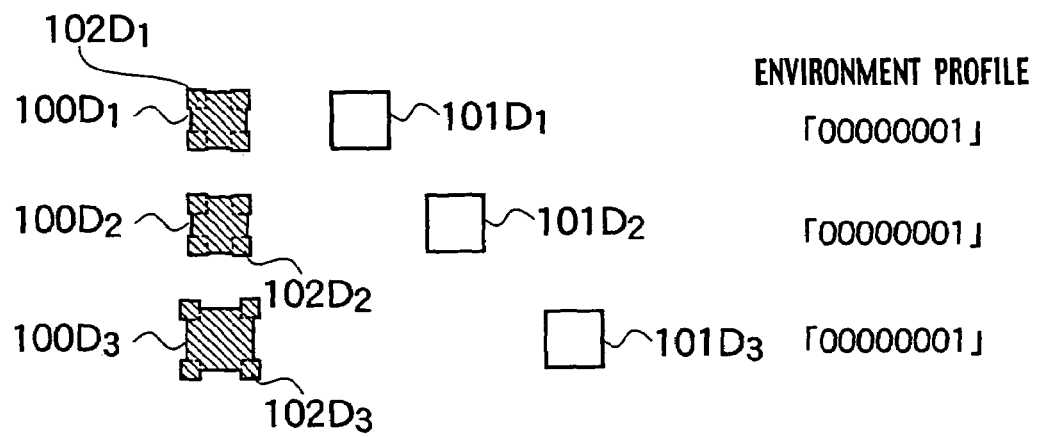

Furthermore, the lithography simulation subunit 12 performs an OPC process shown in FIG. 7 based on the environment profiles of the positional relationships c ("00000001") between provisional vias $100D_1$ to $100D_3$ and respective adjacent vias $101D_1$ to $101D_3$ and the environment profiles of distances $r_1$ to $r_3$ therebetween shown in FIG. 6. The lithography simulation subunit 12 thus determines optimal vias $103D_1$ to $103D_3$ shown in FIG. 8.

Figure 8:
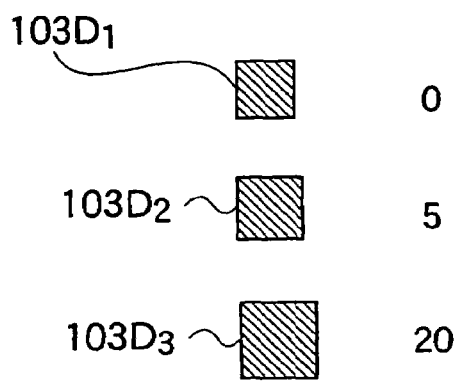

The optimal via list creating subunit 13 digitalizes the optimal vias $103D_1$ to $103D_3$ determined by the lithography simulation subunit 12 into "0, 5, 20 . . . ," according to the distances $r_1$, $r_2$, $r_3$ . . . as shown in FIG. 8, respectively. The optimal via list creating subunit 13 lists data of the digitized sizes of the optimal vias $103D_1$ to $103D_2$ in terms of the relationship between the positional relationship c and the distance r as shown in FIG. 9 to create an optimal via list.

Figure 10A:
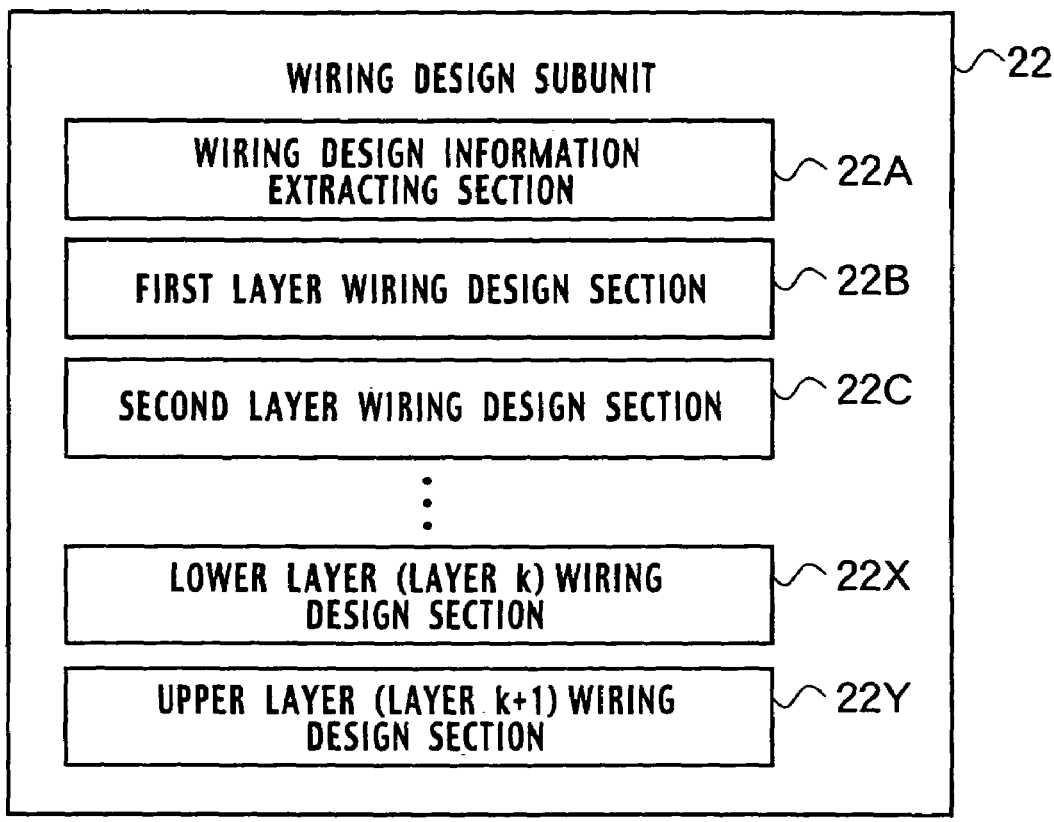
FIG. 10A is a block diagram illustrating a wiring design subunit as shown in FIG. 1.

The layout design unit 20 includes a cell design subunit 21, a wiring design subunit 22, and a via design subunit 23. The cell design subunit 21 virtually arranges logic cells such as I/O cells, basic cells, macro cells and function blocks in a chip area of the semiconductor IC set in a memory space of the computer implemented design system. As shown in FIG. 10A, the wiring design subunit 22 includes a wiring design information extracting section 22A, a first layer wiring design section 22B, a second layer wiring design section 22C . . . , a lower layer (layer k) wiring design section 22X, and an upper layer (layer k+1) wiring design section 22Y and arranges a plurality of wiring layers above the cells.

Figure 12:
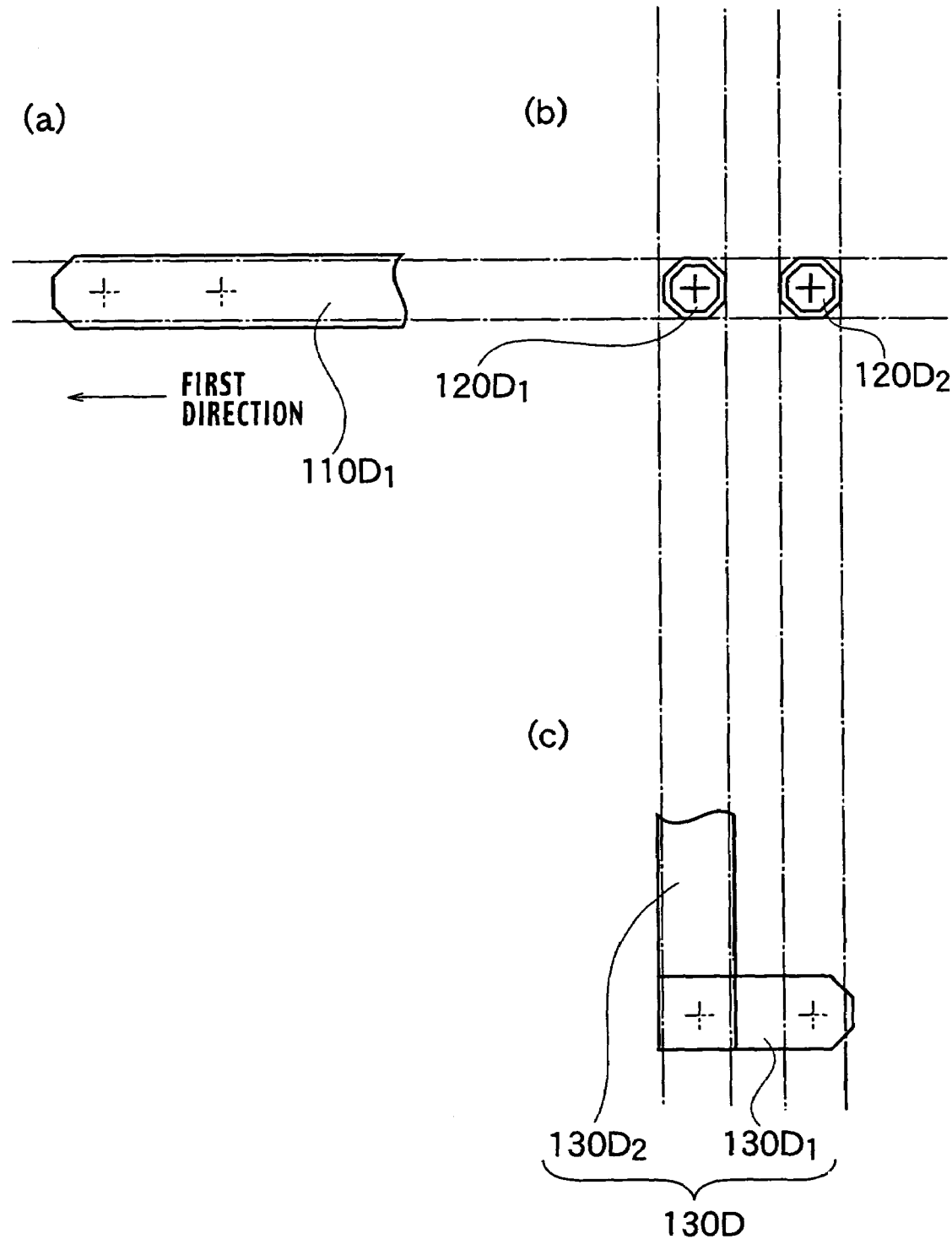
FIGS. 12 and 13 are plane views illustrating an example of a layout designed by the layout design unit according to the first embodiment of the present invention.

The wiring design information extracting section 22A of FIG. 10A extracts necessary information such as line geometry of the wiring and line design information of the wiring from the main storage 2. The lower layer (layer k) wiring design section 22X, as shown in FIG. 12(a), for example, arranges a first termination $110D_1$ of first wiring 110D which extends in a first direction (horizontal direction as observed from the front of the drawing in FIG. 12(a)) on the chip area virtually set within the memory space of the computer implemented design system. The upper layer (layer k+1) wiring design section 22Y, as shown in FIG. 12(c), for example, arranges second wiring 130D over the first wiring 110D in the chip area. The second wiring 130D includes a second termination $130D_1$ extended in the first direction so as to overlap the first termination $110D_1$ and a second line $130D_2$ which is connected to an end of the second termination $130D_1$ and extended in a direction (a direction perpendicular to the first direction in FIG. 12(c)) different from the first direction.

Figure 10B:
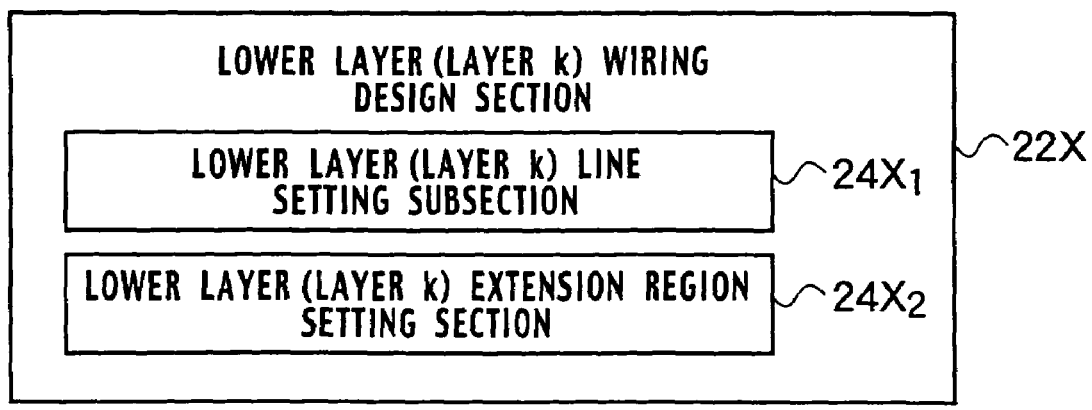
FIG. 10B is a block diagram illustrating a lower layer (layer k) wiring design section as shown in FIG. 10A.
Figure 13:
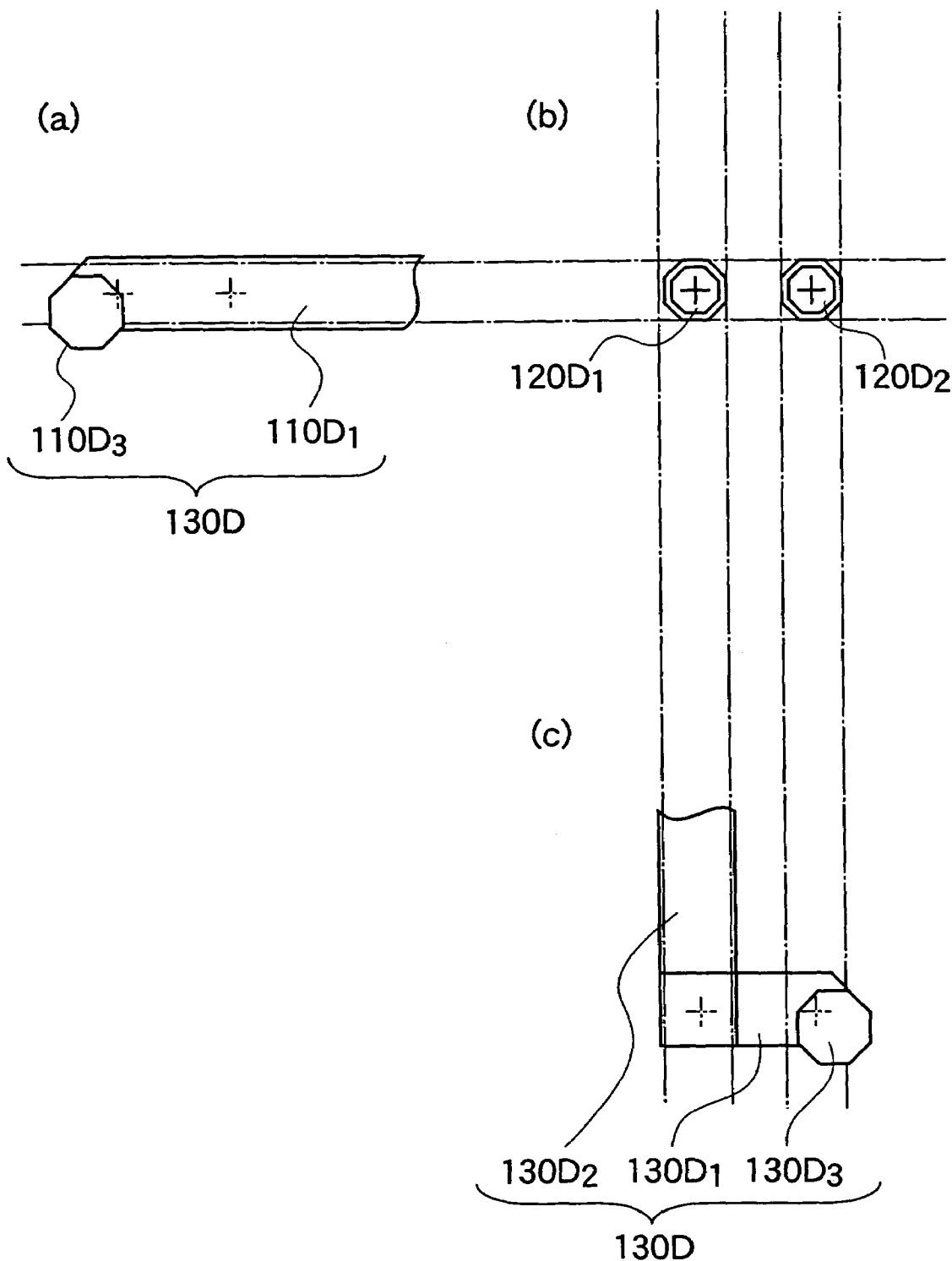

As shown in FIG. 10B, the lower layer (layer k) wiring design section 22X may further include a lower layer (layer k) line setting subsection $22X_1$ and a lower layer (layer k) extension region setting subsection $22X_2$. In this case, the lower layer (layer k) line setting subsection $22X_1$ arranges the first wiring 110D including the first termination $110D_1$ in the chip area as shown in FIG. 13. Furthermore, the lower layer (layer k) extension region setting subsection $22X_2$ extracts the end of the first termination $110D_1$ and arranges a first extension $110D_3$ at the end of the first termination $110D_1$.

Figure 11A:
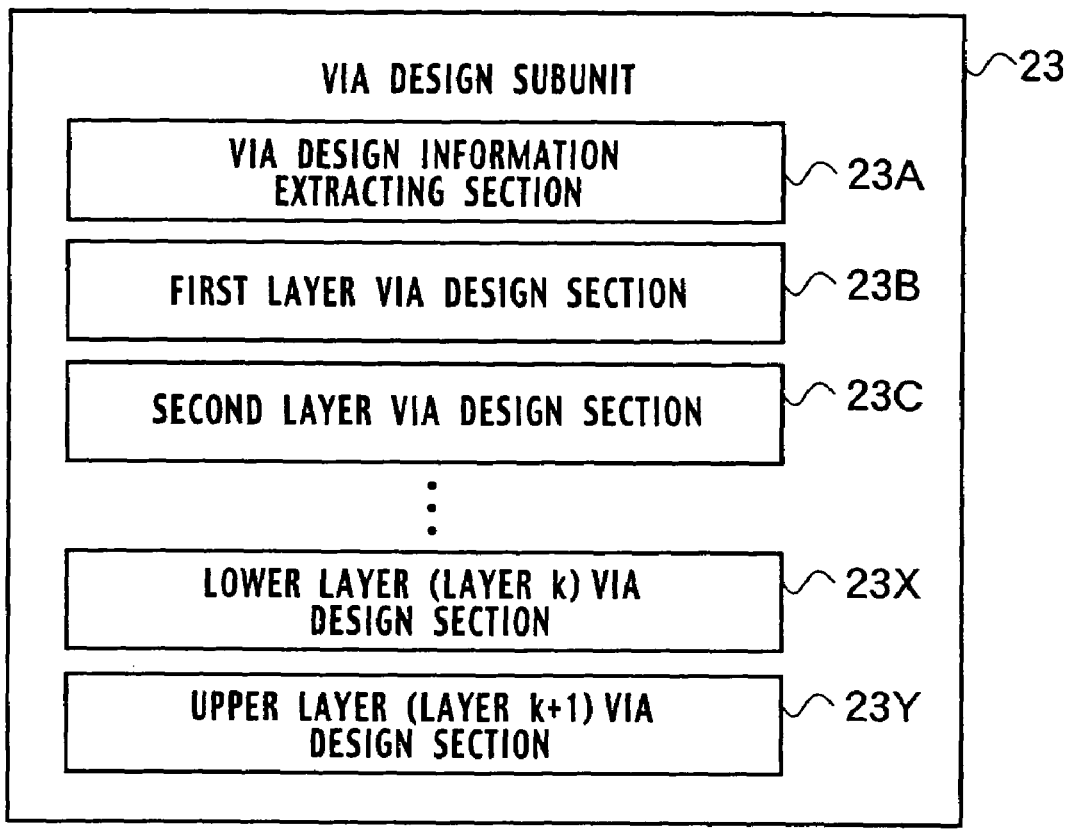
FIG. 11A is a block diagram illustrating a via design subunit as shown in FIG. 1.

As shown in FIG. 11A, the via design subunit 23 includes a via design information extracting section 23A, a first layer via design section 23B, a second layer via design section 23C . . . , a lower layer (layer k) via design section 23X, and an upper layer (layer k+1) via design section 23Y. The via design information extracting section 23A reads geometry information, design information, and the like necessary for design the provisional vias from the main storage 2. The upper layer (layer k+1) via design section 23Y reads the information extracted by the via design information extracting section 23A and arranges vias connecting lower layer (layer k) wiring and upper layer (layer k+1) wiring.

Figure 11B:
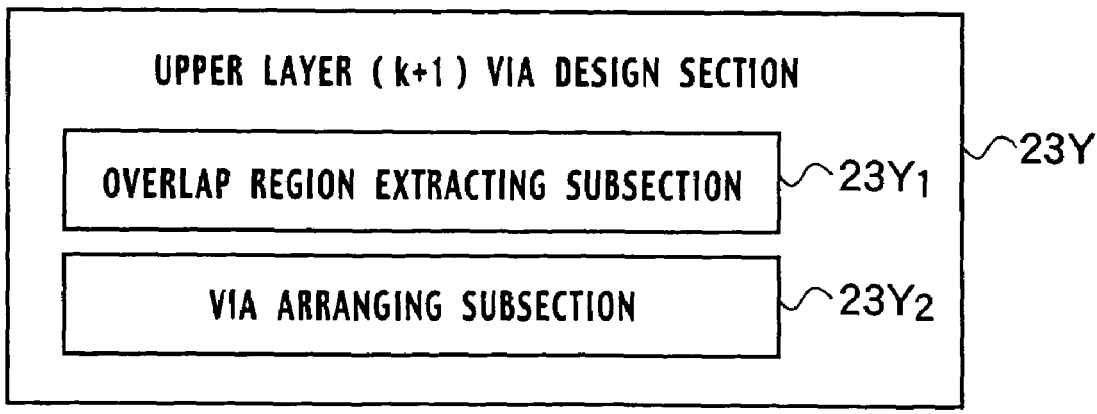
FIG. 11B is a block diagram illustrating an upper layer (layer k+1) via design section as shown in FIG. 11A.

As shown in FIG. 11B, the upper layer (layer k+1) via design section 23Y further includes an overlap region extracting subsection 23Y$_1$ and a via arranging subsection 23Y$_2$. The overlap region extracting subsection 23Y$_2$ extracts a region where the lower layer (layer k) wiring and the upper layer (layer k+1) wiring overlap each other in the chip area. The via arranging subsection 23Y$_2$ arranges provisional vias 120D$_1$ and 120D$_2$ in the overlap regions of the lower layer (layer k) wiring and the upper layer (layer k+1) wiring which are extracted by the overlap region extracting subsection 23Y$_1$, namely, regions where the first and second terminations 110D$_1$ and 130D$_2$ overlap each other in FIGS. 12(a) to 12(c).

As shown in FIG. 1, the optimal via replacement unit 30 includes a provisional via extracting subunit 31, an environment profile extracting subunit 32, and an optimal via replacing subunit 33. The provisional via extracting subunit 31 extracts all provisional vias located in the layout of the chip area by the layout design unit 20 which is created within the memory space of the computer implemented design system. The environment profile extracting subunit 32 extracts the environment profiles indicating the positional relationship c and the distance r between each provisional via extracted by the provisional via extracting subunit 31 and adjacent vias located around the provisional via. The optimal via replacing subunit 33 reads information of the environment profiles extracted by the environment profile extracting subunit 32, extracts an optimal via from the optimal via list shown in FIG. 9, and then replaces each provisional via with the optimal via. The design violation judging or determination unit 40 judges whether the optimal via replaced by the optimal via replacing subunit 33 creates a design violation in the design layout. In a causing design violation occurs, an optimal via that creates the design violation is deleted to avoid the design violation.

The main storage 2 includes a library information storage section 50, an optimal via list storage section 55, a layout design information storage section 60, and a design violation judgment or determination information storage section 70. The library information storage section 50 includes a cell geometry information storage subsection 51, a line geometry information storage subsection 52, and a via geometry information storage subsection 53, and stores basic geometry information of cells, wiring lines, and vias necessary for the layout design.

As basic geometry information, the library information storage section 50 may store geometric information of a cell, a wiring line, and a minimum size via or may store a plurality of geometric information of cells, wiring lines, and vias of various sizes. The optimal via list storage subsection 55 stores information created by the optimal via list creating unit 10, for example, the optimal via list information as shown in FIG. 9.

The layout design information storage section 60 includes a cell design information storage subsection 61, a line design information storage subsection 62, and a via design information storage subsection 63 and stores basic design information of cells, wiring lines, and vias necessary for the layout design. The design violation judgment or determination information storage section 70 stores design rule information or the like for judging whether the design layout includes any design violation and the like.

It is possible to use a keyboard, a mouse, and the like for the input device 3. It is possible to use a liquid crystal display (LCD), a light-emitting diode panel (LED), an electro luminescence (EL) panel, and the like for the output device 4. The program storage 5 retains a program for instructing the CPU 1 to execute control of data transmission and reception between the units connected to the CPU 1 and the like. The data storage 6 temporarily retains data in the course of operations of the CPU 1.

More apparent from the following description on a design method of the computer implemented design system, the computer implemented design system according to the first embodiment of the present invention includes the optimal via list storage section 55 in the main storage 2, and the optimal via list storage section 55 listing optimal geometries and sizes according to the arrangement environments of the provisional vias.

Therefore, in optimization of a provisional via of the layout designed by the layout design unit 20, the provisional via only needs to be replaced with the optimal via selected from among the "optimal via list" stored in the optimal via list storage section 55. Thus, the processing time required for the OPC will be short. As shown in FIG. 8, in each optimal via included in the "optimal via list", the size thereof is defined by one figure and numerically evaluated. Accordingly, the amount of data can be reduced and processing time will be reduced.

Furthermore, each optimal via included in the "optimal via list" is treated with the OPC process by considering the positional relationship between a via and adjacent vias around the via. Accordingly, it is possible to provide a semiconductor IC which effectively prevents width reduction or pattern defects due to insufficient exposure of isolated vias generated in region with sparse wiring patterns.

-Computer Implemented Design Method-

Next, a description will be given of a design method of the computer implemented design system according to the first embodiment of the present invention using flowcharts of FIGS. 14 and 15.

Figure 14:
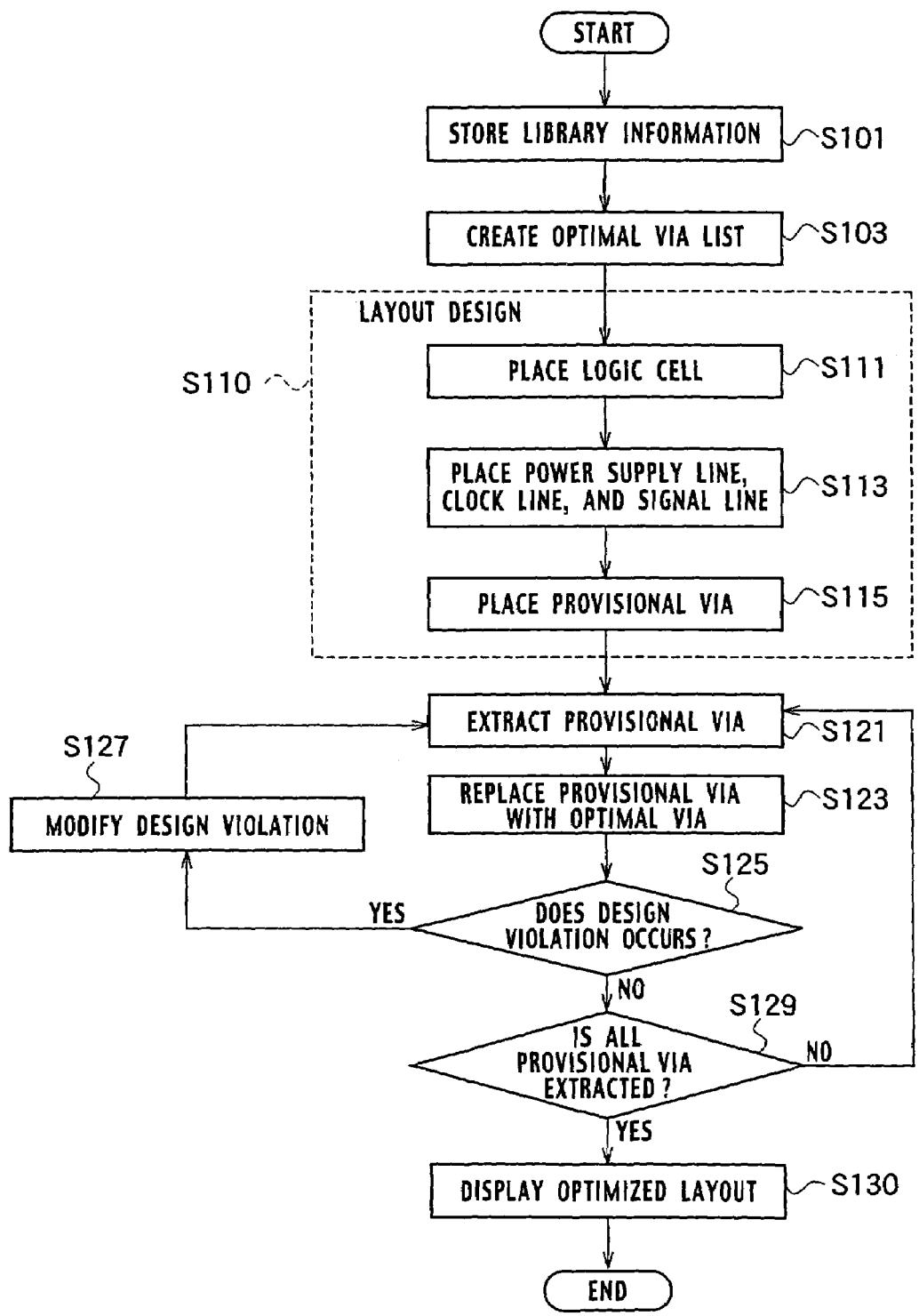
FIG. 14 is a flowchart illustrating an example of the computer implemented design method according to the first embodiment of the present invention.

(a) First, in step S101 of FIG. 14, the cell geometry information in which various types of geometry information such as logic cells and function blocks are recorded is registered in the cell geometry information storage subsection 51 through the input device 3 as the library information necessary for the layout design. The line geometry information, in which various types of geometry information such as pattern geometries and sizes is registered in the line geometry information storage subsection 52 through the input device 3. The via geometry information in which various types of geometry information of square vias, rectangle vias, polygon vias, and the like are recorded, is registered in the via geometry information storage subsection 53 through the input device 3.

(b) In step S103, the optimal via list creating unit 10 reads via geometry information and design information stored in the via geometry information storage subsection 53 and the via design information storage subsection 63 and creates the optimal via list according to the later-described flowchart shown in FIG. 15. The optimal via list defines optimal sizes and geometries according to the respective arrangement environments of all provisional vias which can be designed by the layout design unit 20.

(c) The layout design is performed in step S110. Specifically, in step S111, the cell design subunit 21 extracts necessary cell geometry information from the cell geometry information storage subsection 51 and reads the design information stored in the cell design information storage subsection 61. The cell design subunit 21 then designs logical cells such as I/O cells, basic cells, and macro cells and basic blocks in the semiconductor chip area virtually set in the memory space of the computer implemented design system. The I/O cells and macro cells may be arranged first because the I/O cells are blocks somewhat fixed and the macro cells are comparatively large blocks. Subsequently, in step S113, the wiring design subunit 22 extracts necessary line geometry information from the line geometry information storage subsection 52 and reads the design information stored in the line design information storage subsection 62. The wiring design subunit 22 then arranges power supply lines and clock lines to be arranged on the chip area. Additionally signal lines and the like to be arranged in interlayer dielectrics of layers above the semiconductor chip area.

Figure 22:
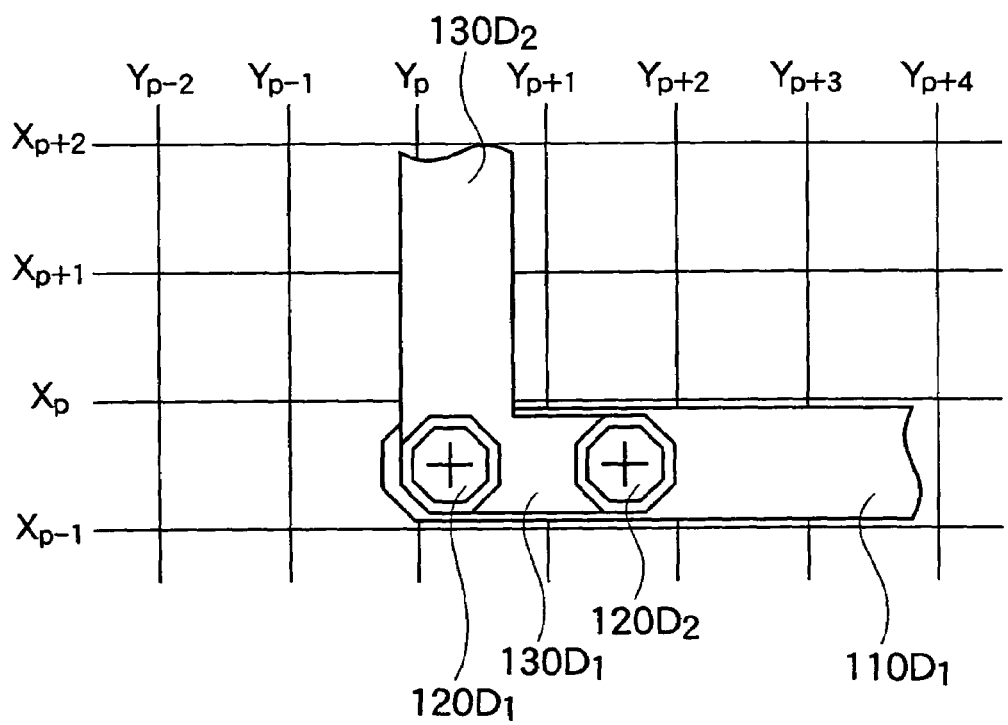
FIGS. 22 and 23 are plane views illustrating CAD data designed by the computer implemented design system according to the first embodiment of the present invention.

(d) Specifically, as shown in FIG. 22, the lower layer (layer k) wiring setting subsection $22X_1$ of FIG. 10B arranges the first termination $110D_1$ shown in FIG. 12(a) in parallel to grid lines $X_{p-1}$, $X_p$, $X_{p+1}$, . . . based on a grid composed of the grid lines $X_{p-1}$, $X_p$, $X_{p+1}$. . . and grid lines $Y_{p-2}$, $Y_{p-1}$, $Y_p$, . . . . The grid lines $X_{p-1}$, $X_p$, $X_{p+1}$, . . . are arranged in parallel on the layout virtually formed in the memory space. The grid lines $Y_{p-2}$, $Y_{p-1}$, $Y_p$, . . . are arranged perpendicular to the grid lines $X_{p-1}$, $X_p$, $X_{p+1}$. In the case where the first extension $110D_3$ as shown in FIG. 13 is arranged, the lower layer (layer k) extension region setting subsection $24X_2$ of FIG. 10B arranges the first extension $110D_3$, which is an octagon, at the end of the first termination $110D_1$.

(e) As shown in FIG. 22, the upper layer (layer k+1) wiring design section 22Y of FIG. 10A arranges a second termination $130D_1$ in parallel to the grid lines $X_{p-1}$, $X_p$, $X_{p+1}$, . . . so as to overlap the first termination $110D_1$ of the first wiring 110D. Moreover, the upper layer (layer k+1) wiring design section 22Y arranges a second line $130D_2$ extending from a left end portion of the second termination $130D_1$ perpendicular to the grid lines $X_{p-1}$, $X_p$, $X_{p+1}$, . . . .

(f) Subsequently, in step S115, the via design subunit 23 extracts necessary geometry information from the via geometry information storage subsection 53 and reads the design information stored in the via design information storage subsection 63 and information of the wiring arranged in step S113. Then, the via design subunit 23 designs provisional vias $120D_1$ and $120D_2$ connecting the first wiring 110D which is the lower layer (layer k) wiring and the second wiring 130D which is the upper layer (layer k+1) wiring. The overlap region extracting subsection $23Y_1$ of FIG. 11B extracts overlap regions of the first wiring 110D and the second wiring 130D, namely, regions where the first and second terminations $110D_1$ and $130D_1$ are arranged so as to overlap each other on the layout as shown in FIG. 22.

(g) The via arranging subsection $23Y_2$ arranges the provisional vias $120D_1$ and $120D_2$ at the overlap regions based on the information extracted by the overlap region extracting subsection $23Y_1$. The positions where the provisional vias $120D_1$ and $120D_2$ are arranged are not particularly limited as long as the first wiring 110D and the second wiring 120D overlap each other at the positions. Accordingly, as shown in FIG. 22, the provisional via $120D_1$ may be arranged at the portion (intersecting portion) connecting the second termination $130D_1$ and the second line $130D_2$. However, the connecting portion of the second termination $130D_1$ and the second line $130D_2$ is sometimes reduced in pattern width due to insufficient exposure in the lithography process. Therefore, it is preferable to arrange the provisional vias $120D_1$ and $120D_2$ away from the connecting portions of wiring lines in the same wiring layer, namely, the connecting portion of the second termination $130D_1$ and the second line $130D_2$. Furthermore, the geometry of the vias arranged by the via arranging subsection $23Y_2$ is preferably an octagon which is optimal for both orthogonal and diagonal wiring designs.

(h) Upon execution of the step S110, arrangement of cells, lines, and provisional vias for manufacturing the semiconductor IC is completed in the layout designed in the memory space. Subsequently, in step S121, the provisional via extracting subsection 31 of the optimal via replacement unit 30 extracts a provisional via in the design layout from within the memory space. The environment profile extracting subunit 32 extracts the positional relationship c and the distance r between the provisional via extracted by the provisional via extracting subunit 31 and each of the adjacent vias. Subsequently, in step S123, the optimal via replacing subunit 33 reads the relationship between the positional relationship c and the distance r extracted by the environment profile extracting subunit 32, extracts an optimal via from the optimal via list shown in FIG. 9, and then replaces the provisional via with the optimal via.

(i) In step S125, the design violation judging or determination unit 40 reads the design rule information stored in the design violation judgment or determination information storage section 70 and determines whether the optimal via replaced by the optimal via replacing subunit 33 creates a design violation in the design layout. When no design violation is created, the procedure goes to step S129. When a design violation is created, the procedure goes to step S127. In the step S127, the design violation judging or determination unit 40 deletes the optimal via creating the design violation so as to modify the design violation created in the design layout, and then the procedure goes to the step S121.

(j) In the step S129, the provisional via extracting subunit 31 judges whether all provisional vias located on the design layout are extracted. When all provisional vias are not extracted, a provisional via is extracted in the step S121. When all provisional vias are extracted, the layout with the geometry of the optimized provisional vias is displayed by the output device 4.

Next, a detailed description will be given of a method of creating the optimal via list according to the first embodiment in step S103 of FIG. 14 by using the flowchart of FIG. 15.

Figure 2:
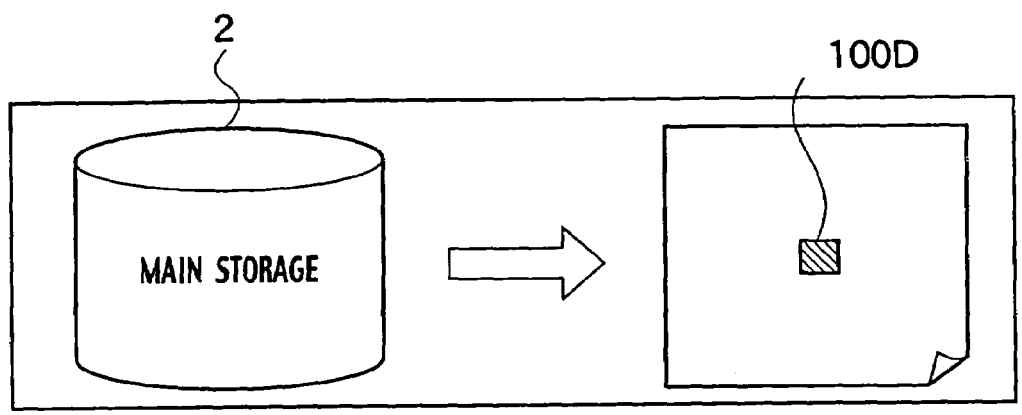
FIGS. 2 and 3 are conceptual diagrams illustrating an example of optimal via list creating methods of the computer implemented design system according to the first embodiment of the present invention.

(a) In step S103a, the via arrangement pattern design subunit 11 reads the geometry information and the design information stored in the via geometry information storage subsection 53 and the via design information storage subsection 63. Then, the via arrangement pattern design subunit 11 performs the automatic arrangement process of provisional vias to create all arrangement pattern examples which can be generated in the layout. For example, as shown in FIG. 2, it is assumed that the via arrangement pattern design subunit 11 reads the geometry information of the square provisional via 100D from the via geometry information storage subsection 53 of the main storage 2. In step S103b, the via arrangement pattern design subunit 11 executes the automatic arrangement process using the square provisional via 100D as shown in FIG. 3.

Figure 3:
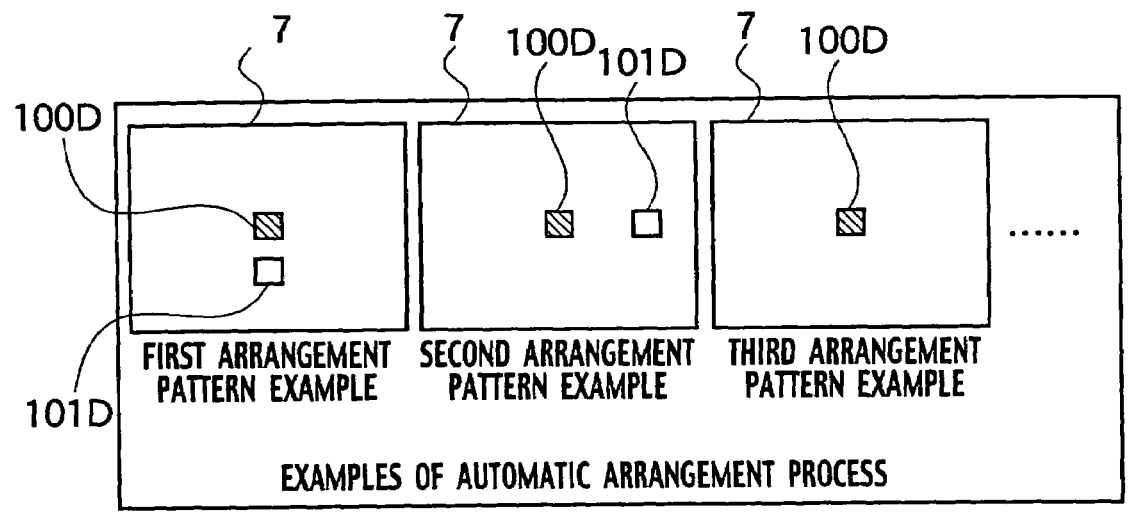

(b) In the first arrangement pattern example of FIG. 3, the already arranged adjacent via 101D is in the lower part of a screen 7. Therefore, the via arrangement pattern design subunit 11 arranges the provisional via 100D in a free space at the upper side of the adjacent via 101D in the screen 7. In the second arrangement pattern example, the via arrangement pattern design subunit 11 arranges the provisional via 100D at the left side of the adjacent via 101D in the screen 7 since the adjacent via 101D is arranged in the right part of the screen 7. In the third arrangement pattern example, the via arrangement pattern design subunit 11 arranges the provisional via 100D in the center of the screen 7 since no via adjacent via 101D is in the screen 7. In this manner, the via arrangement pattern design subunit 11 performs the arrangement process as shown in FIGS. 2 and 3 for all the pieces of geometry information stored in the main storage 2.

(c) In step S103c, the lithography simulation subunit 12 reads the arrangement pattern example designed by the via arrangement pattern design subunit 11 and executes lithography simulation. First, the lithography simulation subunit 12 extracts the "positional relationship c" between the provisional via 100D and the adjacent vias 101D located around the provisional via 100D as the "environment profile" of the provisional via 100D of the arrangement pattern example as shown in FIG. 4. The positional relationship c can evaluate by numeric values "1" and "0" as to whether the adjacent via 101D is included in each of the eight regions obtained by dividing the region around the provisional via 100D. The environment profile of the positional relationship c of FIG. 4 is "11111111".

(d) The lithography simulation subunit 12 extracts the distance r between the provisional via 100D and the adjacent via 101D as the environment profile of the distance r as shown in FIG. 5. Subsequently, as shown in FIG. 6, the lithography simulation subunit 12 reads the environment profiles (positional relationships c "00000001", the distances $r_1$ to $r_3$) between the provisional vias $100D_1$ to $100D_3$ and the adjacent vias $101D_1$ to $101D_3$ and performs the OPC process. As shown in FIG. 7, the very small quadrangle extension regions $102D_1$ to $102D_3$ are thus arranged at the respective corners of the quadrangle provisional vias $100D_1$ to $100D_3$.

(e) As shown in FIG. 8, the lithography simulation subunit 12 determines, as the optimal via $103D_1$ to $103D_3$, quadrangles of a size including the extension regions $102D_1$ to $102D_3$ arranged at the corners of the respective provisional vias $100D_1$ to $100D_3$, namely, quadrangles slightly larger than the respective provisional vias $100D_1$ to $100D_3$. Next, in step S103d, the optimal via list creating subunit 13 numerically evaluates the sizes of the optimal vias $103D_1$ to $103D_3$ determined by the lithography simulation subunit 12 into "0, 5, 20, . . . " according to the distances $r_1, r_2, r_3, \ldots$, as shown in FIG. 8. Furthermore, the optimal via list creating subunit 13 lists the data of the numerically evaluated optimal via $103D_1$ to $103D_3$ in terms of the relationships between the positional relationship c and distance r to create the optimal via list as shown in FIG. 9.

(f) In FIG. 9, when the positional relationship c is "00000001" and the distance r is 1 to 5, the value of the optimal via list is "0". Therefore, the optimal via $103D_1$, which is the smallest in FIG. 8, is defined as the "optimal via". When the positional relationship c is "00000001" and the distance r is 5 to 10, the value of the optimal via list is "5". Therefore, the optimal via $103D_2$, which is larger than the optimal via $103D_1$ shown in FIG. 8, is defined as the "optimal via". When the positional relationship c is "00000001" and the distance r is 10 to ", the value of the optimal via list is "20". Accordingly, the optimal via $103D_3$, which is the largest in FIG. 8, is defined as the "optimal via". The optimal via list created by the optimal via list crating subunit 13 is registered in the optimal via list storage subsection 55 in step S103e.

The computer implemented design method according to the first embodiment of the present invention is provided with the optimal via list storage subsection 55 storing a list of "optimal vias" having geometries and sizes that are optimal according to the arrangement environments of the individual provisional vias in addition to the library information storage subsection 50 and the layout design information storage subsection 60 necessary for carrying out automatic design. Therefore, when the OPC process is performed for a provisional via designed on the layout, it is only required to replace the provisional via with the optimal via having a geometry and size previously defined in the optimal via list storage subsection 55. Thus, the need for OPC processes for the individual vias is eliminated and the processing time is reduced.

Moreover, the optimal via list creating subunit 13 creating the list of optimal vias modifies the geometry of the optimal via including a plurality of figures which is obtained by the OPC process as shown in FIG. 7 into a figure as shown in FIG. 8 for optimization. Accordingly, the amount of data is reduced, and the processing becomes fast.

Furthermore, the optimal via list creating subunit 13 determines the size of each of the optimal vias $103D_1$ to $103D_3$ by lithography simulation for vias taking into account the arrangement environment, such as the positional relationship and distance between the provisional via and other vias located around the provisional via. Therefore, pattern width reduction due to insufficient exposure in vias (isolated vias) which is generated on the layout is less likely, and it is possible to prevent reduction in yield of the semiconductor IC.

Figure 16:
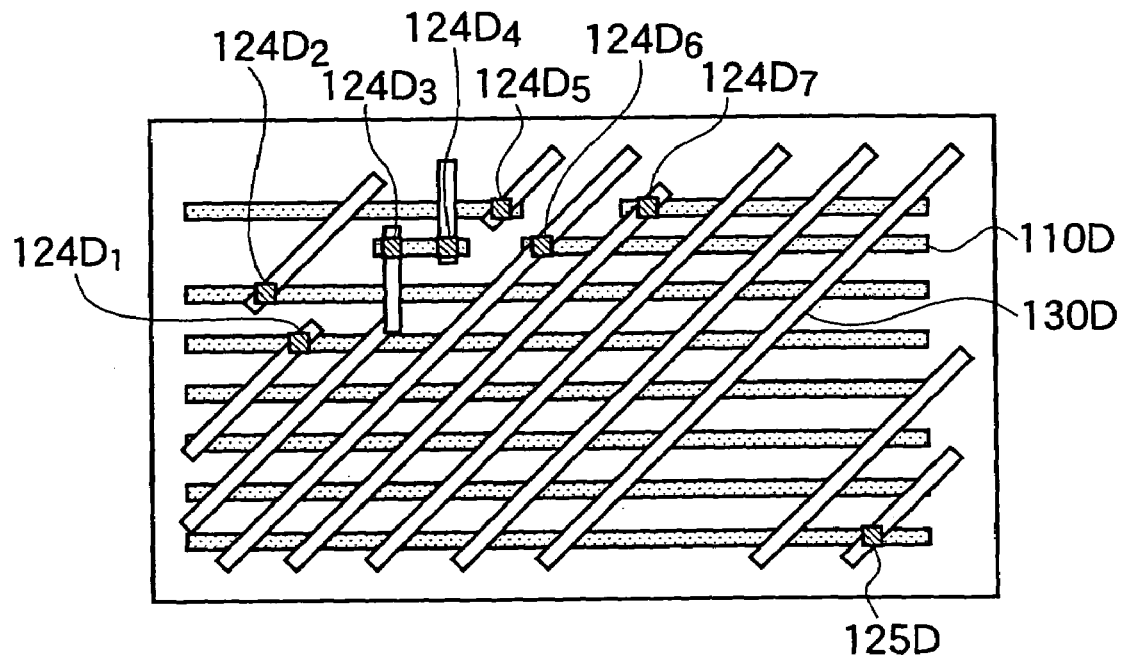
FIG. 16 is plane view illustrating an example of a layout designed by the computer implemented design system without replacing a provisional via with an optimal via.

FIG. 16 shows an example of the layout when optimal vias are not replaced. In the layer above the first wiring 110D as the lower layer wiring which includes wiring lines arranged in parallel to the surface of the drawing of FIG. 16, the second wiring 130D of the second layer includes wiring lines arranged to be diagonal or perpendicular to the first wiring lines. Vias $124D_1$, $124D_2$ . . . , and $124D_7$ and an isolated via 125D isolated from the vias $124D_1$, $124D_2$ . . . , and $124D_7$ are arranged so as to connect the first and second wiring lines 110D and 130D.

Figure 17:
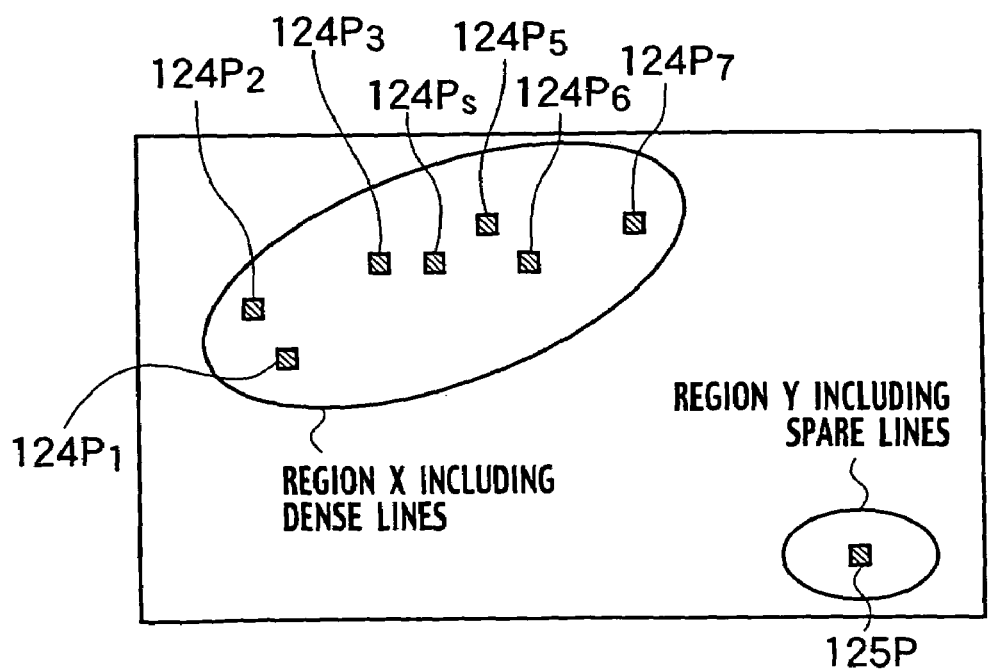
FIG. 17 is a plane view illustrating a part of a reticle set manufactured by using the layout as shown in FIG. 16.

FIG. 17 shows a part of a mask (reticle) used for forming via plugs in the semiconductor IC based on the layout shown in FIG. 16. Via patterns $124P_1$, $124P_2$ . . . , and $124P_7$ are densely located in a region X including densely located lines. An isolated via pattern 125P is arranged in a region Y including lines which are sparsely located. Upon exposure of an interlayer dielectric formed on the semiconductor IC based on the reticle shown in FIG. 17, a plan view shown in FIG. 18 will be obtained.

As is apparent from FIG. 18, in an isolated via 125 arranged apart from the vias $124_1$, $124_2$ . . . , and $124_7$ which are arranged close to each other, a pattern width reduction is due to insufficient exposure, and the size thereof is smaller than that of the vias $124_1$, $124_2$ . . . , and $124_7$.

Figure 20:
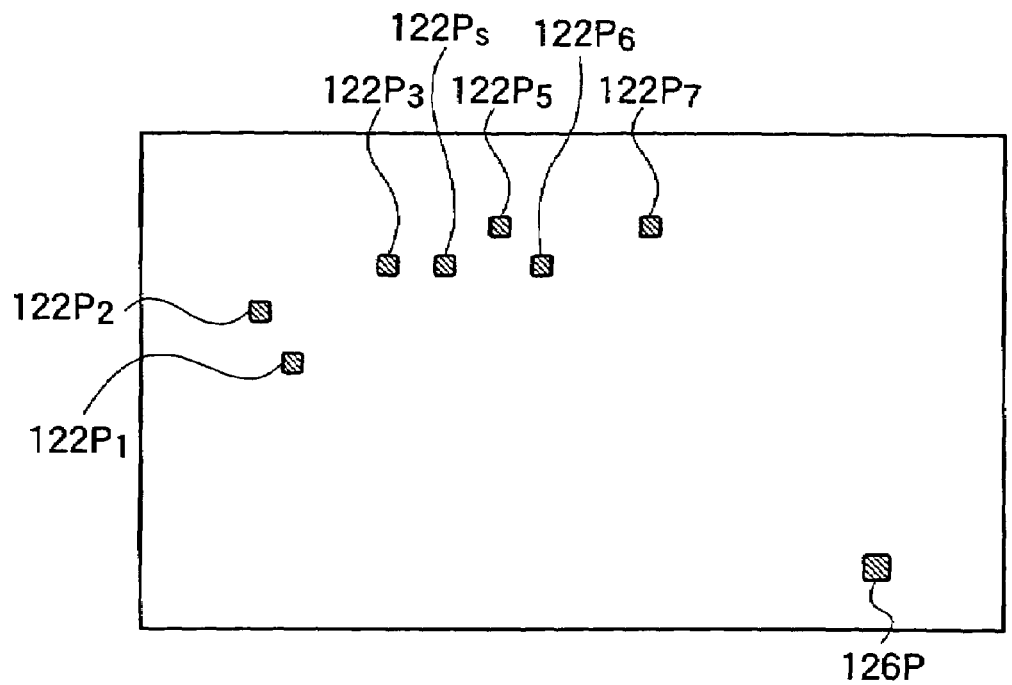
FIG. 20 is a plane view illustrating a part of the reticle set manufactured by using the layout as shown in FIG. 19.

On the other hand, FIG. 19 is a layout showing the arrangement relationship of vias created by the computer implemented design system according to the first embodiment of the present invention. According to the layout of FIG. 19, an isolated via 126D arranged in the region with sparsely located lines is replaced with an optimal via larger than the vias $122D_1$, $122D_2$ . . . , and $122D_7$ by the optimal via replacement unit 30 shown in FIG. 1. Therefore, in a reticle formed in FIG. 20 based on the layout shown in FIG. 19, an isolated via pattern 126P formed larger than the via patterns $122P_1$, $122P_2$ . . . , and $122P_7$ is arranged.

Figure 21:
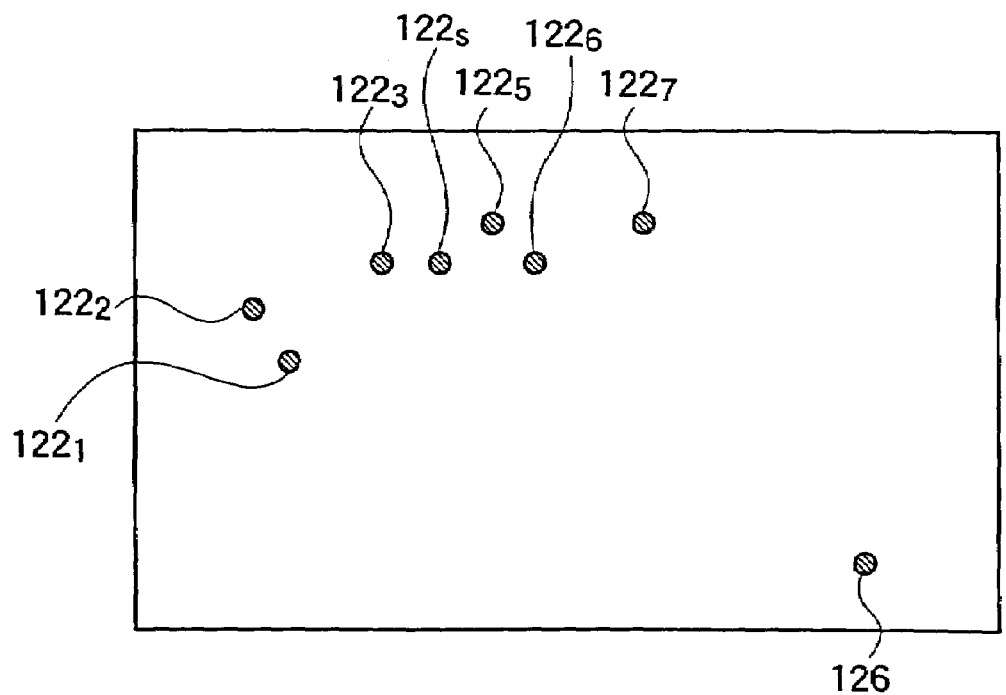
FIG. 21 is a plane view illustrating a part of the integrated circuit manufactured by using the reticle as shown in FIG. 20.

Manufacturing the semiconductor IC based on the reticle shown in FIG. 30, as is apparent from a plan view of FIG. 21, an isolated via 126 is formed to be comparable in size to the vias $122_1$, $122_2$ . . . , and $122_7$. Therefore, with the computer implemented design method according to the first embodiment of the present invention, it is possible to provide a highly reliable semiconductor IC which is less likely to cause pattern width reduction due to insufficient exposure in vias (isolated vias) generated on the layout and to improve in yield.

-Reticle Set-

Figure 23:
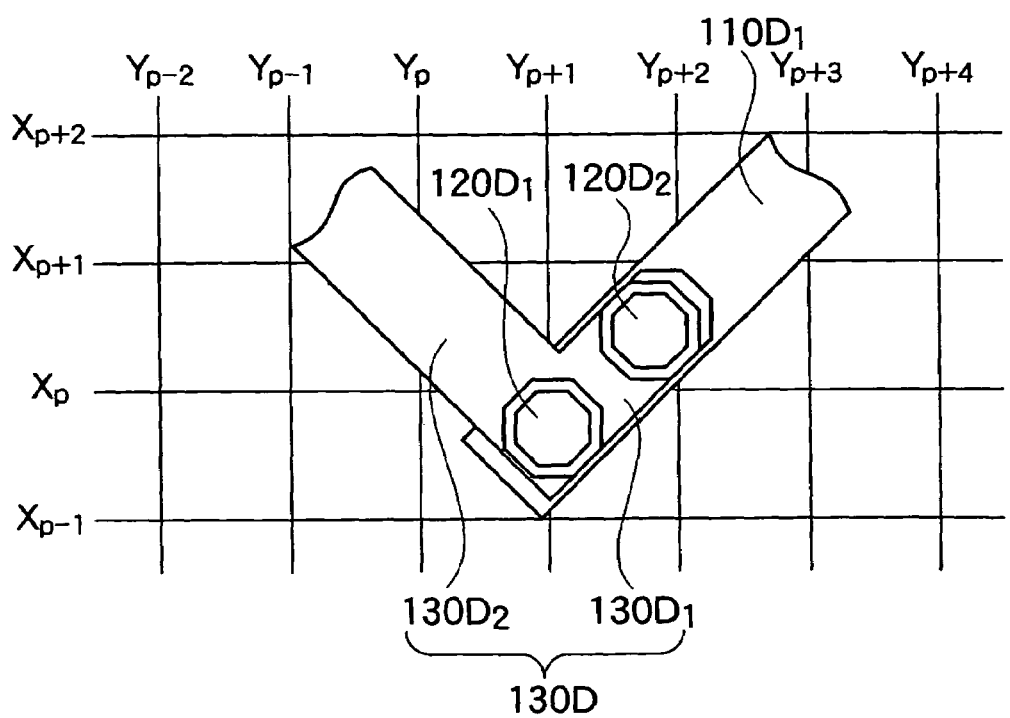

FIGS. 22 and 23 show examples of CAD data of the semiconductor IC according to the first embodiment. FIGS. 22 and 23 each show just a part of CAD data of the chip area of the semiconductor IC which can be designed by the computer implemented design system shown in FIG. 1. FIGS. 22 and 23 show an example of CAD data just after the layout design is completed in the step S110 of FIG. 14.

In FIGS. 22 and 23, a grid composed of the grid lines $X_{p-1}$, $X_p$, $X_{p+1}$, . . . and the grid lines $Y_{p-2}$, $Y_{p-1}$, $Y_p$, . . . is arranged. The grid lines $X_{p-1}$, $X_p$, $X_{p+1}$, . . . provide the basis for the automated wiring process carried out by the first layer wiring design section 22B, the second layer wiring design section 22C . . . , and the upper layer (layer k+1) wiring design section 22Y shown in FIG. 10A. The grid lines $Y_{p-2}$, $Y_{p-1}$, $Y_p$, . . . are arranged perpendicular to the grid lines $X_{p-1}$, $X_p$, $X_{p+1}$, . . . .

As shown in FIG. 22, the first termination $110D_1$ is arranged to extend in parallel to the grid lines $X_{p-1}$, $X_p$, $X_{p+1}$, . . . . The second termination $130D_1$ is arranged to overlap the first termination $110D_1$. The second line $130D_2$ extending in parallel to the grid lines $Y_{p-2}$, $Y_{p-1}$, $Y_p$, . . . is arranged at the left end of the second termination $130D_1$. The octagon provisional via $120D_1$ is arranged at the connecting portion of the second termination $130D_1$ and the second line $130D_2$, which is a bent portion of the second wiring 130D.

FIG. 23 shows an example in which the CAD data shown in FIG. 22 is arranged at an angle of 45 degrees with respect to the grid lines $X_{p-1}$, $X_p$, $X_{p+1}$, . . . and the grid lines $Y_{p-2}$, $Y_{p-1}$, $Y_p$, . . . arranged perpendicular to the grid lines $X_{p-1}$, $X_p$, $X_{p+1}$, . . . and the description thereof is omitted.

In the CAD data shown in FIGS. 22 and 23, octagon vias are employed as the provisional vias $120D_1$ and $120D_2$ each connecting the first termination $110D_1$ as a part of the lower layer wiring and the second termination $130D_1$ as a part of the upper layer wiring. Therefore, when a via is arranged on wiring lines of 0, 45, 90, and 135 degrees, the octagon vias create fewer design violations compared to arranging a square via.

Moreover, the two provisional vias $120D_1$ and $120D_2$ are arranged in the overlap region of the first termination $110D_1$ as the lower layer wiring and the second termination $130D_1$ as the upper layer wiring. Accordingly, the reliability of the semiconductor IC is improved compared to the case where a single via is arranged.

Furthermore, the optimal via replacement unit 30 shown in FIG. 1 replaces the provisional vias $120D_1$ and $120D_2$ included in the CAD data of FIGS. 22 and 23 with optimal vias according to the arrangement environments of the provisional vias $120D_1$ and $120D_2$. Therefore, even when an isolated via is generated in the region having sparsely located lines, the isolated via is unlikely to create pattern width reduction after exposure. Accordingly, it is possible to provide a highly reliable semiconductor IC which improves yield.

Figure 24:
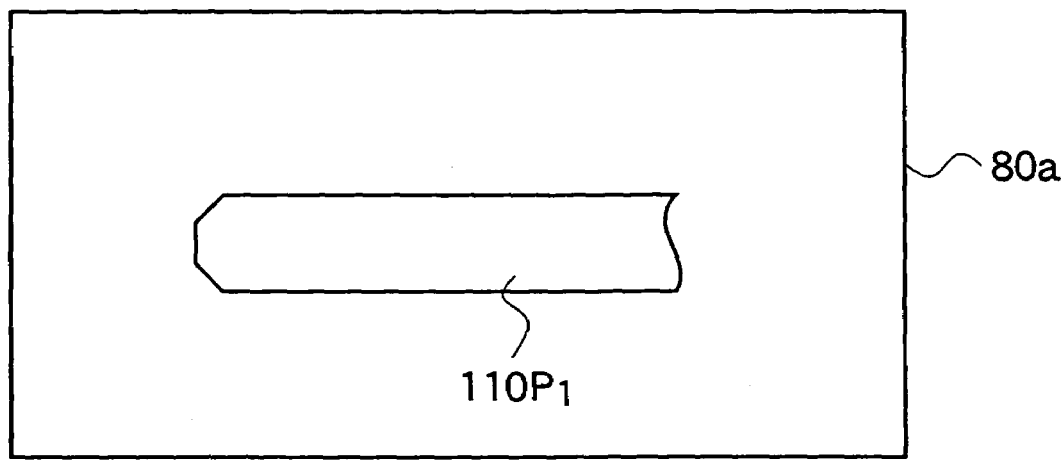
FIG. 24 is a plane view illustrating a first reticle (i-st layer reticle) of the reticle set designed by the computer implemented design system according to the first embodiment of the present invention.
Figure 25:
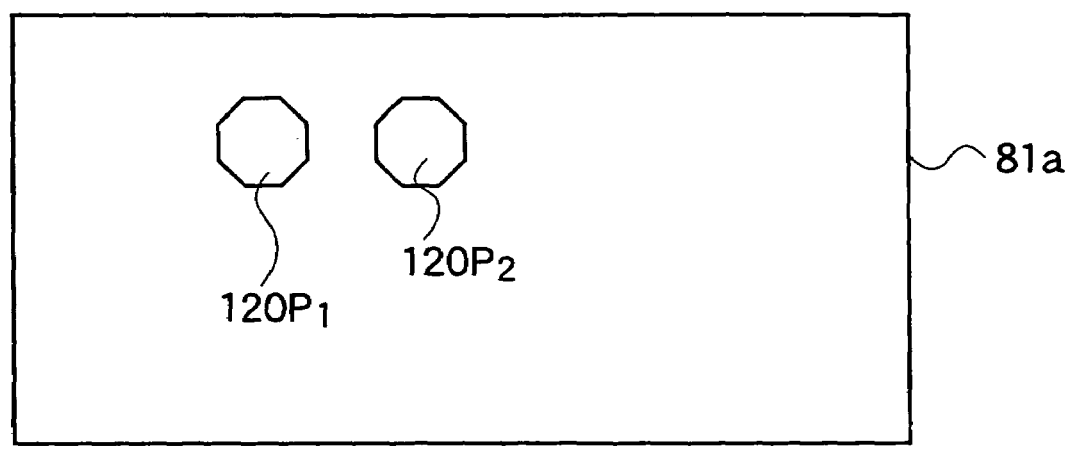
FIG. 25 is a plane view illustrating a second reticle ((i+1)-st layer reticle) of the reticle set designed by the computer implemented design system according to the first embodiment of the present invention.
Figure 26:
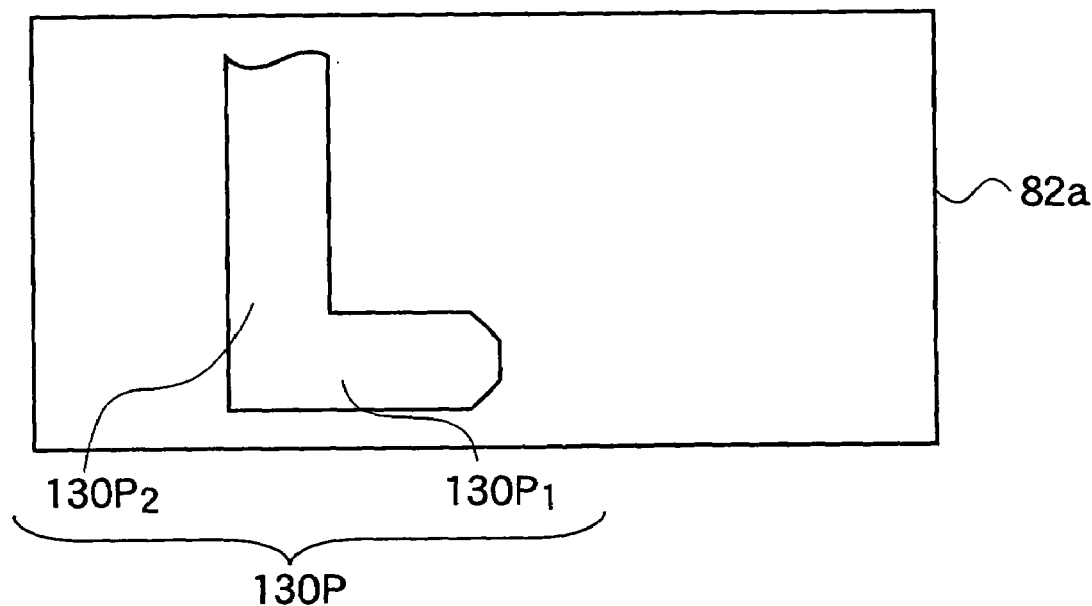
FIG. 26 is a plane view illustrating a first reticle ((i+2)-st layer reticle) of the reticle set designed by the computer implemented design system according to the first embodiment of the present invention.

FIGS. 24 to 26 show an example of a reticle set according to the first embodiment. The reticle set shown in FIGS. 24 to 26 is manufactured by a pattern generator or the like based on the CAD data obtained by the computer implemented design system shown in FIG. 1. FIGS. 24 to 26 show a first reticle (i-th layer reticle) 80a, a second reticle ((i+1)-th layer reticle) 81a which is projected to be aligned with a projected image of the first reticle 80a, a third reticle ((i+2)-th layer reticle) 82a projected so as to be aligned with a pattern formed by the projected images of the first and second reticles 80a and 81a, respectively.

FIGS. 24 to 26 show three reticles out of the reticle set including more than nine reticles. FIGS. 24 and 26 are patterns for positive resist, and FIG. 25 is a pattern for negative resist. The miniaturized semiconductor IC generally uses positive resist. If a positive resist is used in FIG. 25, black and white regions are reversed in the pattern of FIG. 25.

In the first reticle 80a, a first termination pattern (i-th termination region pattern) $110P_1$ for drawing the first wiring 110 in the semiconductor IC is arranged on a mask substrate of quartz glass or the like. The first wiring 110 is formed as a pattern of an opaque film of chrome (Cr), chromium oxide ($Cr_2O_3$), or the like.

A pattern composed of such an opaque film can be formed by drawing a pattern in a photoresist formed on the opaque film with a pattern generator such as an electron beam lithography apparatus and etching the opaque film by RIE using the photoresist pattern as a mask. In the second reticle 81a, octagon via patterns $120P_1$ and $120P_2$ are arranged on a mask substrate of quarts glass or the like as an opaque film. In the third reticle 82a, a second termination pattern (j-th termination region pattern) $130P_1$ and a second line pattern (j-th termination region pattern) $130P_2$ for drawing the second wiring 130 on a mask substrate of quartz glass or the like as an opaque film are provided.

According to the reticle set shown in FIGS. 24 to 26, octagon vias are employed as the via patterns $120P_1$ and $120P_2$ connecting the first termination pattern $110P_1$ as a part of the lower layer wiring and the second termination pattern $110P_2$ as a part of the upper layer wiring. Therefore, the via patterns $120P_1$ and $120P_2$ do not protrude from wiring layers including lines at 0, 45, 90, and 135 degrees, thus increasing the manufacturing yield.

Moreover, arranging the two via patterns $120P_1$ and $120P_2$ in the overlap portion of the first termination pattern $110P_1$ and the second termination pattern $130P_1$ as the upper layer wiring, increases the reliability of the semiconductor IC compared to providing a single via. Furthermore, the via patterns $120P_1$ and $120P_2$ are replaced with vias that are optimal according to the arrangement environments of surrounding via patterns, by the optimal via replacement unit 30 shown in FIG. 1. Therefore, even when an isolated via is generated in the region, width reduction or pattern defects are less likely to be created in the isolated via after exposure. Accordingly, it is possible to provide a highly reliable semiconductor IC while improving yield.

-Integrated Circuit-

Figure 27:
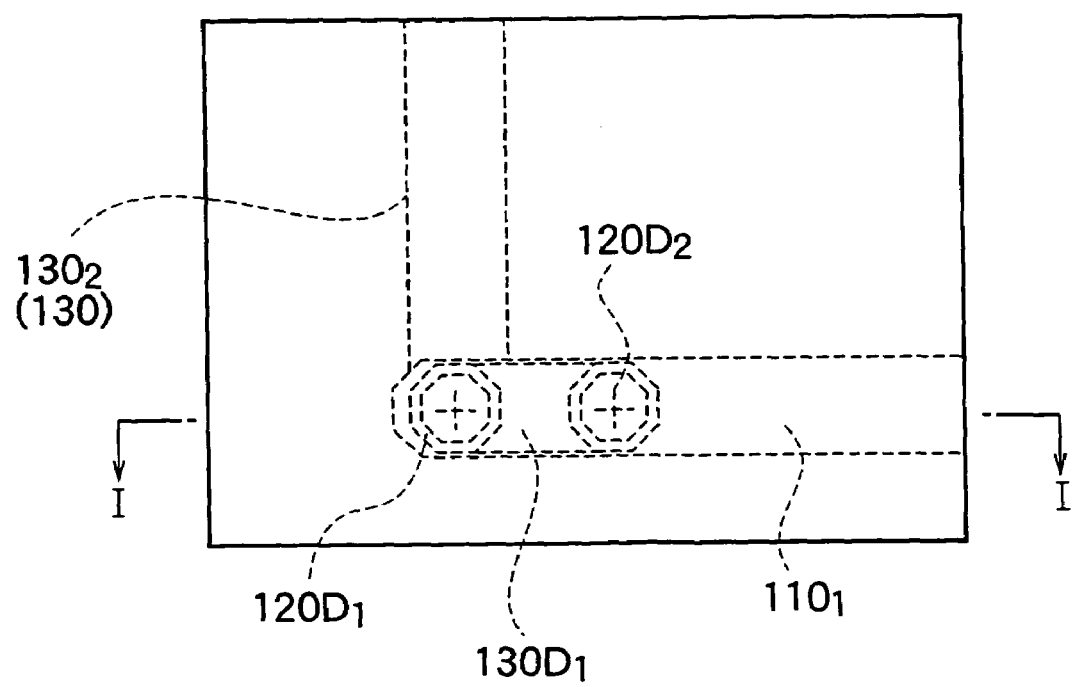
FIG. 27 is a plane view illustrating a part of the integrated circuit manufactured by the reticle set as shown in FIGS. 24 to 26.
Figure 28:
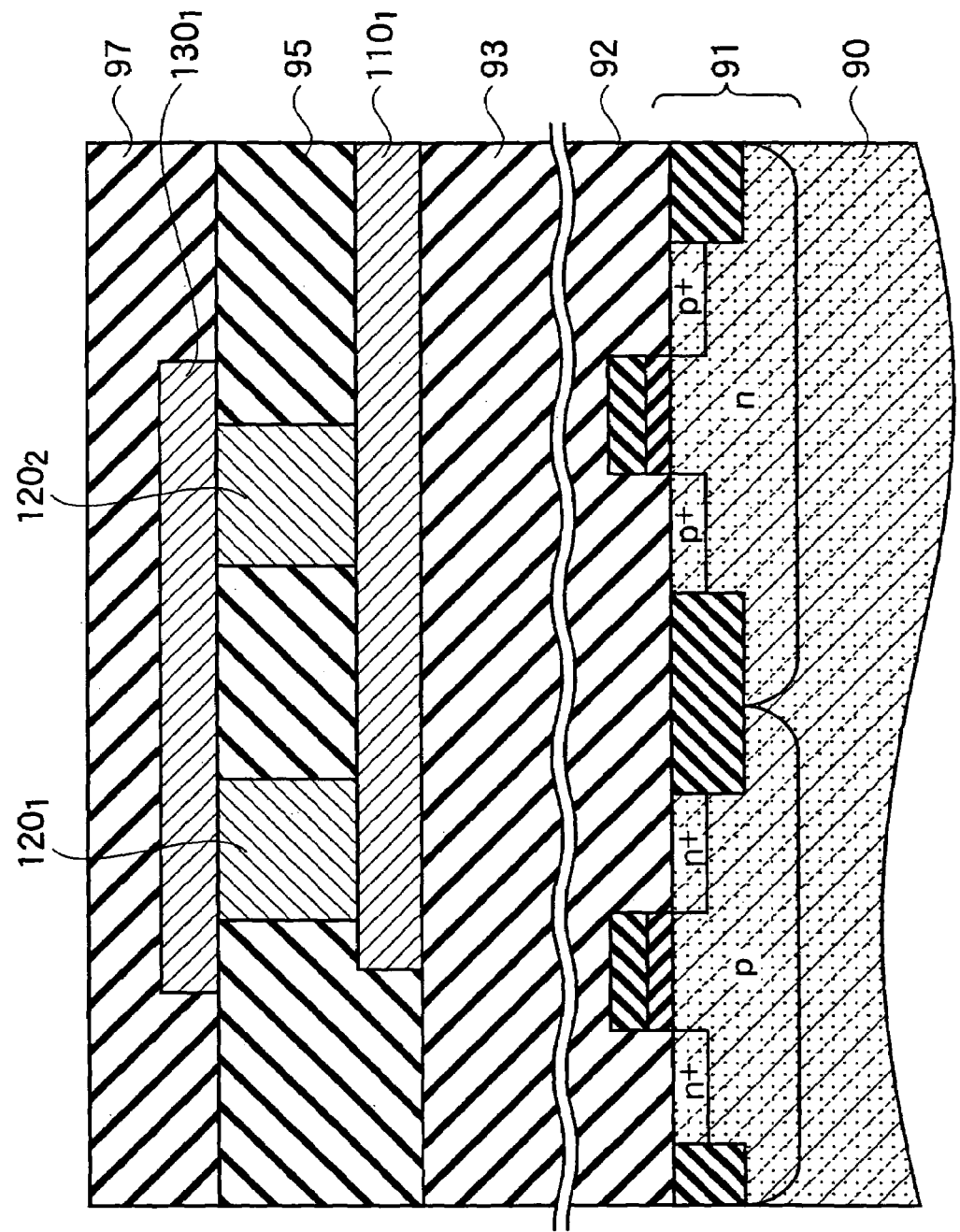
FIG. 28 is a sectional view taken on line I—I in FIG. 27, illustrating an example of the integrated circuit manufactured by the reticle set as shown in FIGS. 24 to 26.

FIGS. 27 and 28 show an example of a multilayer wiring structure of the semiconductor IC according to the first embodiment of the present invention. FIG. 28 shows an example of a cross-sectional view taken on line I—I in FIG. 27. As shown in FIG. 28, the semiconductor IC includes a semiconductor substrate 90 with a semiconductor device 91 arranged in the isolation region, a first interlayer dielectric 92 deposited on the semiconductor substrate 90, a k-th interlayer dielectric 93 deposited on a layer above the first interlayer dielectric 92, and a k-th termination region $110_1$ of k-th wiring 110 arranged on the k-th interlayer dielectric 93.

The k-th wiring 110 can be formed by patterning a metal film of aluminum (Al), an aluminum alloy (Al—Si, Al—Cu—Si), or the like by photolithography and RIE by using the first reticle 80a shown in FIG. 24. Specifically, a photoresist is applied on the metal film and exposed by a stepper using the reticle shown in FIG. 24. The metal film is etched by RIE using a pattern of photoresist obtained after development.

A (k+1)-th interlayer dielectric 95 is arranged on the k-th termination $110_1$ of the k-th wiring 110. Two via plugs $120_1$ and $120_2$ connected to the k-th termination region $110_1$ are embedded in the (k+1)-th interlayer dielectric 95. The via plugs $120_1$ and $120_2$ are formed in the following manner. Photoresist applied on the (k+1)-th interlayer dielectric 95 is delineated by photolithography using the second reticle 81a shown in FIG. 25. The (k+1)-th interlayer dielectric 95 is etched by photolithography using the delineated photoresist as a mask until part of the first wiring 110 is exposed. On the (k+1)-th interlayer dielectric 95, a (k+1)-th termination $130_1$ of the (k+1)-th wiring 130 is arranged. As shown in the plan view of FIG. 27, a (k+1)-th line part $130_2$ is arranged perpendicular to the (k+1)-th termination $130_1$ behind the (k+1)-th termination $130_1$. The (k+1)-th wiring 130 is formed by patterning photoresist applied on a metal film using the third reticle 82a of FIG. 26 and etching the (k+1)-th wiring 130 by RIE using the patterned photoresist as a mask. On the (k+1)-th interlayer dielectric 95, a (k+2)-th interlayer dielectric 97 is arranged.

As shown in FIGS. 27 and 28, the plurality of via plugs $120_1$ and $120_2$ formed by using the second reticle 81a having an octagon via pattern are arranged between the k-th wiring line 110 as the lower layer and the (k+1)-th wiring line 130 as the upper layer. Therefore, defects of vias due to shortening of wiring are less likely than when a single via is arranged between wiring lines. Moreover, the size of the via plugs $120_1$ and $120_2$ is optimized to optimal vias according to the arrangement environments of surrounding via patterns by the optima via replacing unit 30 shown in FIG. 1. Therefore, even when an isolated via is generated in the sparsely lined region, width reduction or defects of pattern is less likely to be created in the isolated via after exposure. Therefore, with the semiconductor IC according to the first embodiment, it is possible to provide a highly reliable semiconductor IC while improving in the yield.

(Second Embodiment)

-Computer Implemented Design System-

Figure 29:
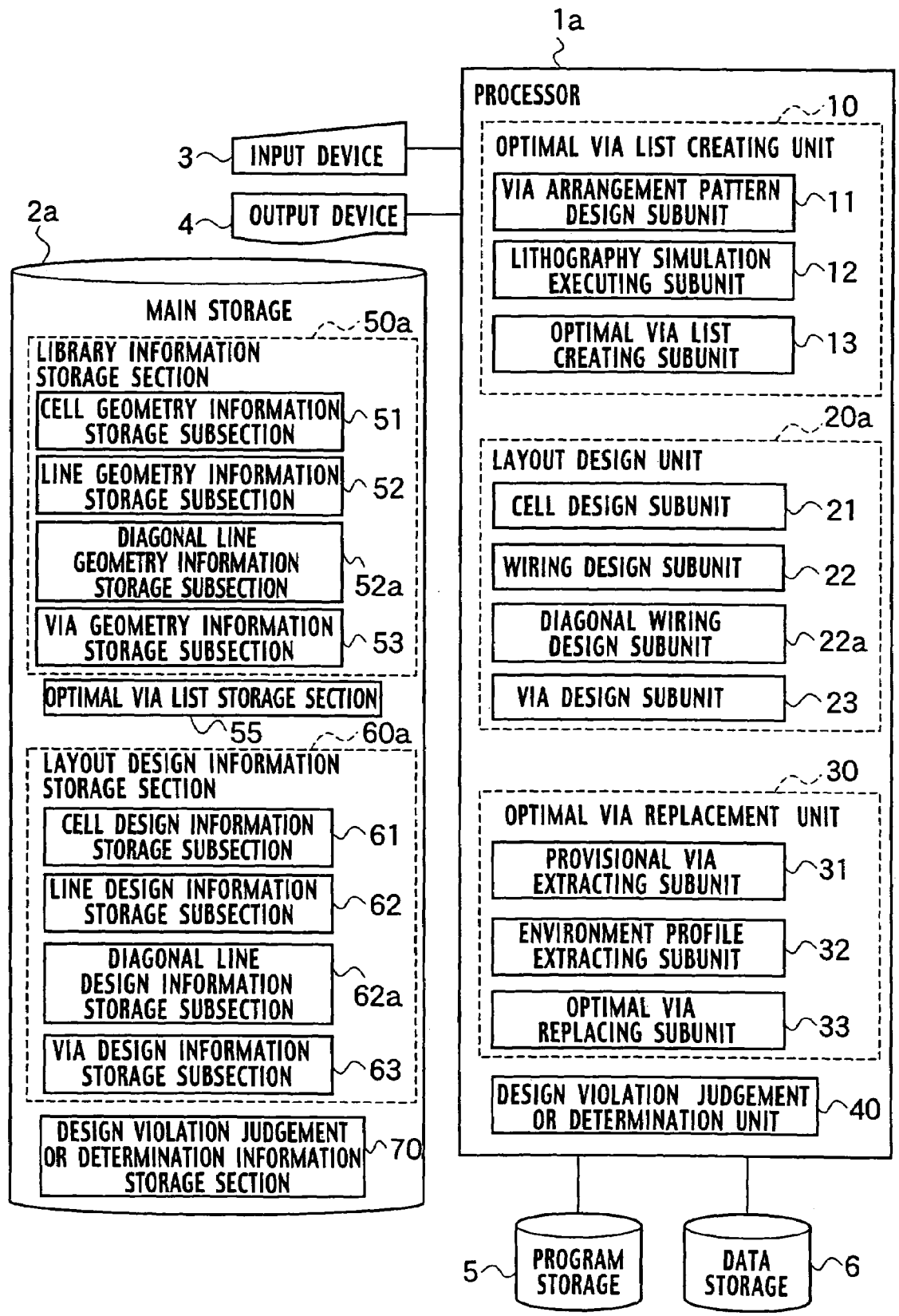
FIG. 29 is a block diagram illustrating the computer implemented design system according to a second embodiment of the present invention.

As shown in FIG. 29, a computer implemented design system according to a second embodiment of the present invention is a computer system including the input device 3, a processor (CPU) 1a, the output device 4, a main storage 2a, the program storage 5, and the data storage 6.

The input device 3 accepts input of data and instructions from an operator and the like. The CPU 1a executes various operations such as layout design. The output device 4 outputs a layout result and the like. The main storage 2a stores predetermined data and the like necessary for the layout design of semiconductor ICs. The main storage 2a, the input device 3, the output device 4, the program storage 5, and the data storage 6 are individually connected to the CPU 1a.

The CPU 1a includes the optimal via list creating unit 10, a layout design unit 20a, the optimal via replacement unit 30, and a design violation judging or determination unit 40.

Figure 30A:
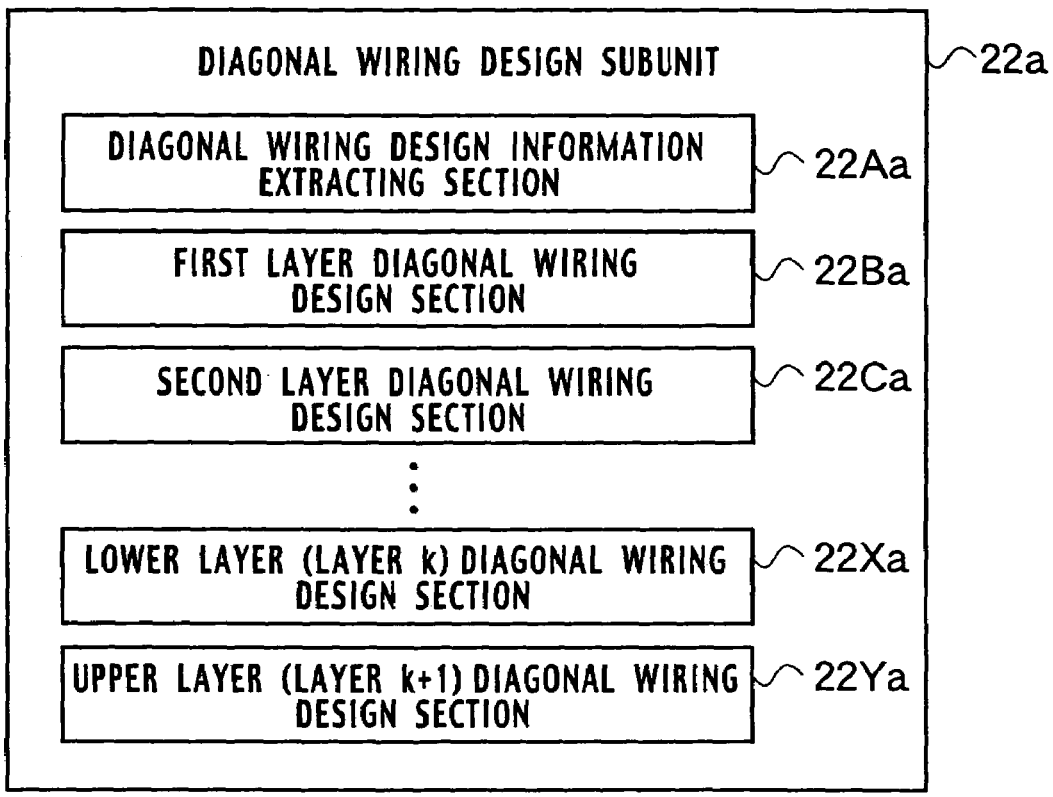
FIG. 30A is a block diagram illustrating a diagonal wiring design subunit as shown in FIG. 29.

The layout design unit 20a includes the cell design subunit 21, the wiring design subunit 22, a diagonal wiring design subunit 22a, and a via design subunit 23. As shown in FIG. 30A, the diagonal wiring design subunit 22a further includes a diagonal wiring design information extracting section 22Aa, a first layer diagonal wiring design section 22Ba, a second layer diagonal wiring design section 22Ca . . . , a lower layer (layer k) diagonal wiring design section 22Xa, and an upper layer (layer k+1) diagonal wiring design section 22Ya and arranges a wiring layer including "diagonal" wiring in layers above cells. Herein, the "diagonal" wiring indicates a wiring which is connected to another line at an obtuse angle clockwise or counterclockwise from the direction that the regarded wiring line extends. In the second embodiment, the "obtuse angle" is agreeably 135 degrees, which is suitable for the arrangement of lines at 0, 45, and 90 degrees.

Figure 30B:
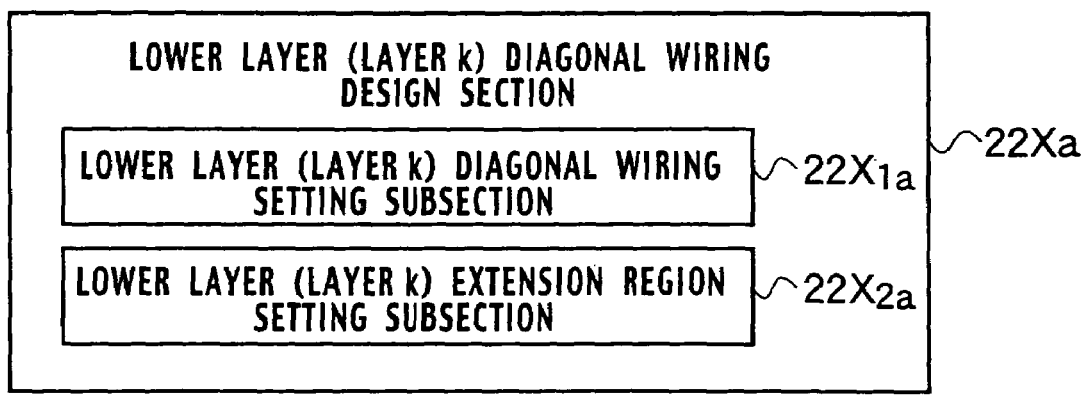
FIG. 30B is a block diagram illustrating a lower layer (layer k) diagonal wiring design section as shown in FIG. 30A.

As shown in FIG. 30B, the diagonal wiring design information extracting section 22Aa extracts necessary information such as wiring line geometries and wiring line design information from the main storage 2a. As shown in FIG. 31(a), the lower layer (layer k) diagonal wiring design section 22Xa arranges a first termination $110D_1$ and a first line part $110D_2$ in the chip area virtually set in the memory space of the computer implemented design system.

The first termination $110D_1$ is extended in the first direction (horizontal direction of FIG. 31 (a)). The first line part $110D_2$ is connected to the right end of the first termination $110D_1$ and extended in the direction (upper right direction in the paper) at 135 degrees clockwise to the first direction. As shown in FIG. 31(c), the upper layer (layer k+1) diagonal wiring design section 22Ya arranges a second termination $130D_1$ and a second line $130D_2$ in the chip area virtually set in the memory space of the computer implemented design system.

The second termination $130D_1$ is extended in the first direction. The second line $130D_2$ is connected to the left end of the second termination $130D_1$ and extended in the direction (upper left direction) at 135 degrees counterclockwise to the first direction.

As shown in FIG. 30B, the lower layer (layer k) diagonal wiring design section 22Xa may further include a lower layer (layer k) diagonal wiring setting subsection $22X_{1a}$ and a lower layer (layer k) extension region setting subsection $22X_{2a}$. In this case, the lower layer (layer k) wiring setting subsection $22X_{1a}$ arranges the first termination $110D_1$ and the first line part $110D_2$ in the chip area. Furthermore, the lower layer (layer k) extension region setting subsection $22X_{2a}$ extracts an end of the first termination $110D_1$ and arranges the first extension $110D_3$ at the end of the first termination $110D_1$.

The main storage 2a includes a library information storage section 50a, the optimal via list storage section 55, a layout design information storage section 60a, and the design violation judgment or determination information storage section 70. The library information storage section 50a includes the cell geometry information storage subsection 51, the line geometry information storage subsection 52, a diagonal line geometry information storage subsection 52a, and the via geometry information storage subsection 53 and stores basic geometry information of cells, wiring lines, and vias necessary for layout design.

The layout design information storage section 60a includes the cell design information storage subsection 61, the line design information storage subsection 62, a diagonal line design information storage subsection 62a, and the via design information storage subsection 63 and stores basic design information of cells, wiring lines, and vias necessary for layout design. The other members are the same as those of the computer implemented design system shown in FIG. 1, and the redundant description is omitted.

Figure 34:
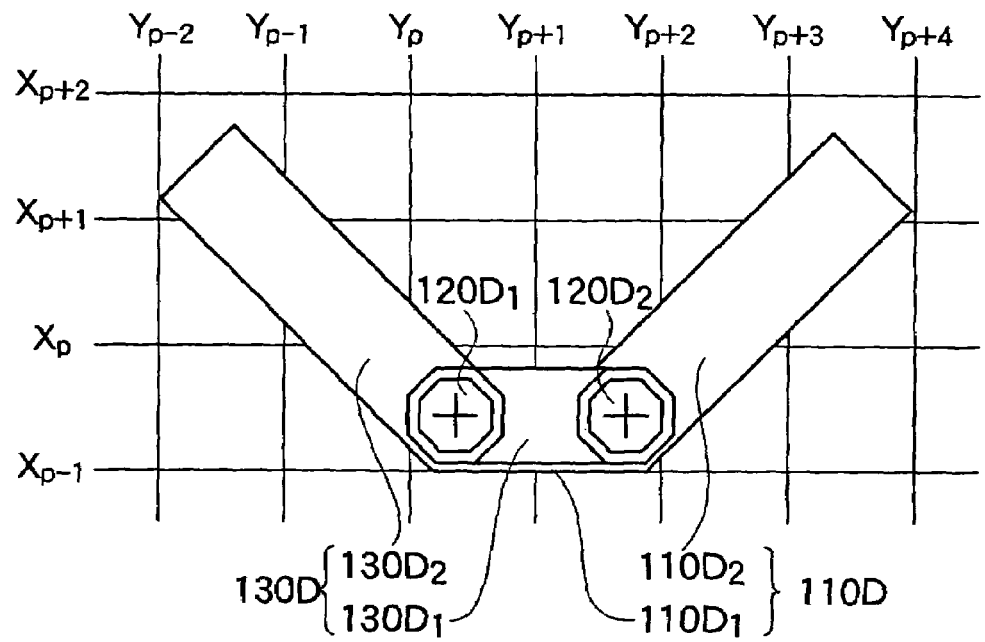
FIGS. 34 to 41 are plane views illustrating CAD data designed by the computer implemented design system according to the second embodiment of the present invention.

More apparent from the following description of a design method of the computer implemented design system, with the computer implemented design system according to the second embodiment of the present invention, as shown in FIG. 34 is octagon provisional vias 120D$_1$ and 120D$_2$ are arranged as vias connecting wiring layers which include "diagonal" wiring arranged by the diagonal wiring design subunit 22a. Therefore, design violation of vias are less likely to be created than in the case where square vias are arranged between the wiring layers including diagonal wiring. In the "diagonal" wiring, a wiring line arranged by the diagonal wiring design subunit 22a is connected to another wiring line on the same wiring layer at an obtuse angle clockwise or counterclockwise from the direction that the regarded wiring line extends.

The employment of intersections of wiring lines with an obtuse angle therebetween increases the pattern area of the intersection of wiring lines. Accordingly, the computer implemented design system shown in FIG. 29 can be designed to create fewer problems with insufficient exposure to the intersection rather than in the case of forming orthogonal wiring including portions bent at 90 degrees. Therefore, according to the computer implemented design system shown in FIG. 29, it is possible to reduce the problems of bad connection (shortening) between wiring lines and vias due to a reduction in the width of wiring patterns at intersections of wiring lines and by providing a semiconductor IC so wiring efficiency is increased.

Moreover, in modifying the provisional via for optimization on the layout designed by the layout design unit 20a, the optimal via replacement unit 30 is only required to extract a via from the "optimal via list" including vias with sizes and geometries previously optimized according to the arranged. The provisional via is then replaced with the extracted optimal via. Accordingly, there is no need to perform the OPC process for each provisional via, thus reducing the processing time.

-Computer Implemented Design Method-

Next, a description will be given of a design method of the computer implemented design system according to the second embodiment shown in FIG. 29 by using a flowchart of FIG. 33.

Figure 33:
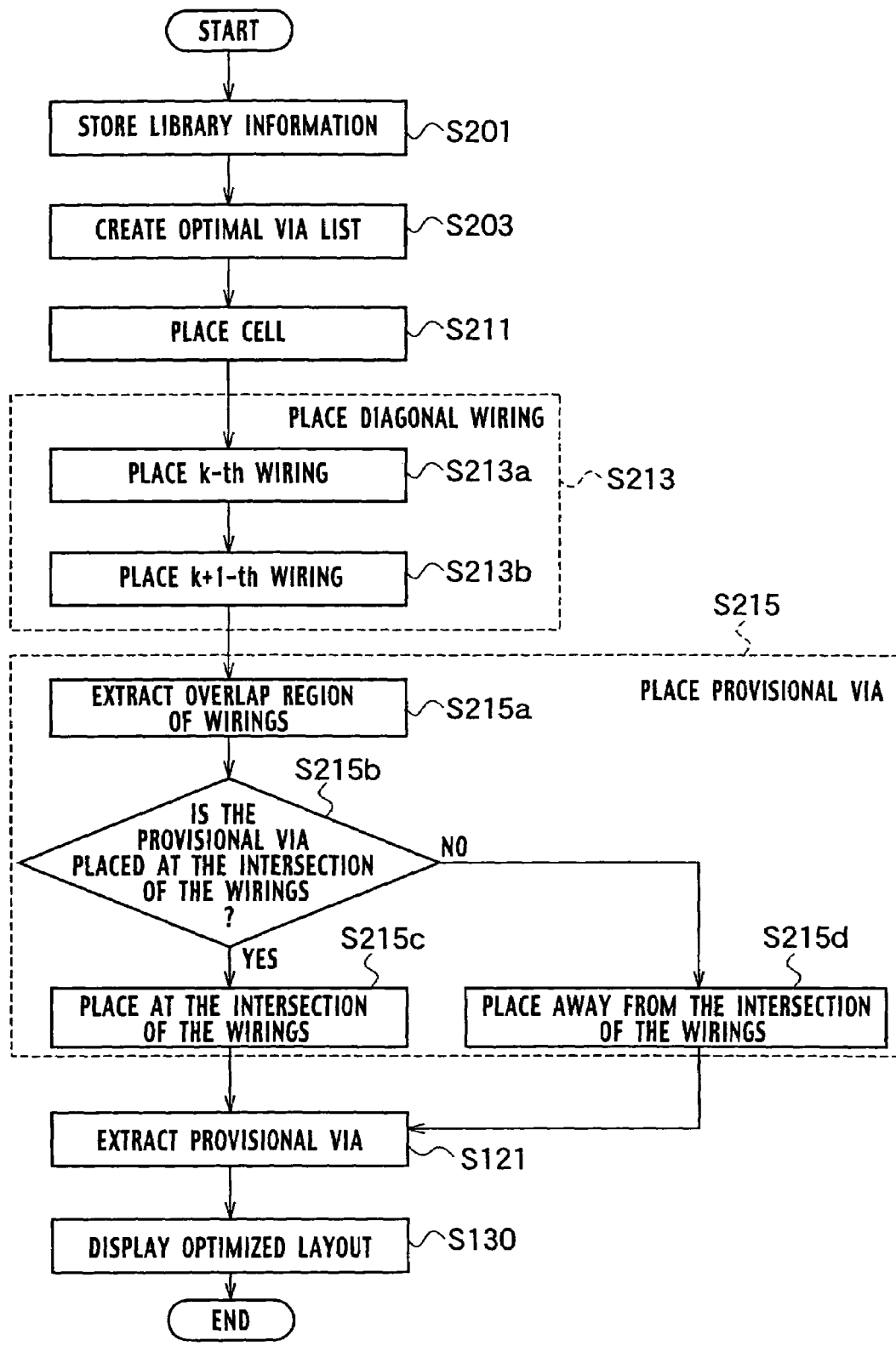
FIG. 33 is a flowchart illustrating an example of the computer implemented design method according to the second embodiment of the present invention.

(a) In step S201 of FIG. 33, the cell geometry information in which various types of geometry information of logical cells, function blocks, and the like are recorded is registered in the cell geometry information storage subsection 51 through the input device 3 as library information necessary for layout design. The line geometry information in which various types of geometry information such as the geometry and size of wiring line patterns are recorded, is registered in the line geometry information storage subsection 52 through the input device 3. The diagonal line geometry information in which various types of geometry information such as geometries and sizes of diagonal wiring line patterns are recorded, is registered in the diagonal line geometry information storage subsection 52a through the input device 3. The via geometry information in which various types of geometry information of square vias, rectangle vias, polygon vias, and the like are recorded, is registered in the via geometry information storage subsection 53 through the input device 3.

Figure 15:
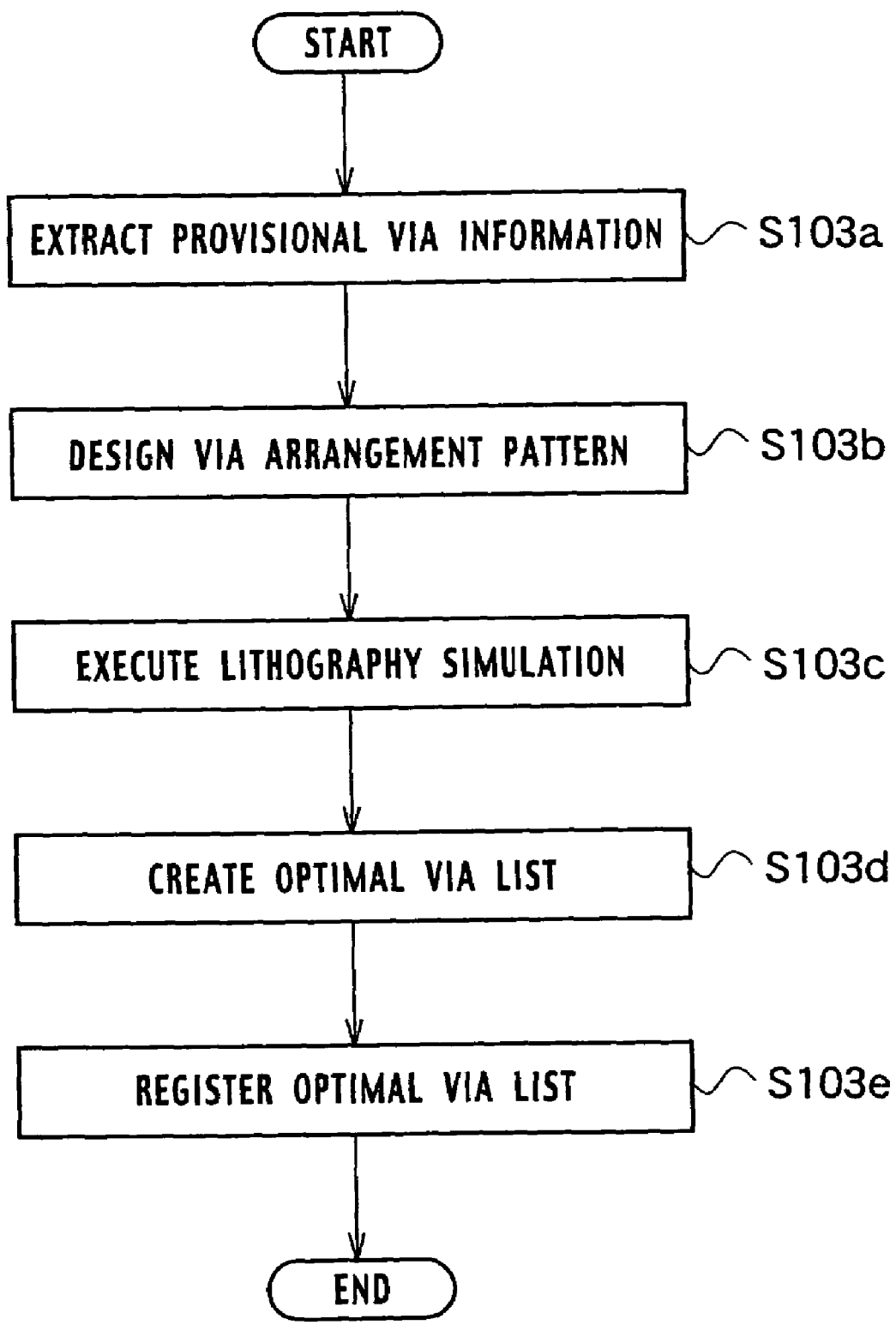
FIG. 15 is a flowchart illustrating the optimal via list creating method according to the first embodiment of the present invention.

(b) In step S203, the optimal via list creating unit 10 reads via geometry information and design information stored in the via geometry information storage subsection 53 and the via design information storage subsection 63 and creates the optimal via list according to the flowchart shown in FIG. 15. Herein, the optimal via list defines the sizes and geometries optimal according to the arrangement of the environments of all provisional vias which can be designed by the layout design unit 20a.

(c) In step S211, the cell design subunit 21 extracts necessary cell geometry information from the cell geometry information storage subsection 51 and reads the design information stored in the cell design information storage subsection 61. The cell design subunit 21 then designs logical cells such as I/O cells, basic cells, and macro cells and basic blocks in the semiconductor chip area virtually set in the memory space of the computer implemented design system. Subsequently, in step S213, the diagonal wiring design subunit 22a extracts necessary diagonal line geometry information from the diagonal line geometry information storage subsection 52a and reads the design information stored in the diagonal line design information storage subsection 62. The diagonal wiring design subunit 22a then arranges power supply lines and clock lines to be arranged in the semiconductor chip area and signal lines and the like to be arranged in an interlayer dielectrics of layers above the semiconductor chip area.

(d) In step S213a, the lower layer (layer k) diagonal wiring setting subsection 22X$_{1a}$ of FIG. 30B arranges the first termination 110D$_1$ shown in FIG. 31(a) to be parallel to the grid lines X$_{p-1}$, X$_p$, X$_{p+1}$, . . . based on a grid composed of the grid lines X$_{p-1}$, X$_p$, X$_{p+1}$, . . . and the grid lines Y$_{p-2}$, Y$_{p-1}$, Y$_p$, . . . as shown in FIG. 34. The grid lines X$_{p-1}$, X$_p$, X$_{p+1}$, . . . are arranged in parallel on the layout virtually formed in the memory space. The grid lines Y$_{p-2}$, Y$_{p-1}$, Y$_p$, . . . are arranged perpendicular to the grid lines X$_{p-1}$, X$_p$, X$_{p+1}$, . . . . Subsequently, the lower layer (layer k) diagonal wiring setting subsection 22X$_{1a}$ arranges the first line part 110D$_2$ extending from the right end of the first termination 110D$_1$ in a diagonal direction to the grid lines X$_{p-1}$, X$_p$, X$_{p+1}$, . . . , namely, in the direction of 135 degrees clockwise from the first direction. In case of arranging a first expansion region 110D$_3$ shown in FIG. 32, the lower layer (layer k) extension region setting subsection 22X$_2$ of FIG. 30B arranges the first extension 110D$_3$, which is an octagon, to the left end of the first termination 110D$_1$.

(e) As shown in step S213b, the upper layer (layer k+1) diagonal wiring design section 22Ya of FIG. 30A arranges the second termination 130D$_1$ to be parallel to the grid lines X$_{p-1}$, X$_p$, X$_{p+1}$, . . . so as to overlap the first termination 110D$_1$ of the first wiring 110D as shown in FIG. 34. Furthermore, the upper layer (layer k+1) diagonal wiring design section 22Ya arranges the second line 130D$_2$ extending from the left end of the second termination 130D$_1$ in a direction diagonal to the grid lines X$_{p-1}$, X$_p$, X$_{p+1}$, . . . , namely, the direction of 135 degrees counterclockwise from the first direction.

(f) In step S215, the via design subunit 23 extracts necessary geometry information from the via geometry information storage subsection 53 and reads the design information stored in the via design information storage subsection 63 and information of wiring lines arranged in the step S213. The via design subunit 23 then arranges the provisional vias 120D$_1$ and 120D$_2$ connecting the first wiring 110D and the second wiring 130D. The overlap region extracting subsection 23Y$_1$ of FIG. 30B extracts an overlap region of the first wiring 110D and the second wiring 130D, namely, a region where the first and second terminations 110D$_1$ and 130D$_1$ are arranged so as to overlap each other on the layout as shown in FIG. 34.

(g) Subsequently, the via arranging subsection 23Y$_2$ judges whether the provisional vias 120D$_1$ and 120D$_2$ are arranged at the intersection of the wiring lines based on the information extracted by the overlap region extracting subsection $23Y_1$ and the design information stored in the via design information storage subsection 63. In the case where the provisional vias $120D_1$ and $120D_2$ are arranged at the intersection of the wiring lines, the procedure proceeds to step S215c. Otherwise, the procedure proceeds to step S215d. In step 215c, the via arranging subsection $23Y_2$ arranges the provisional vias $120D_1$ and $120D_2$ at the intersection of the first termination $110D_1$ and the first line part $110D_2$ and the intersection of the second termination $130D_1$ and the second line $130D_2$, respectively, and proceeds to step S121.

Figure 38:
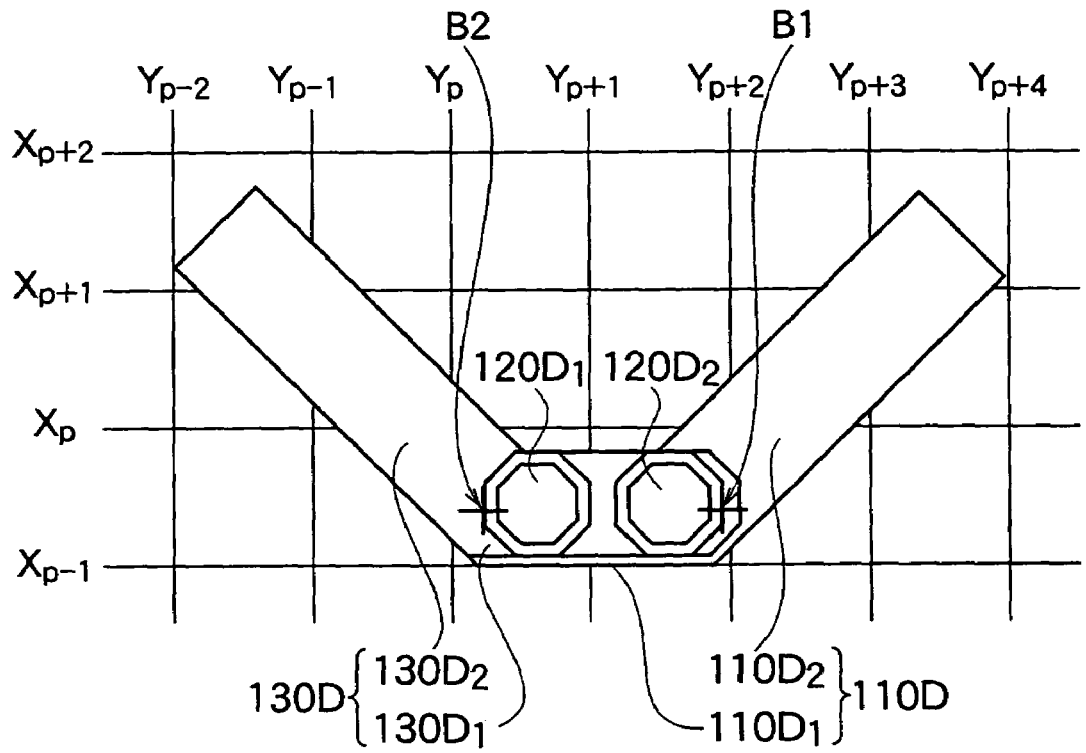

(h) On the contrary, in the case where the provisional vias $120D_1$ and $120D_2$ are not arranged at the intersection of the wiring lines, as shown in FIG. 38, the via arranging subsection $23Y_2$ arranges the provisional vias $120D_1$ and $120D_2$ away from the intersection of the first termination $110D_1$ and the first line part $110D_2$ and the intersection of the second termination $130D_1$ and the second line $130D_2$, respectively, in step 215d, and the procedure proceeds to step S121. Steps after step S121 are the same as those in the flowchart shown in FIG. 14, and the description thereof is omitted.

With the computer implemented design method according to the second embodiment of the present invention, the via design subunit 23 arranges the octagon provisional vias $120D_1$ and $120D_2$ on the wiring layer including "diagonal" wiring arranged by the diagonal wiring design subunit 22a. Therefore, design violation of vias is less likely to be created than when arranging square vias between wiring layers including diagonal wiring. In the "diagonal" wiring, a wiring line arranged by the diagonal wiring design subunit 22a is connected to another wiring line on the same layer at an "obtuse" angle clockwise or counterclockwise from the direction that the wiring line extends. Therefore, an intersection of wiring lines with an obtuse angle therebetween increases the pattern area of the intersection of wiring lines. Accordingly, it can be designed to create less problems with insufficient exposure to the intersection rather than in the case of forming orthogonal wiring including portions bent at 90 degrees.

Furthermore, the via design subunit 23 arranges vias away from intersections of wiring lines. Accordingly, defects of vias are less likely to be created, thus increasing the yield. Specifically, with the computer implemented design method according to the second embodiment, it is possible to reduce the problems of bad connection (shortening) between wiring lines and vias due to a reduction in the width of wiring patterns at intersections of wiring lines and by providing a semiconductor IC so wiring efficiency is increased.

Moreover, in modifying the provisional via for optimization on the layout designed by the layout design unit 20a, the optimal via replacement unit 30 is only required to extract a via from the "optimal via list" including vias whose sizes and geometries are previously optimized according to the arranged environments. The provisional via is then replaced with the extracted optimal via. Accordingly, there is no need to perform the OPC process for each provisional via, thus reducing the processing time.

-Reticle Set-

FIGS. 34 to 41 show an example of CAD data of the semiconductor IC according to the second embodiment. FIGS. 34 to 41 show only part of CAD data of the chip area of the semiconductor IC which can be designed by the computer implemented design system shown in FIG. 29. An example of CAD data just after arrangement of the provisional vias $120D_1$ and $120D_2$ is completed in the step S215 of FIG. 33.

As shown in FIG. 34, the first termination $110D_1$ is arranged to extend parallel to the grid lines $X_{p-1}$, $X_p$, $X_{p+1}$, . . . At the right end of the first termination $110D_1$, the first line part $110D_2$ extends in a diagonal direction to the grid lines $X_{p-1}$, $X_p$, $X_{p+1}$, . . . , namely, a direction of 135 degrees clockwise from the direction that the first termination $110D_1$ extends. The second termination $130D_1$ is arranged so as to overlap the first termination $110D_1$. The second line $130D_2$ is arranged so as to extend from the left end of the second termination $130D_1$ in the direction diagonal to the grid lines $X_{p-1}$, $X_p$, $X_{p+1}$, . . . , namely, in the direction of 135 degrees counterclockwise from the direction that the second termination $130D_1$ extends. The octagon provisional via $120D_1$ is arranged at the connecting portion of the first termination $110D_1$ and the first line part $110D_2$, which is a bent portion B1 of the first wiring 110D. The octagon provisional via $120D_2$ is arranged at the connecting portion of the second termination $130D_1$ and the second line $130D_2$, which is a bent portion B2 of the second wiring 130D.

Figure 35:
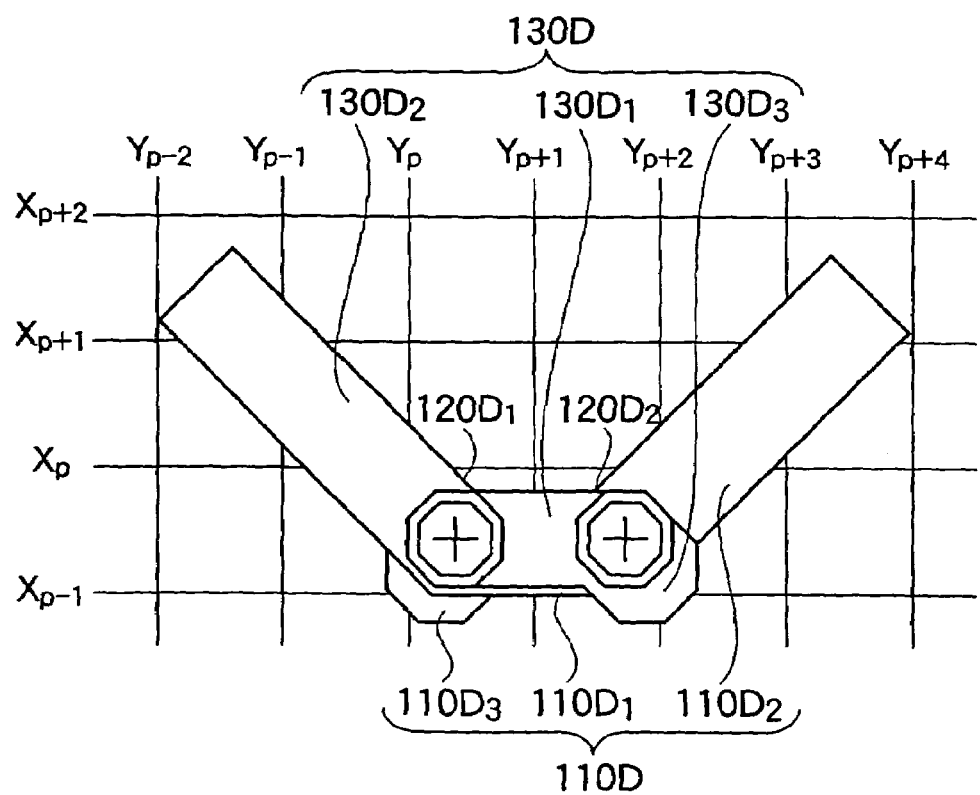
Figure 36:
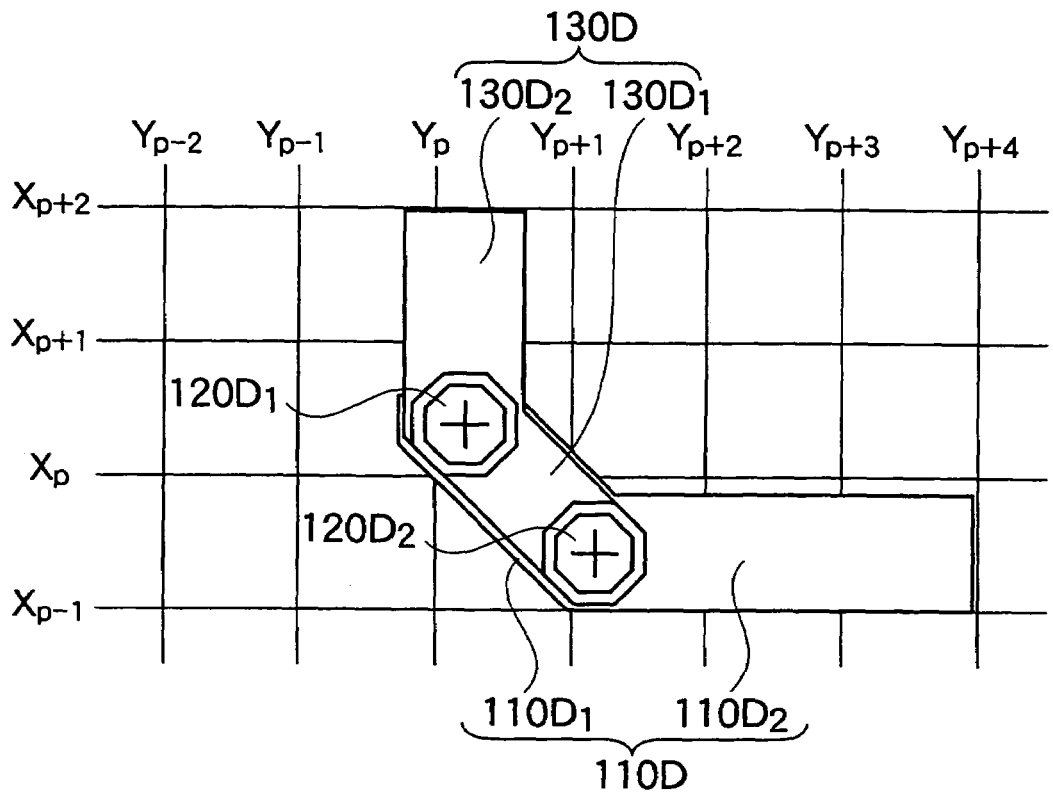
Figure 37:
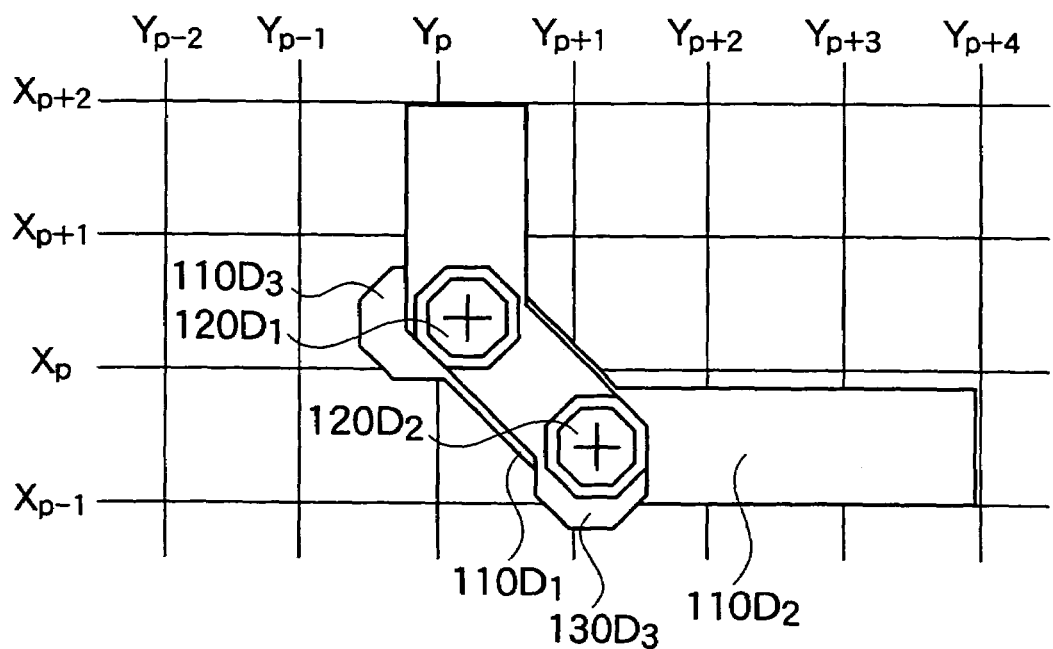

The computer implemented design system shown in FIG. 29 can also design the CAD data shown in FIG. 35 in which the octagon expansion region $110D_3$ is arranged at the left end of the first termination $110D_1$ of FIG. 34 and the octagon expansion region $130D_3$ is arranged at the right end of the second termination $130D_1$. As shown in FIGS. 36 and 37, the computer implemented design system shown in FIG. 29 can design CAD data in which the first termination $110D_1$ and the second termination $130D_1$ are arranged at 45 degrees to the grid lines $X_{p-1}$, $X_p$, $X_{p+1}$, . . .

In the CAD data shown in FIGS. 34 to 37, the first termination $110D_1$ and the first line part $110D_2$ of the first wiring 110D are diagonally arranged so that the angle between the first termination $110D_1$ and the first line part $110D_2$ is an obtuse angle clockwise from the direction that the first termination $110D_1$ extends or so that the angle between the second termination $130D_1$ and the second line $130D_2$ is an obtuse angle counterclockwise from the direction that the first termination $130D_1$ extends.

Diagonal arrangement of wiring lines with an obtuse angle therebetween increases the area of the intersection compared to using orthogonal wiring. Therefore, it is possible to suppress pattern width reduction at bent portions of wiring lines created by insufficient exposure. Accordingly, defects are less likely to be caused in vias arranged at intersections, and it is possible to obtain a semiconductor IC which inhibits the reduction in yield. Moreover, when the octagon provisional vias $120D_1$ and $120D_2$ are arranged as vias connecting the first and second terminations $110D_1$ and $130D_1$, restrictions on designing diagonal wiring are reduced, thus increasing the reliability.

Figure 39:
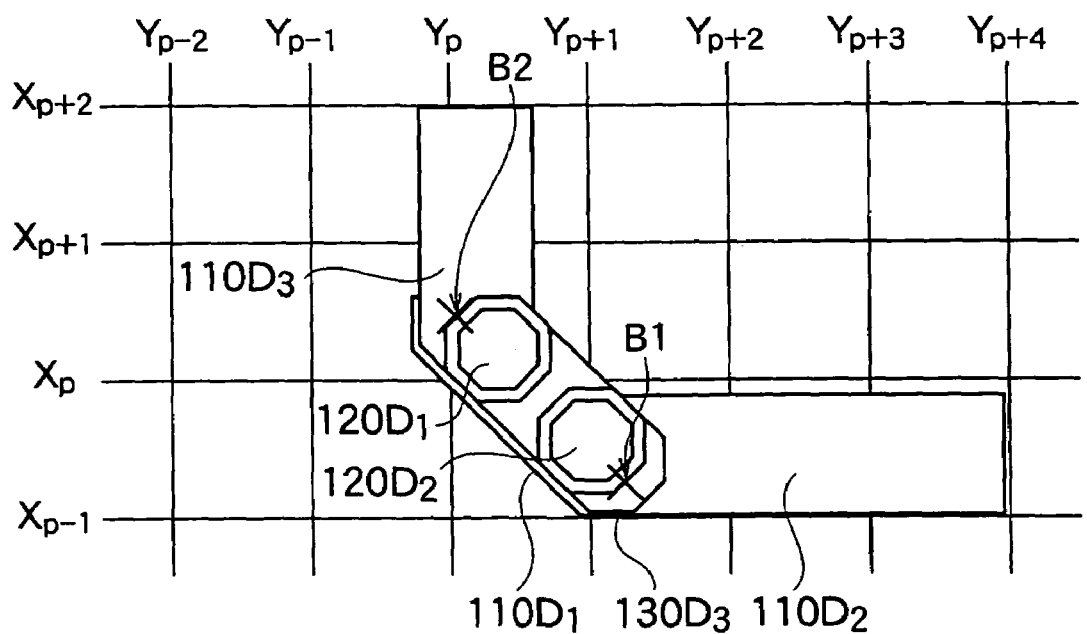

Furthermore, as shown in FIGS. 38 and 39, the provisional vias $120D_1$ and $120D_2$ are arranged away from the connecting portion of the first termination $110D_1$ and the first line part $110D_2$ and the connection portions of the second termination $130D_1$ and the second line $130D_2$. This reduces the possibility of causing defects in vias $120_1$ and $120_2$, and it is possible to provide a semiconductor IC with high connection reliability.

Figure 40:
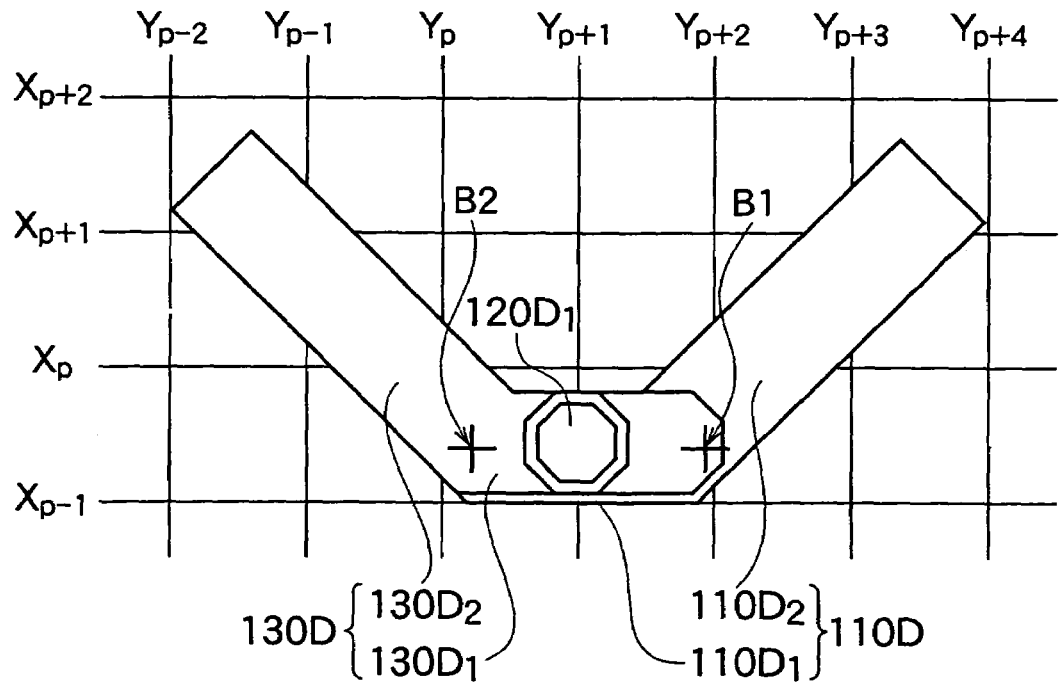
Figure 41:
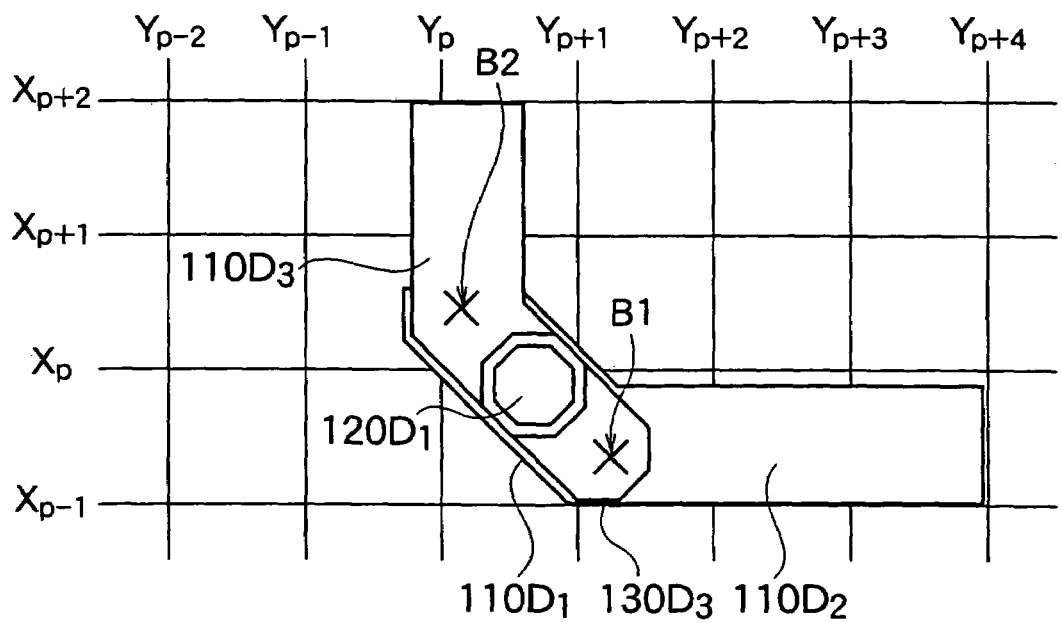

In FIGS. 34 to 39, the two provisional vias $120D_1$ and $120D_2$ are arranged on the wiring line since it is assumed to arrange a plurality of vias in a wiring region has less influence on the degree of integration of the semiconductor circuit. However, it is certain that, as shown in FIGS. 40 and 41, the number of arranged vias is not limited to two or more, but just a single via can be arranged in the overlap region of the first and second terminations $110D_1$ and $130D_1$.

Figure 42:
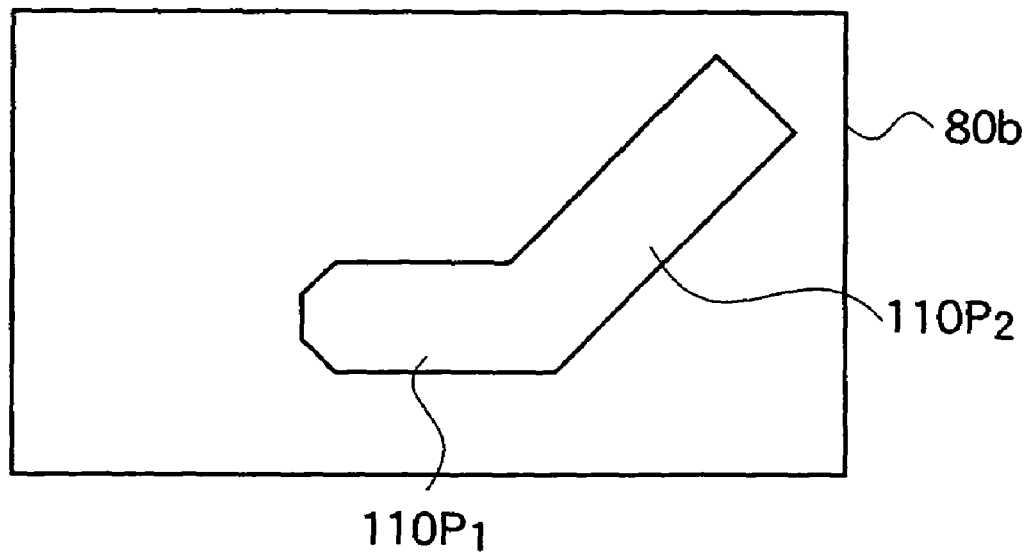
FIG. 42 is a plane view illustrating a first reticle (i-st layer reticle) of the reticle set designed by the computer implemented design system according to the second embodiment of the present invention.
Figure 43:
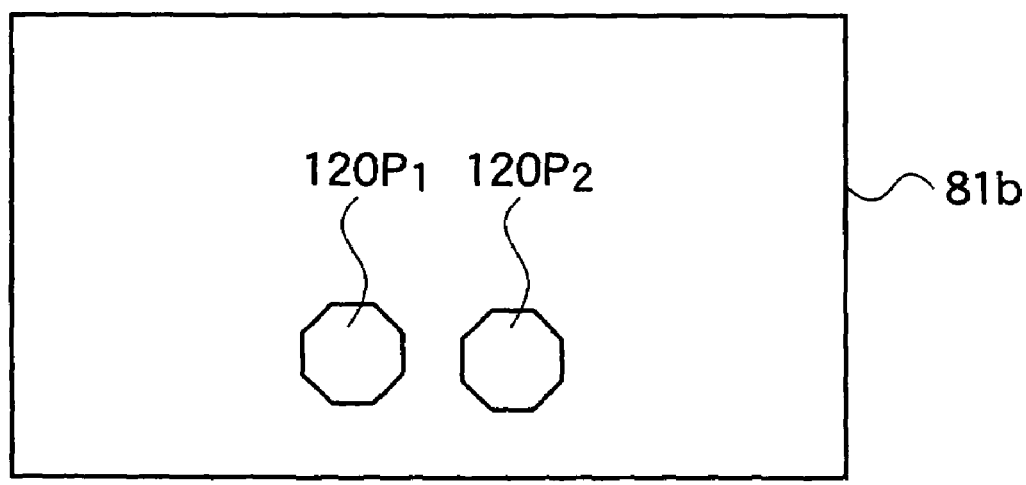
FIG. 43 is a plane view illustrating a second reticle ((i+1)-st layer reticle) of the reticle set designed by the computer implemented design system according to the second embodiment of the present invention.
Figure 44:
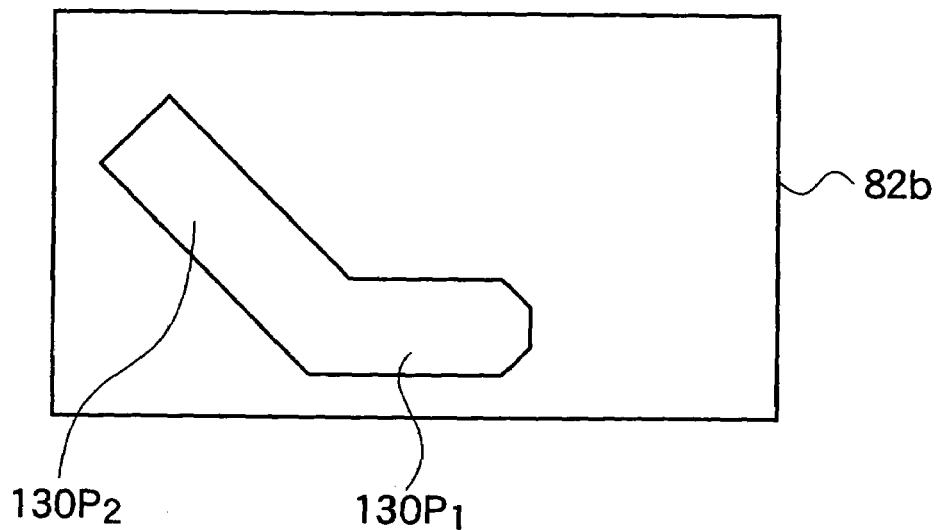
FIG. 44 is a plane view illustrating a first reticle ((i+2)-st layer reticle) of the reticle set designed by the computer implemented design system according to the third embodiment of the present invention.

FIGS. 42 to 44 show an example of a reticle set according to the second embodiment. The reticle set shown in FIGS. 42 to 44 is manufactured by the pattern generator or the like based on the CAD data obtained by the computer implemented design system shown in FIG. 29. FIGS. 42 to 44 show a first reticle (i-th layer reticle) 80b, a second reticle ((i+1)-th layer reticle) 81b to be aligned with a projected image of the first reticle 80b for projection, and a third reticle ((i+2)-th layer reticle) to be aligned with a pattern which is formed from the first and second reticles 80b and 81b for projection, respectively.

In the first reticle 80b, a first termination pattern (i-th termination region pattern) $110P_1$ and a first line part pattern (i-th line part pattern) for drawing the first wiring 110 in the semiconductor IC, are arranged on a mask substrate of quartz glass or the like and a pattern forms on an opaque film of Cr, $Cr_2O_3$, or the like. In the second reticle 81b, the octagon via patterns $120P_1$ and $120P_2$ are arranged as an opaque film. In the third reticle 82b, the second termination pattern (j-th termination region pattern) $130P_1$ and the second line pattern (j-th line part pattern) $130P_2$ draw the second wiring 130 as an opaque film.

According to the reticle set shown in FIGS. 42 to 44, octagon provisional vias $120D_1$ and $120D_2$ are arranged in the wiring layer including "diagonal" wiring in which a wiring line is connected to another line on the same wiring layer at an obtuse angle clockwise or counterclockwise from the direction that the regarded wiring line extends. Therefore, the via patterns $120P_1$ and $120P_2$ do not protrude from the wiring layers including wiring lines of 0, 45, 90, and 135 degrees, thus preventing reduction in yield. Moreover, the two via patterns $120P_1$ and $120P_2$ are arranged in the overlap region of the first termination pattern $110P_1$ as lower layer wiring and in the second termination pattern $130P_1$ as upper layer wiring. Accordingly, the reliability of the semiconductor IC is increased compared to when only arranging one via.

Furthermore, an intersection of wiring lines with an obtuse angle therebetween increases the pattern area of the intersection. Accordingly, it can be designed to create less problems of insufficient exposure to intersections than in the case of forming orthogonal wiring including portions bent at 90 degrees. Therefore, according to the computer implemented design system shown in FIG. 29, it is possible to reduce the problems of bad connection (shortening) between wiring lines and vias due to a reduction in the width of wiring patterns at intersections of wiring lines and by providing a semiconductor IC so wiring efficiency is increased.

Furthermore, the via patterns $120P_1$ and $120P_2$ shown in FIGS. 42 to 44 are replaced with optimal vias which are optimal according to the arrangement of the environments concerning the surrounding via patterns, by the optimal via replacement unit 30 shown in FIG. 29. Therefore, even when an isolated via is generated in the region with sparse lines, width reduction or defects of pattern are less likely to be created in the isolated via after exposure. Accordingly, it is possible to provide a highly reliable semiconductor IC which prevents reductions in yield.

-Integrated Circuit-

Figure 45:
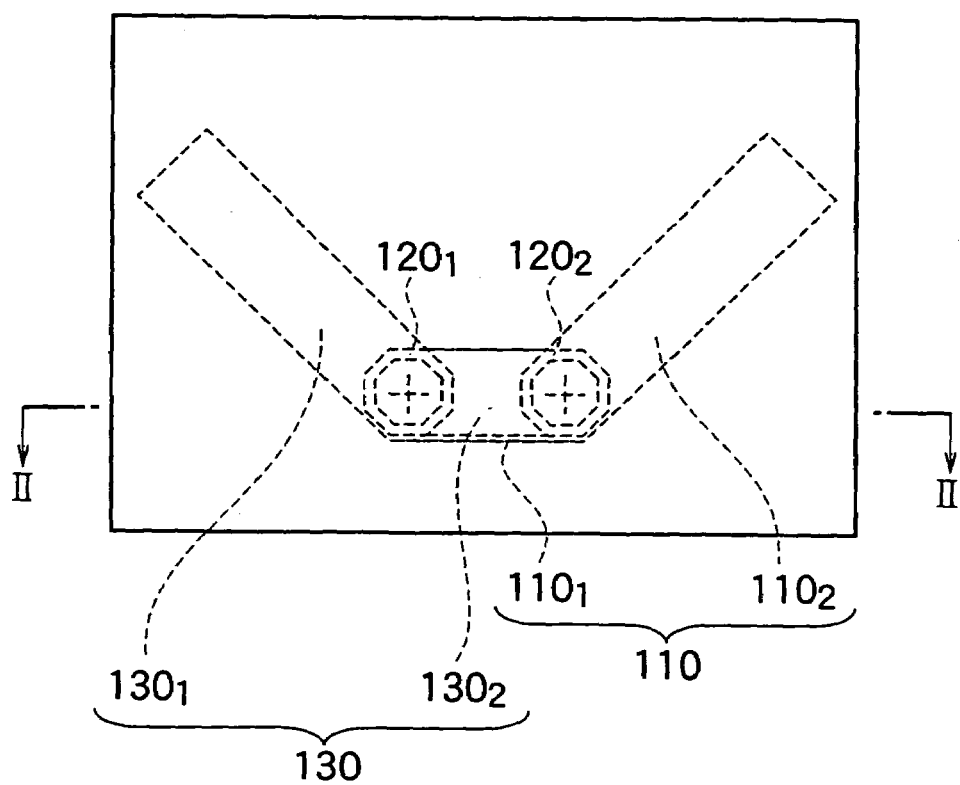
FIG. 45 is a plane view illustrating a part of the semiconductor IC manufactured by the reticle set as shown in FIGS. 42 to 44.
Figure 46:
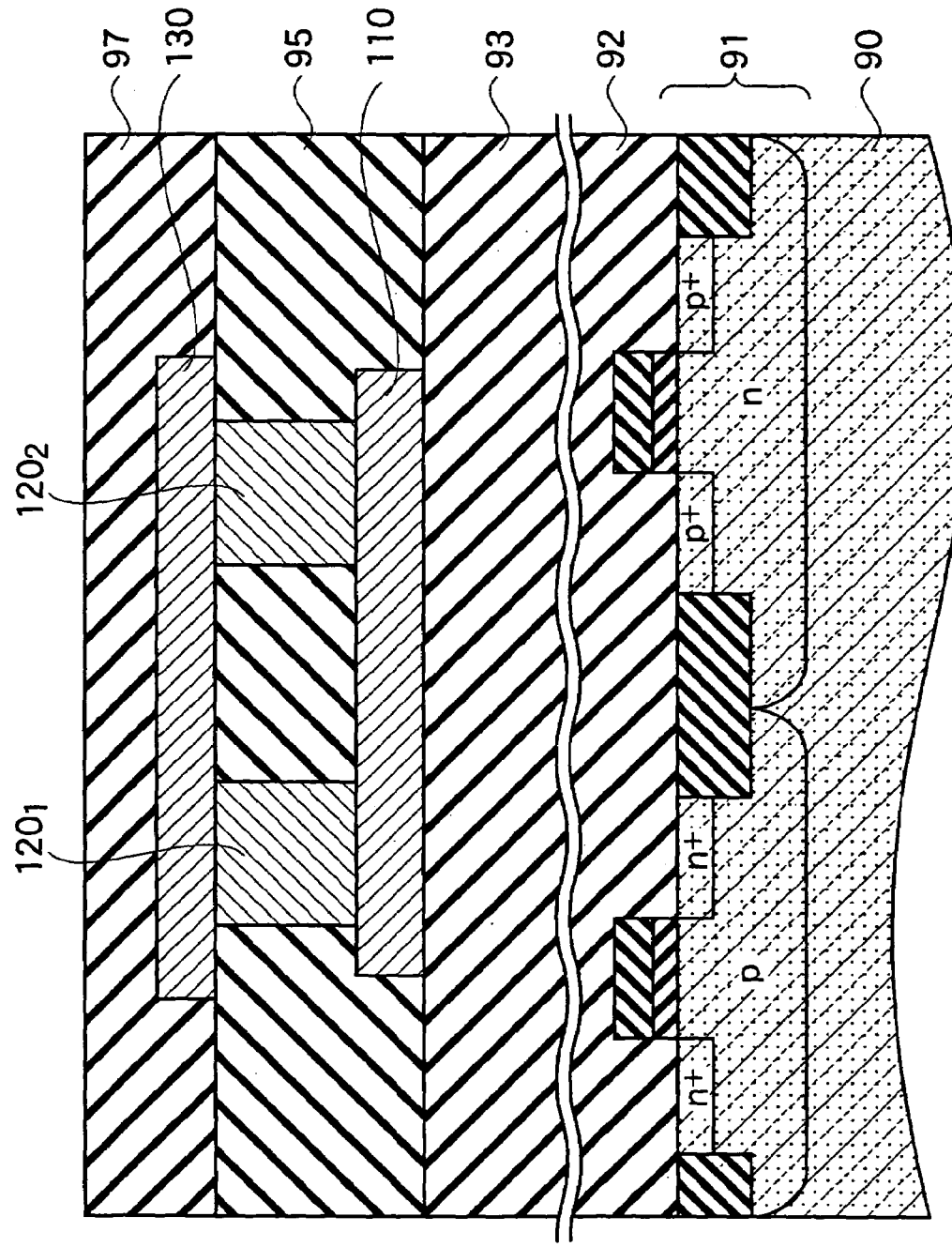
FIG. 46 is a sectional view taken on line II—II in FIG. 45, illustrating an example of the integrated circuit manufactured by the reticle set as shown in FIGS. 42 to 44.

FIGS. 45 and 46 show an example of a multilayer wiring structure of the semiconductor IC according to the second embodiment of the present invention. FIG. 46 shows an example of a cross-sectional view taken on line II—II in FIG. 45. As shown in FIG. 46, the semiconductor IC includes the semiconductor substrate 90 with the semiconductor device 91 arranged in the isolation region, the first interlayer dielectric 92 deposited on the semiconductor substrate 90, the k-th interlayer dielectric 93 deposited on a layer above the first interlayer dielectric 92, and the k-th termination region $110_1$ of the k-th wiring 110 arranged on the k-th interlayer dielectric 93.

As shown in FIG. 45, the k-th line part $110_2$ extending in the direction of 135 degrees clockwise from the direction that the k-th termination region $110_1$ extends, is arranged at the right end of the k-th termination region $110_1$. The k-th wiring 110 is formed by patterning metal film of Al, an aluminum alloy, or the like by photolithography and RIE using the reticle of FIG. 42. Specifically, photoresist is applied on the metal film and exposed by the stepper, by using the first reticle shown in FIG. 42. The metal film is then etched by RIE using a pattern of photoresist, obtained after development, as a mask.

As shown in FIG. 46, the two via plugs $120_1$ and $120_2$ are connected to the upper surface of the k-th termination region $110_1$. The k+1 interlayer dielectric 95 is arranged on the upper surface of the k-th termination region $110_1$ and the k-th line part $110_2$ so as to surround the via plugs $120_1$ and $120_2$. The via plugs $120_1$ and $120_2$ are formed in the following manner. Photoresist applied on the (k+1)-th interlayer dielectric 95 is patterned by photolithography by using the second reticle 81b shown in FIG. 43. The (k+1)-th interlayer dielectric 95 is etched by photolithography by using the patterned photoresist as a mask until part of the k-th wiring 110 is exposed.

The (k+1)-th termination region $130_1$ of the (k+1)-th wiring 130 is arranged on the (k+1)-th interlayer dielectric 95. As shown in FIG. 45, the (k+1)-th line part $130_2$ is arranged behind the (k+1)-th termination region $130_1$ so as to extend in the direction of 135 degrees counterclockwise from the direction that the (k+1)-th termination region $130_1$ extends. The (k+1)-th wiring 130 is formed by patterning photoresist applied in a metal film by using the third reticle 82b of FIG. 44 and then etching the (k+1)-th wiring 130 by RIE using the patterned photoresist as a mask. The k+2-th interlayer dielectric 97 is arranged on the (k+1)-th interlayer dielectric 95.

With the semiconductor IC, according to the second embodiment of the present invention, as shown in FIGS. 45 and 46, the plurality of via plugs $120_1$ and $120_2$ which are formed based on an octagon via pattern, are arranged between the k-th wiring 110 and the (k+1)-th wiring 130 including diagonal wiring in which a wiring line is connected to another line on the same wiring layer at an obtuse angle clockwise or counterclockwise from the direction that the wiring line extends. Therefore, via defects due to the shortening of wiring lines are less likely to be created than in the case where a single via is arranged between wiring lines.

Moreover, the "obtuse angle" between wiring lines at the connecting portion thereof increases the pattern area of the connecting portion and is less likely to create insufficient exposure of the intersection rather than in the case of forming orthogonal wiring including portions bent at 90 degrees. In other words, with the computer implemented design system shown in FIG. 29, it is possible to reduce the problems of bad connection between wiring lines and vias due to a reduction in the width of wiring patterns at intersections of wiring lines and by providing a semiconductor IC so wiring efficiency is increased.

Moreover, the sizes of the via plugs $120_1$ and $120_2$ are optimized according to the arrangement of the environments concerning the surrounding via patterns, by the optimal via replacement unit 30 shown in FIG. 29. Therefore, even when an isolated via is generated in the region with sparse lines, width reduction or defects of pattern are less likely to be created in the isolated via after exposure. Accordingly, it is possible to provide a highly reliable semiconductor IC which prevents a reduction in yield.

-Semiconductor IC Manufacturing Method-

Next, a description will be given of a method of manufacturing the semiconductor IC according to the second embodiment. This method of manufacturing the semiconductor IC is just an example and can certainly be implemented by various manufacturing methods including modified examples.

Figure 47:
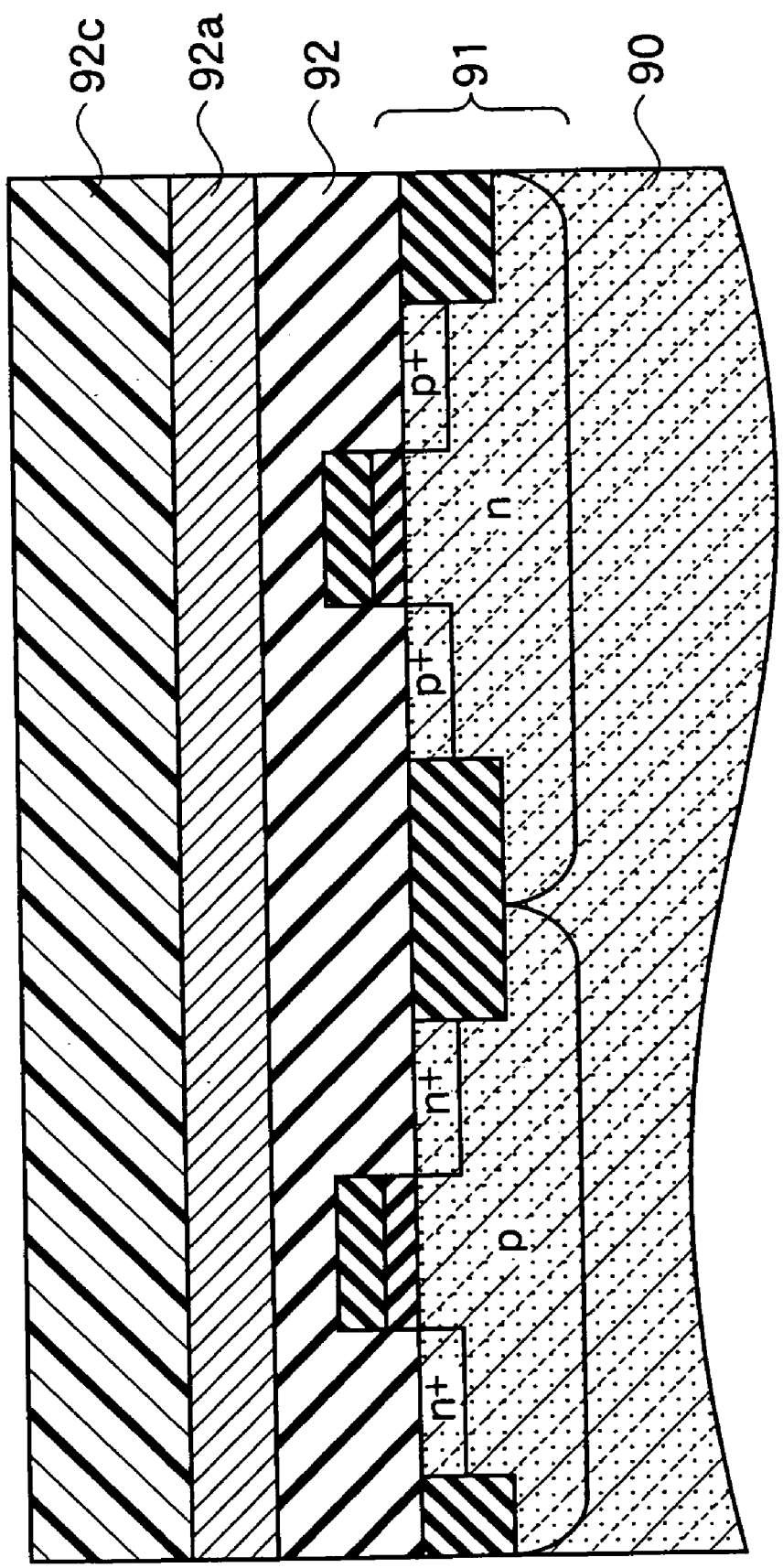
FIGS. 47 to 50, 52 and 53, 55 to 57 are sectional views illustrating a method of manufacturing the integrated circuit according to the second embodiment of the present invention.

(a) As shown in FIG. 47, the first interlayer dielectric 92 such as a silicon dioxide film ($SiO_2$ film) is deposited by chemical vapor deposition (CVD) on the silicon semiconductor substrate 90 with the semiconductor device 91 formed in the device forming region. The surface thereof is then planarized by chemical mechanical polishing (CMP). Subsequently, a conductive thin film 92a composed of aluminum (Al) or the like is deposited on the first interlayer dielectric 92 by spattering or evaporation. A photoresist film 92c is then applied on the conductive thin film 92a. Next, the semiconductor substrate 90 shown in FIG. 47 is placed on an exposure stage of a reduction projection align (stepper) or the like, and the photoresist film 92c is exposed and developed by using the reticle prepared in advance. The conductive thin film 92a is selectively removed by reactive ion etching (RIE) using the delineated photoresist film 92c as a mask. A second interlayer dielectric, not shown, is deposited on the conductive thin film 92a.

Figure 48:
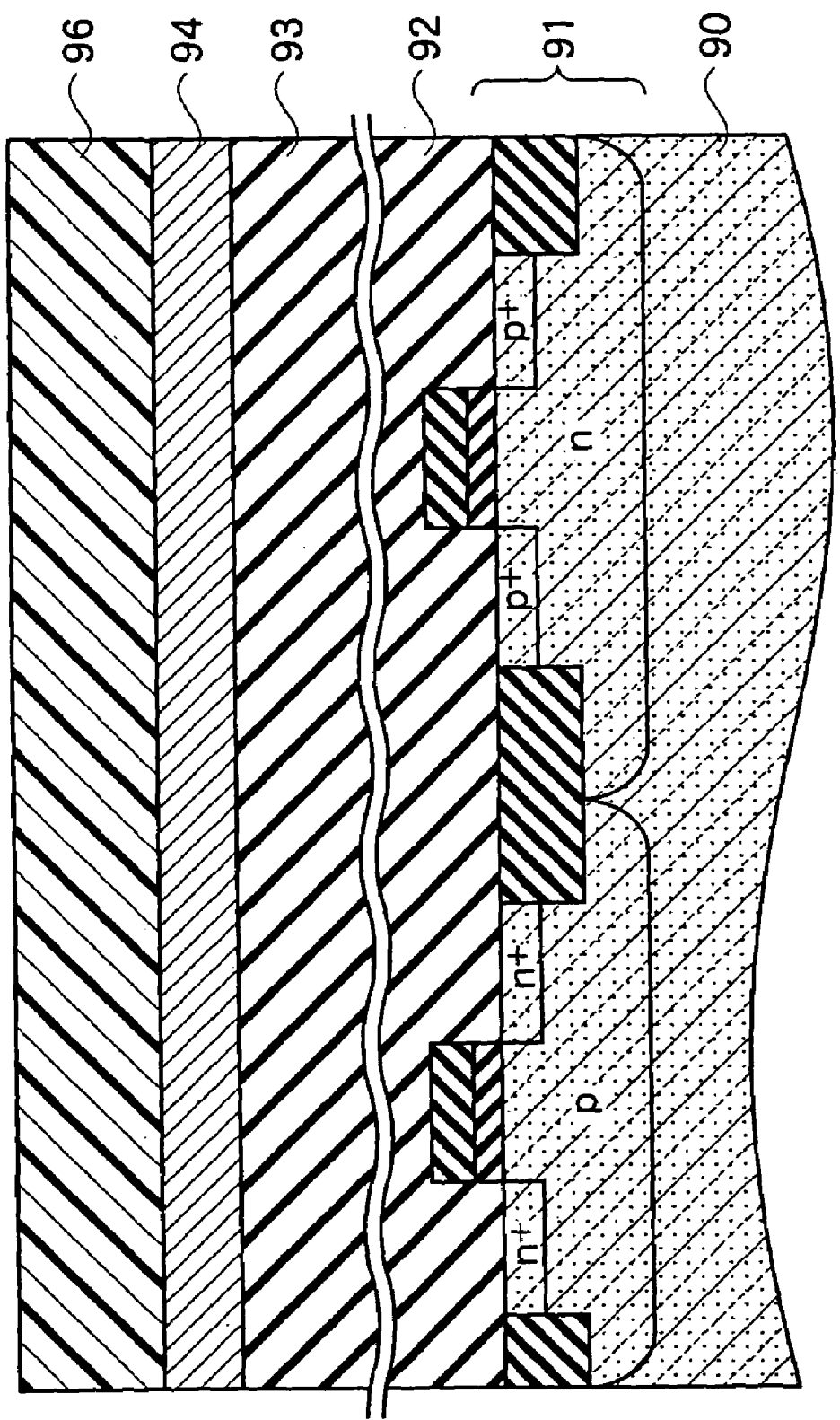
Figure 49:
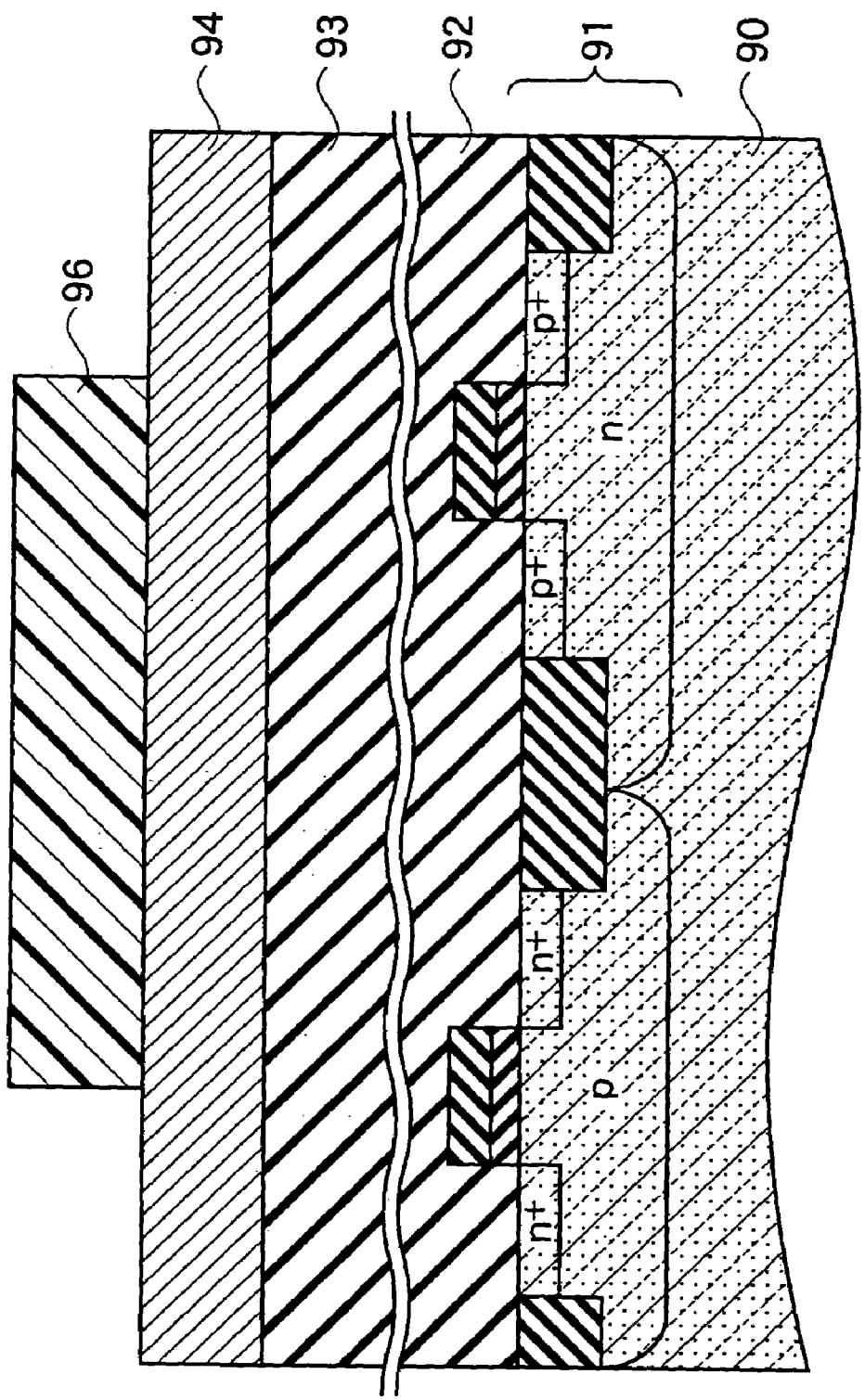
Figure 50:
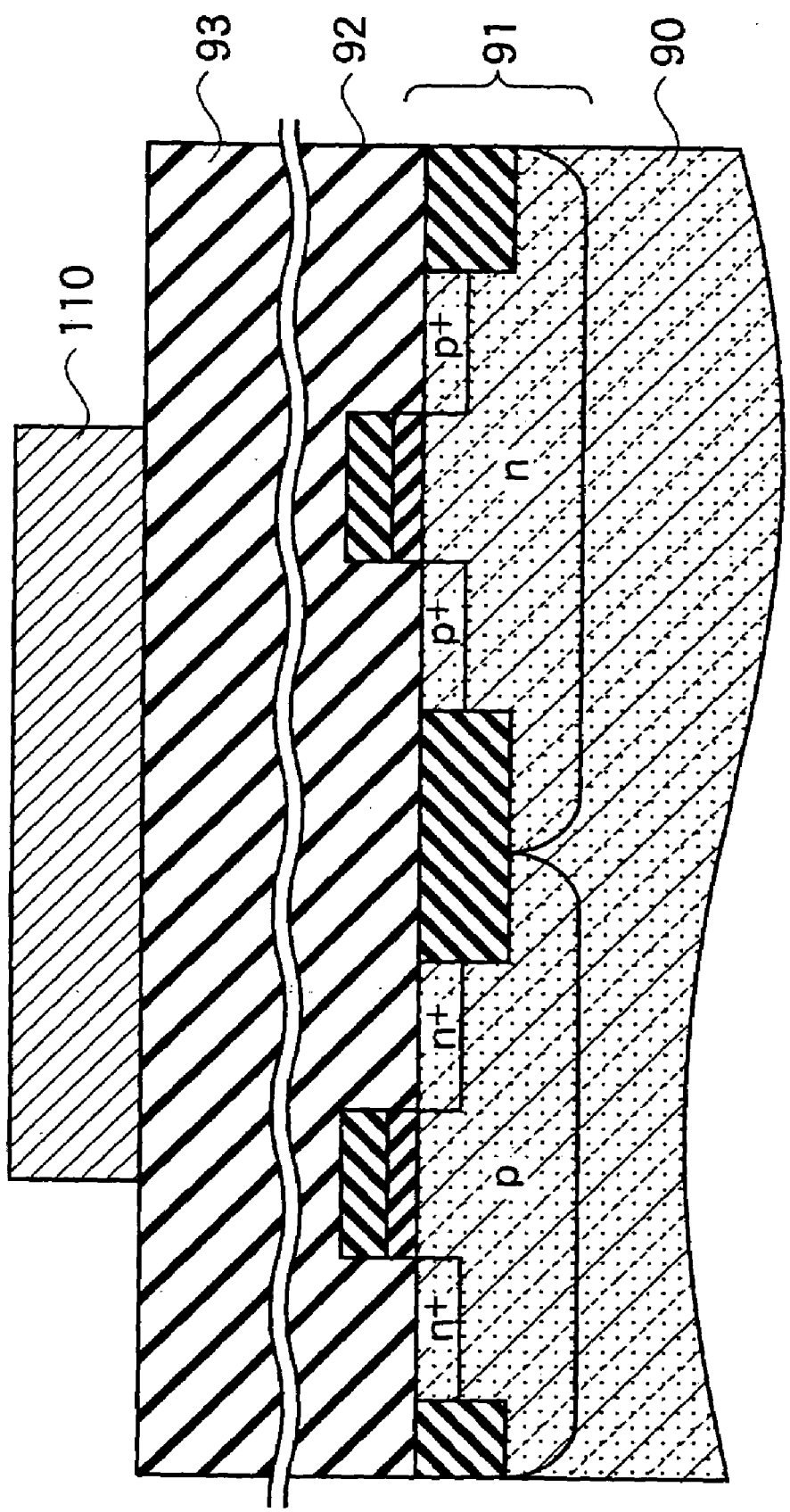
Figure 51:
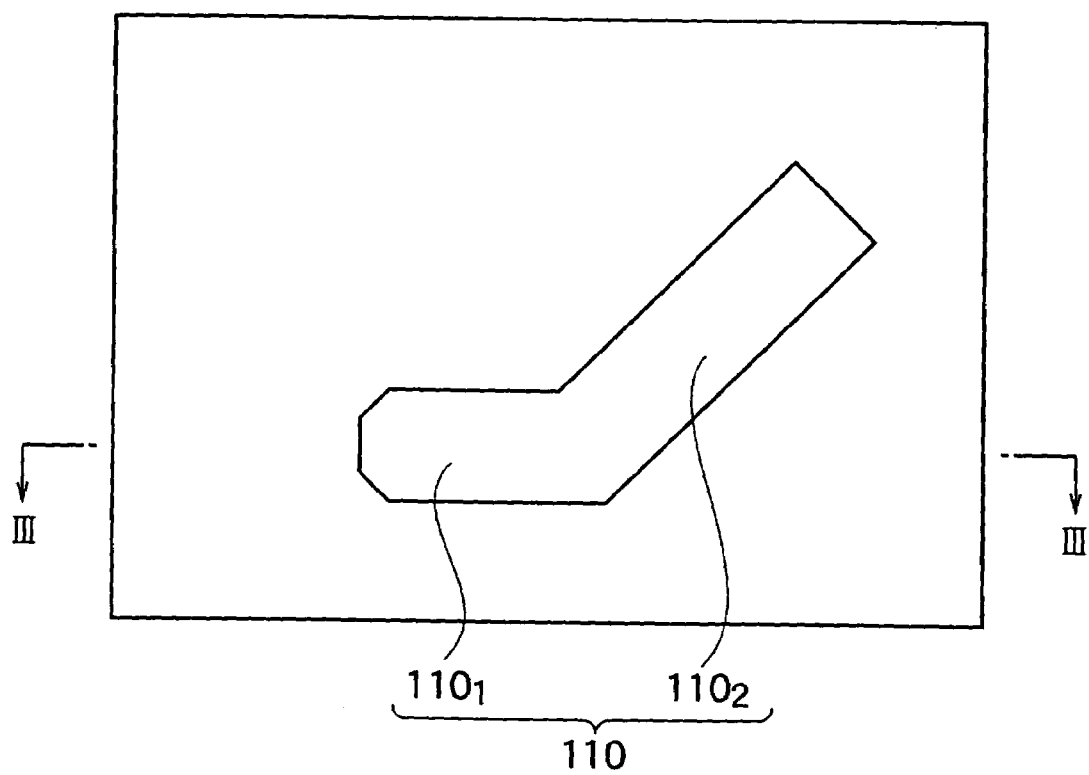
FIG. 51 is a sectional view taken on line III—III in FIG. 50.

(b) Subsequently, the k-th interlayer dielectric 93 is deposited on a layer above the second interlayer dielectric, and the surface thereof is planarized by CMP. As shown in FIG. 48, a conductive thin film 94 is then deposited on the k-th interlayer dielectric 93 and planarized by CMP. A photoresist film 96 is applied on the conductive thin film 94. Next, the semiconductor substrate 90 shown in FIG. 48 is placed on the exposure stage of a stepper or the like. The photoresist thin film 96 is then exposed and developed by using the first reticle 80b shown in FIG. 42 to be delineated on the conductive thin film 94 as shown in FIG. 49. Subsequently, the conductive thin film 94 is selectively removed by RIE using the delineated photoresist film 96 as a mask. Subsequently, the photoresist film 96 is removed to form the k-th wiring 110 including the k-th termination region $110_1$ and the k-th line part $110_2$ on the k-th interlayer dielectric 93 as shown in FIGS. 50 and 51.

Figure 52:
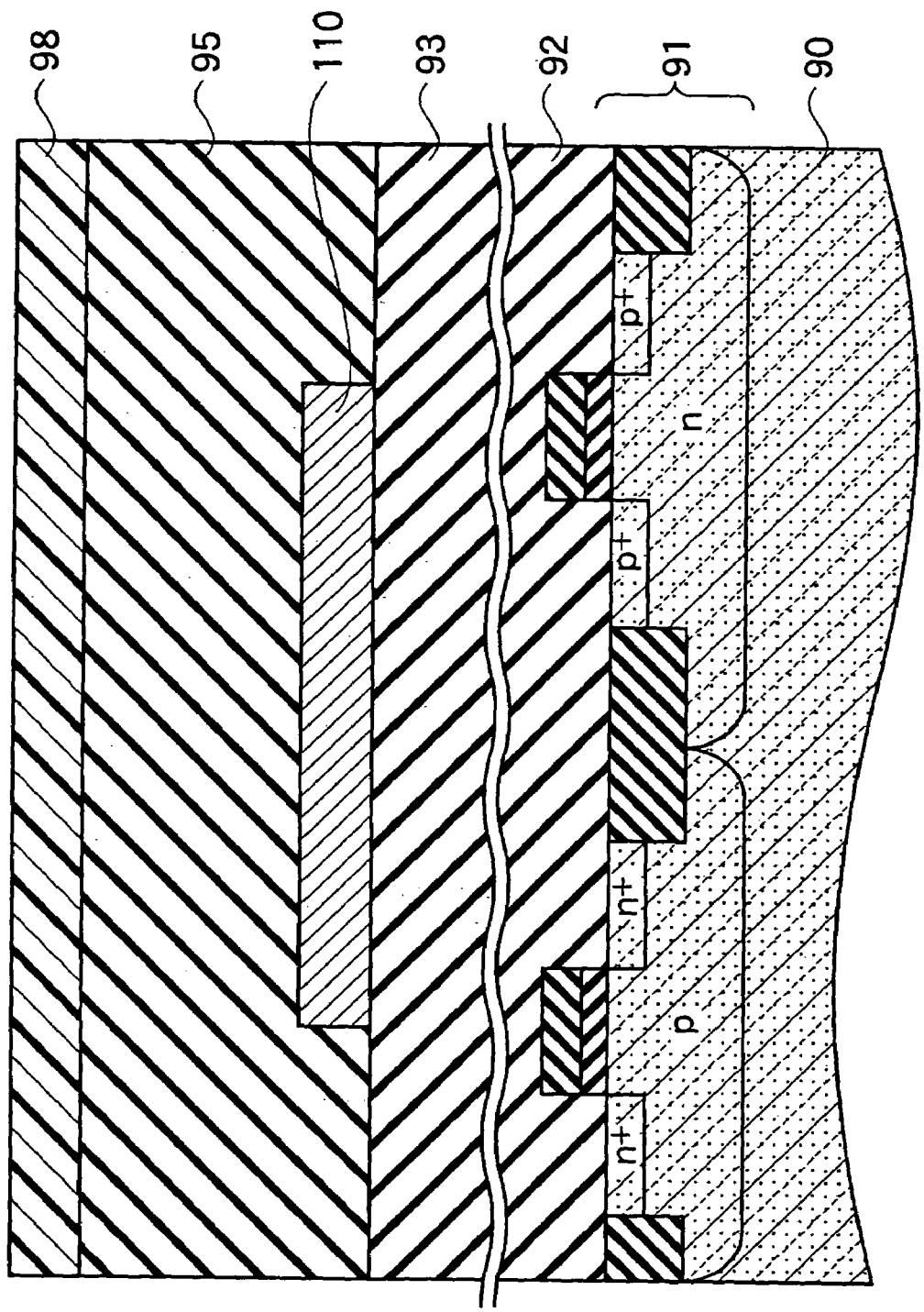
Figure 53:
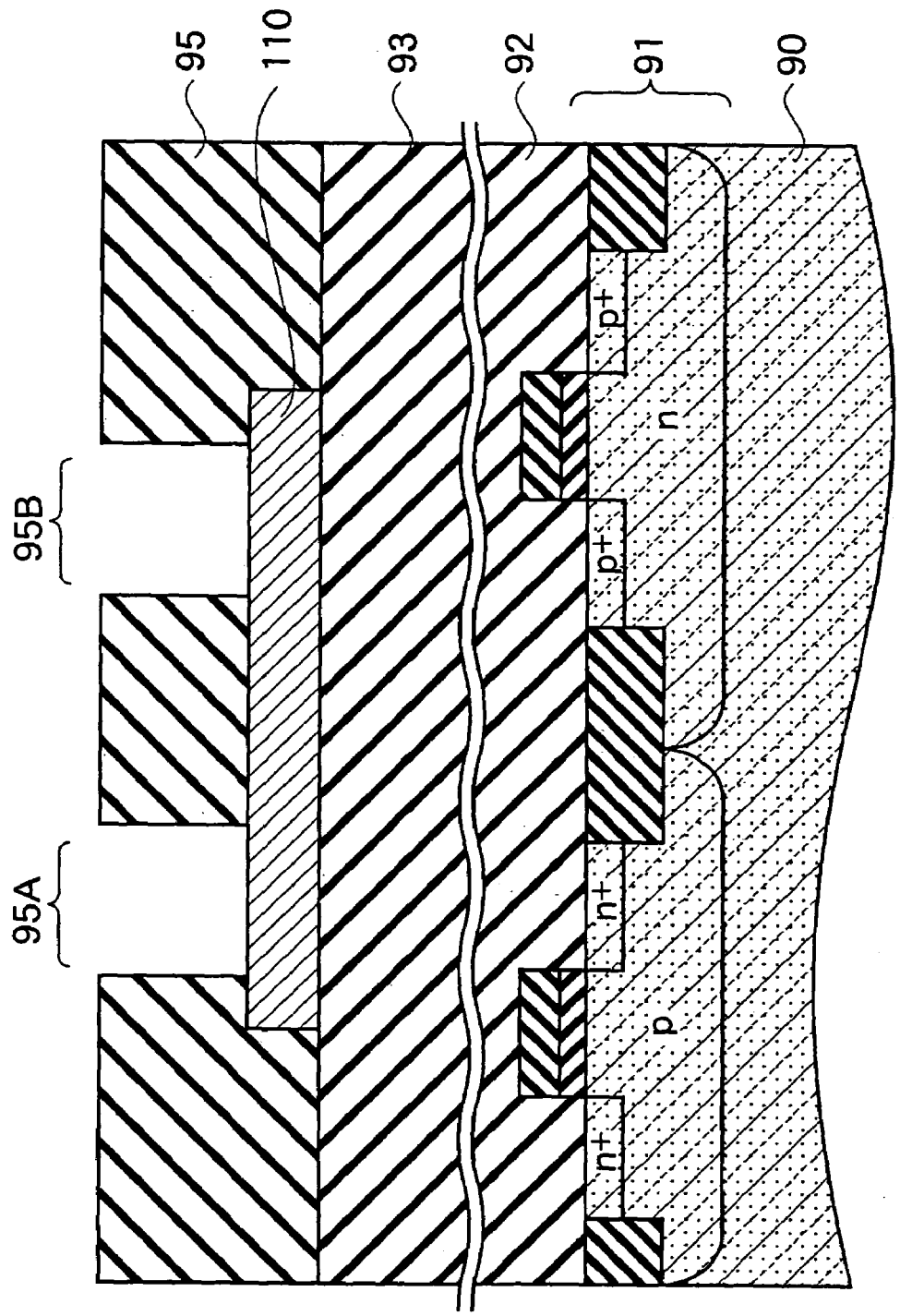
Figure 54:
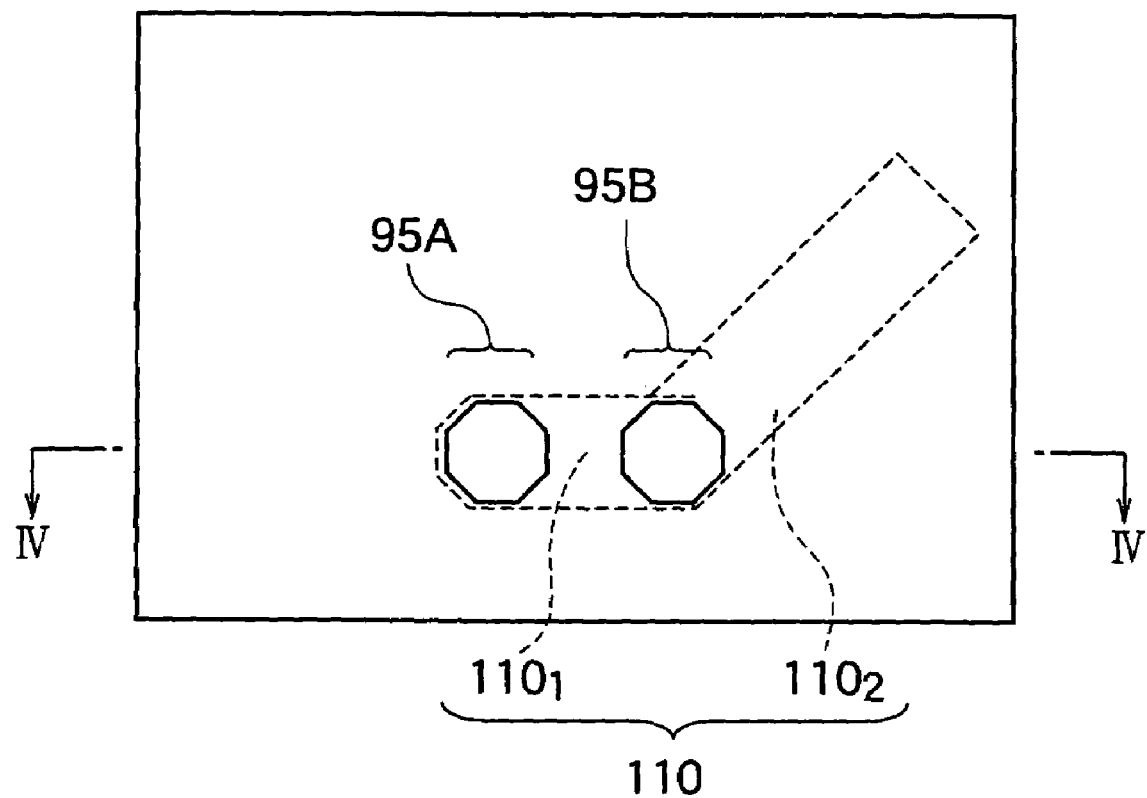
FIG. 54 is taken on line IV—IV in FIG. 53.
Figure 55:
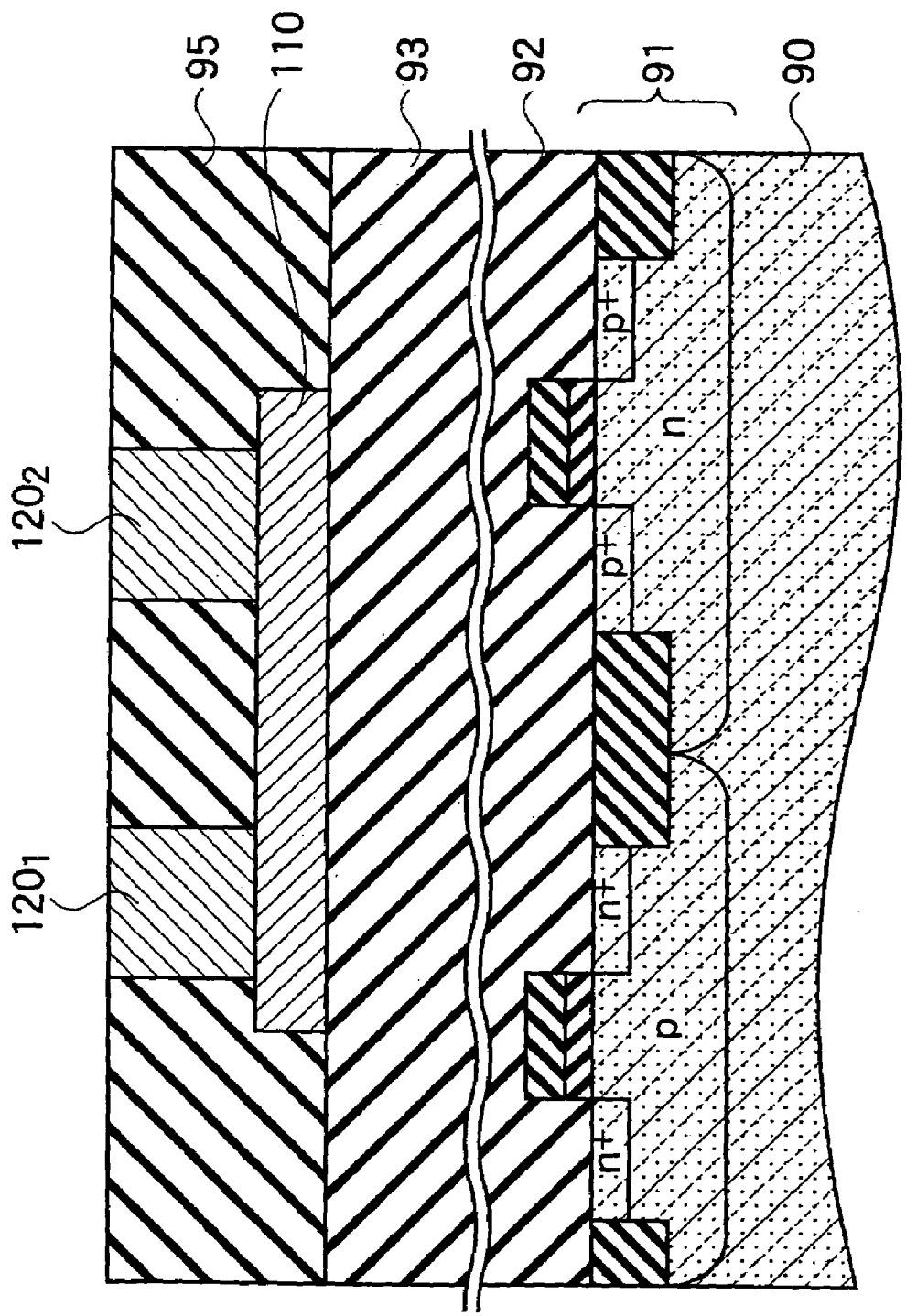

(c) As shown in FIG. 52, the (k+1)-th interlayer dielectric 95 is deposited on the k-th wiring 110 by CVD and planarized by CMP, and a photoresist film 98 is deposited thereon. Subsequently, after the photoresist film 98 is delineated by using the second reticle 81b shown in FIG. 43, the (k+1)-th interlayer dielectric 95 is then selectively removed by RIE or the like as shown in the cross-sectional view of FIG. 53 and the plan view of FIG. 54 to form openings (via holes) 95A and 95B above the k-th wiring 110. Subsequently, as shown in FIG. 55, refractory metal such as tungsten (W) and molybdenum (Mo) is embedded in the via holes 95A and 95B by spattering, evaporation, or the like, and then the surface thereof is planarized by CMP or the like to form the via plugs $120_1$ and $120_2$.

Figure 56:
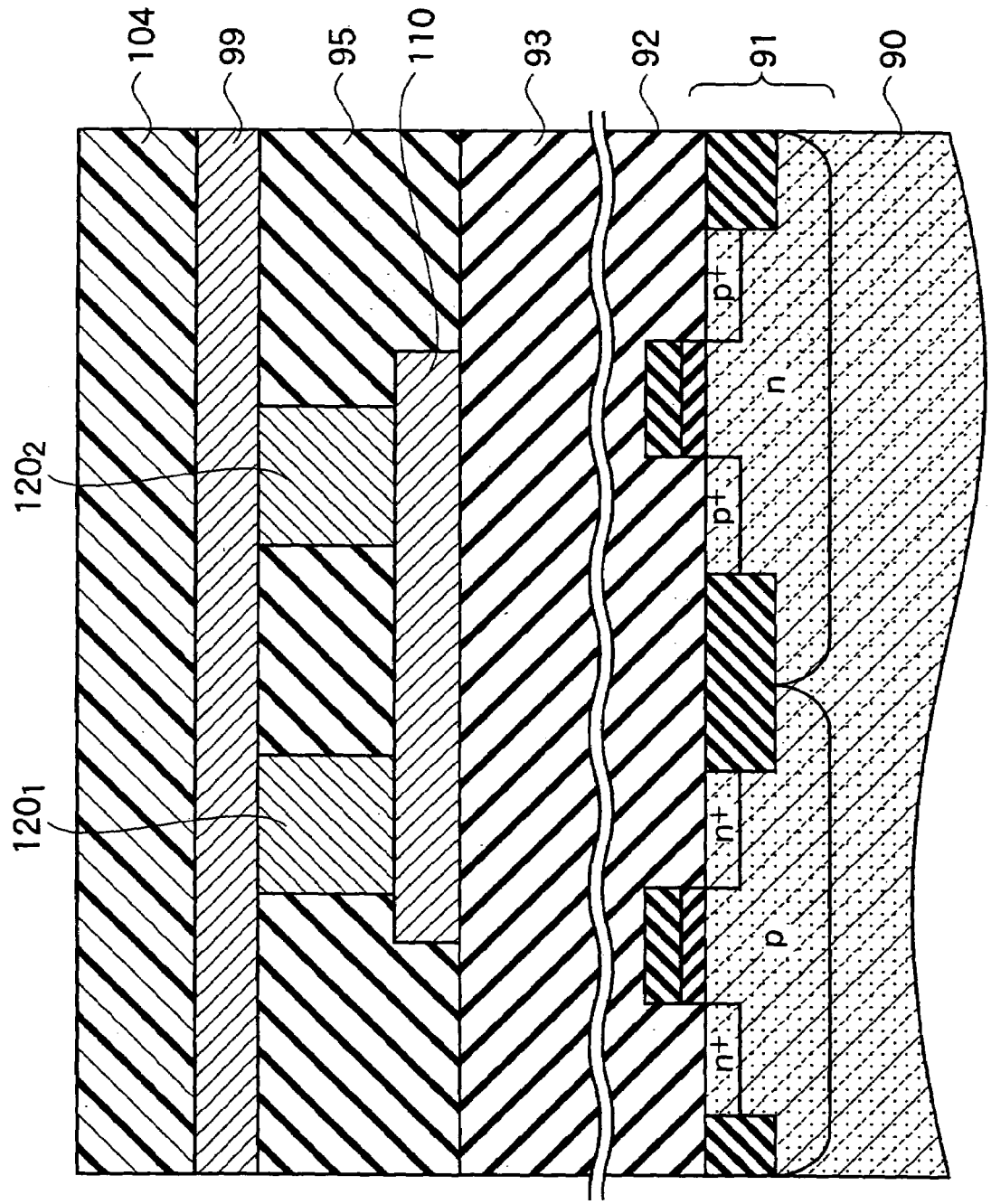
Figure 57:
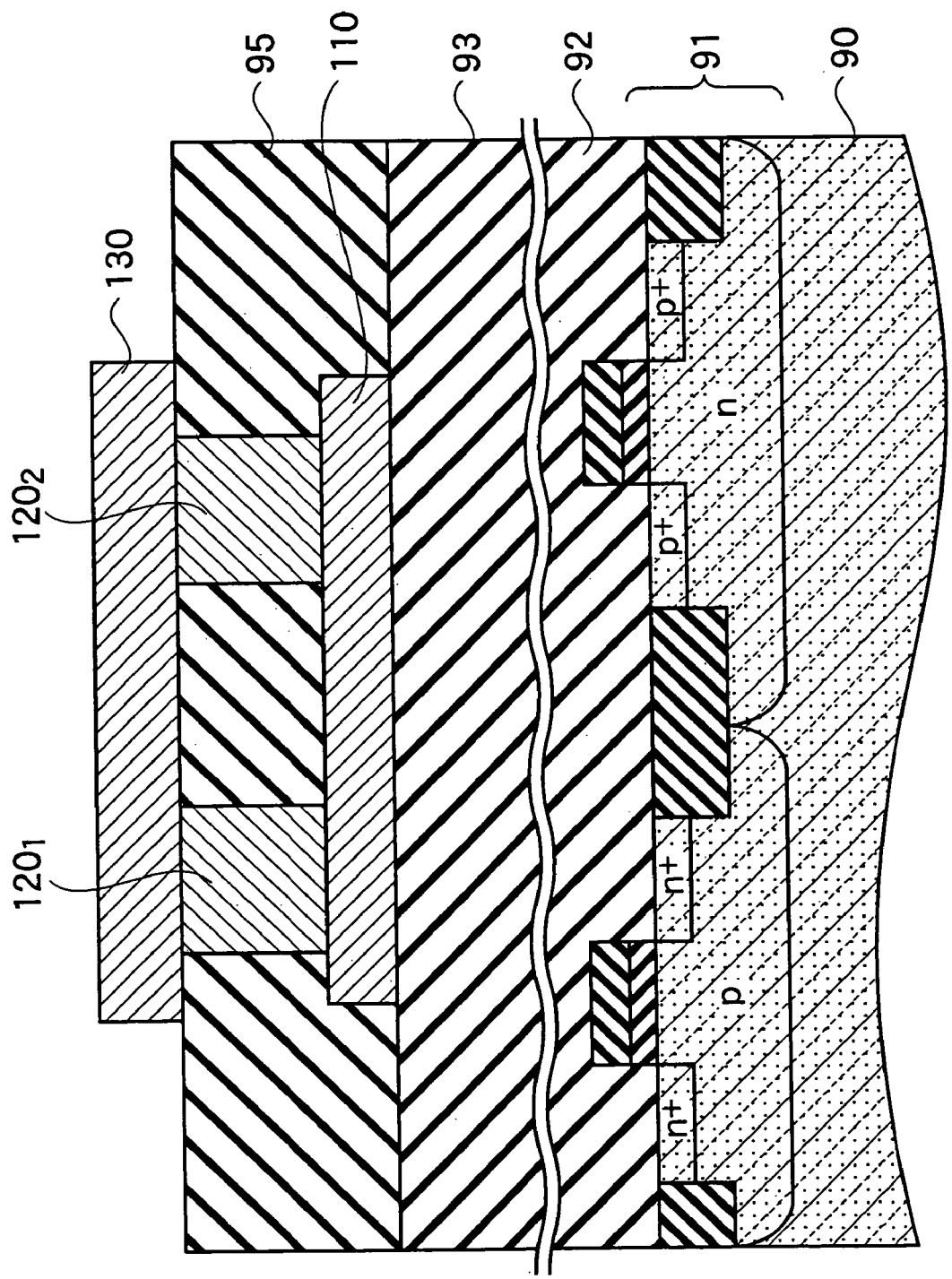
Figure 58:
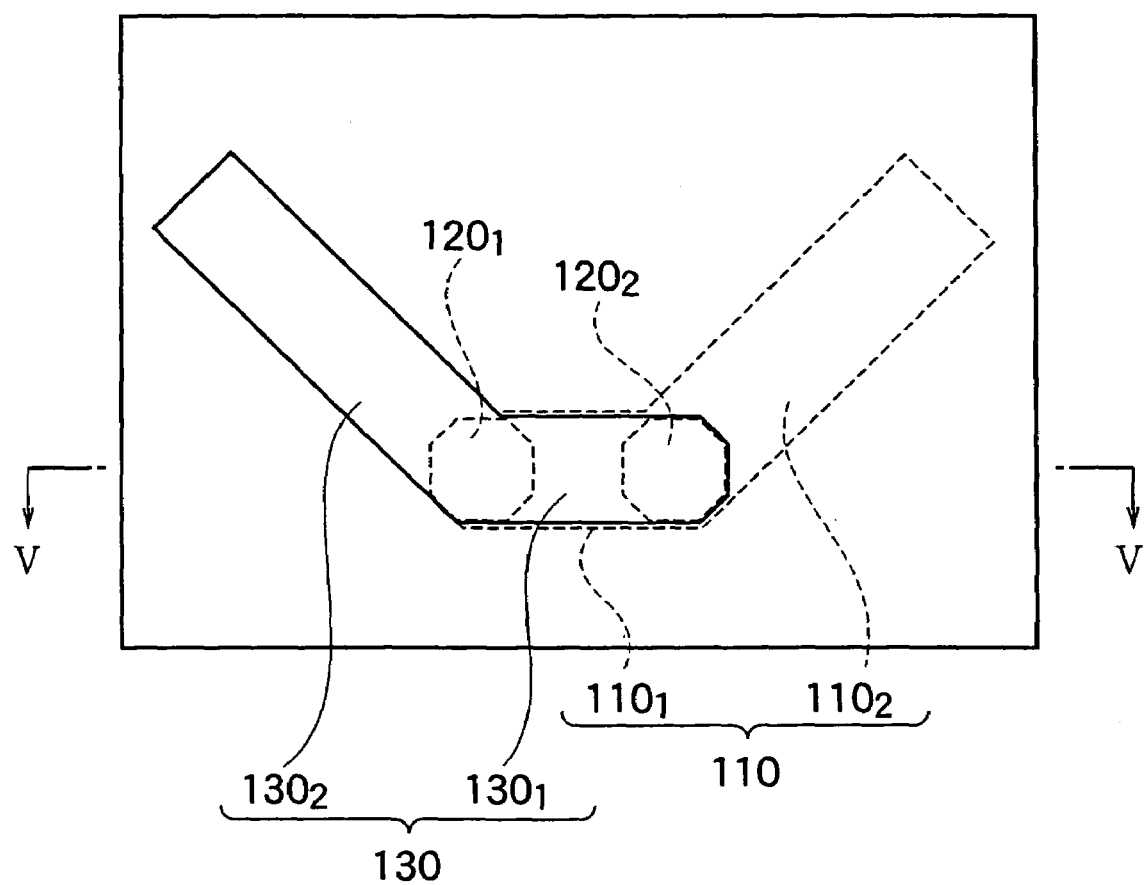
FIG. 58 is taken on line V—V in FIG. 57.

(d) As shown in FIG. 56, a conductive thin film 99 composed of Al or the like is deposited on the (k+1)-th interlayer dielectric 95 by spattering, evaporation, or the like. Furthermore, a photoresist film 104 is deposited on the conductive thin film 99. Subsequently, the photoresist film 104 is patterned by using the third reticle 82b shown in FIG. 44. The conductive thin film 99 is selectively removed by RIE using the patterned photoresist film 104 as a mask to form the (k+1)-th wiring 130 including the (k+1)-th termination region $130_1$ and the (k+1) line part $130_2$ as shown in the cross-sectional view of FIG. 57 and the plan view of FIG. 58. Subsequently, the (k+2)-th interlayer dielectric 97 is deposited on the (k+1)-th interlayer dielectric 95 by CVD, and then the surface thereof is planarized by CMP or the like.

The semiconductor IC according to the second embodiment of the present invention is completed using the above steps. With the semiconductor IC according to the second embodiment of the present invention, the plurality of via plugs $120_1$ and $120_2$ are arranged in the overlap portion of wiring lines of the wiring layers (k-th wiring 110 and (k+1)-th wiring 130), including a wiring line diagonally arranged at an "obtuse" angle clockwise or counterclockwise with respect to another wiring line. Therefore, defects of vias due to the shortening of wiring lines are less likely to be created than in the case where via patterns are arranged at intersections of wiring lines intersecting at 90 degrees. It is also possible to manufacture a highly reliable semiconductor IC. The via plugs $120_1$ and $120_2$ are replaced with those of the optimal vias of size by taking into account the relationship with vias located therearound. Accordingly, it is possible to provide a semiconductor IC with increased reliability, in which defects due to insufficient exposure are less likely to occur.

(Third Embodiment)

-Computer Implemented Design System-

Figure 59:
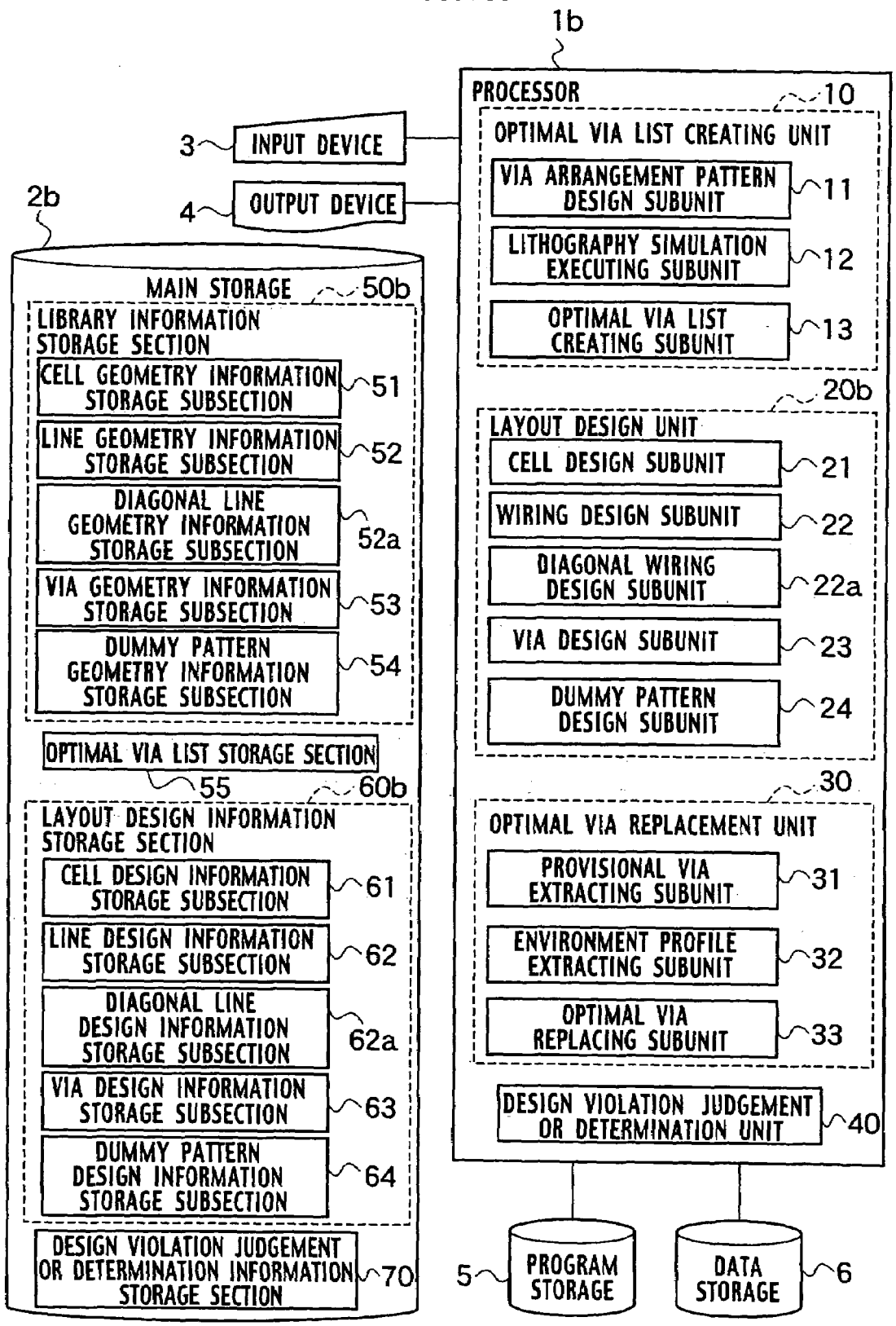
FIG. 59 is a block diagram illustrating the computer implemented design system according to a third embodiment of the present invention.

A computer implemented design system according to a third embodiment of the present invention is a computer system including the input device 3, a processor (CPU) 1b, the output device 4, a main storage 2b, the program storage 5, and the data storage 6 as shown in FIG. 59. The main storage 2b, the input device 3, the output device 4, the program storage 5, and the data storage 6 are individually connected to the CPU 1b. The CPU 1b includes the optimal via list creating unit 10, a layout design unit 20b, the optimal via replacement unit 30, and the design violation judging or determination unit 40.

Figure 60A:
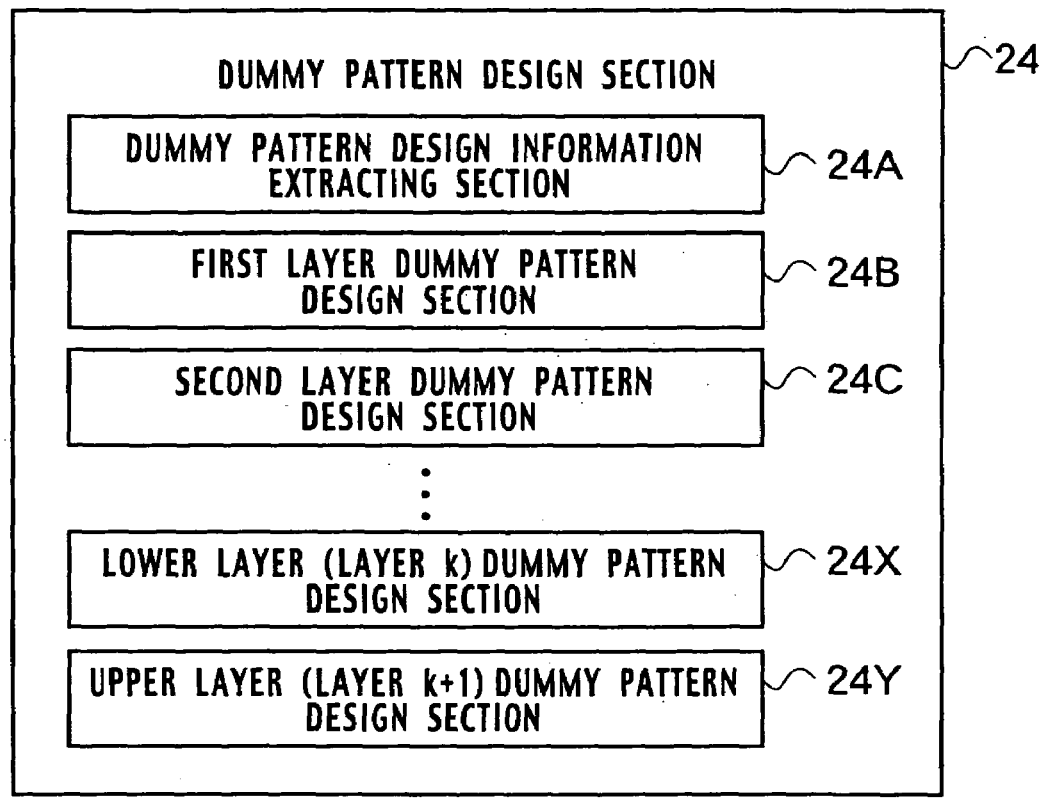
FIG. 60A is a block diagram illustrating a dummy pattern design subunit as shown in FIG. 59.

The layout design unit 20b includes the cell design subunit 21, the wiring design subunit 22, the diagonal wiring design subunit 22a, the via design subunit 23, and a dummy pattern design subunit 24. As shown in FIG. 60A, the dummy pattern design subunit 24 further includes a dummy pattern design information extracting section 24A, a first layer dummy pattern design section 24B, a second layer dummy pattern design section 24c. . . , a lower layer (layer k) dummy pattern design section 24X, and an upper layer (layer k+1) dummy pattern design section 24Y.

Figure 64:
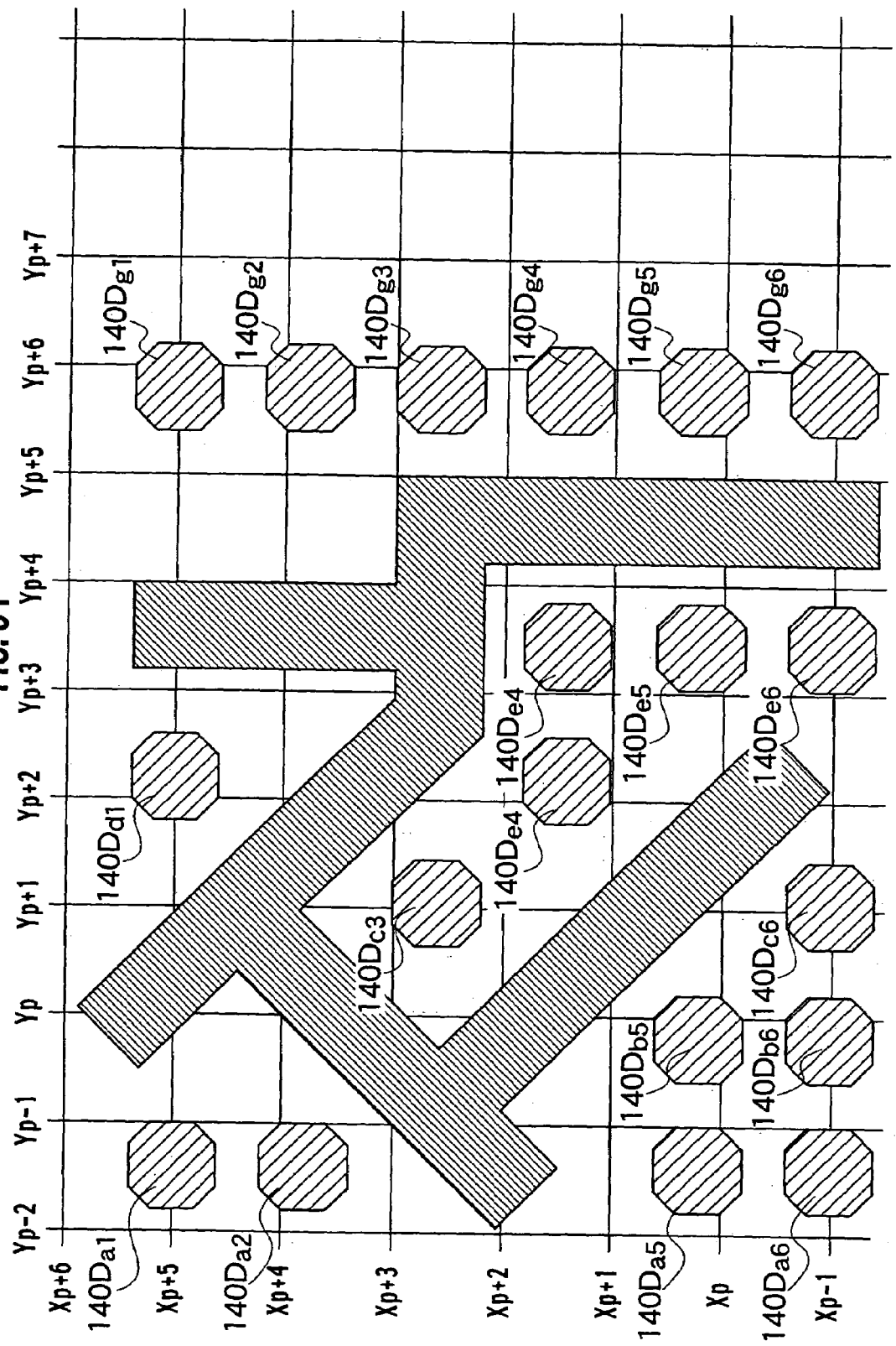

The dummy pattern design information extracting section 24A extracts necessary information such as geometry information and design information of dummy patterns from the main storage 2b. As shown in FIG. 64, the first layer, second layer . . . , lower layer (layer k), and upper layer (k+1), the dummy pattern design sections 24B, 24C . . . , 24X, and 24Y arrange octagon dummy patterns $140D_{a1}$, $140D_{a2}$ . . . , $140D_{g6}$ . . . on the same plane as the first wiring 110D.

Figure 60B:
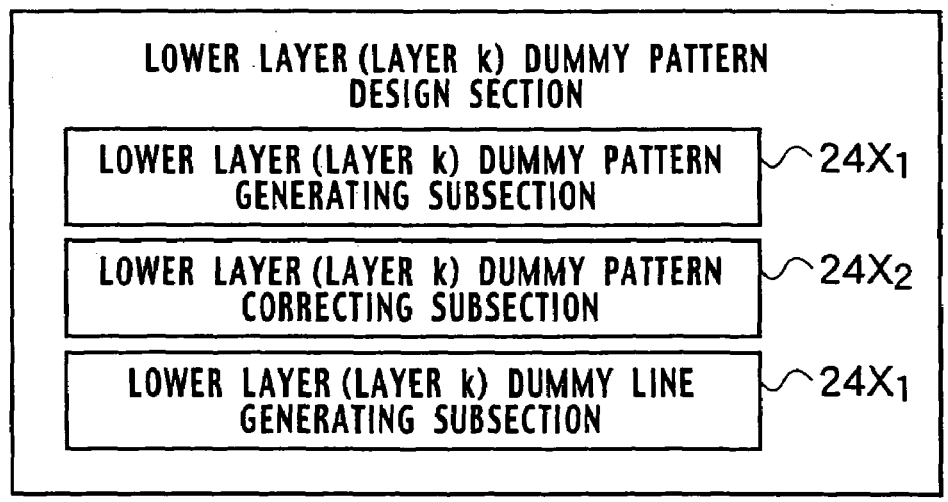
FIG. 60B is a block diagram illustrating a lower layer (layer k) dummy pattern design section as shown in FIG. 60A.
Figure 62:
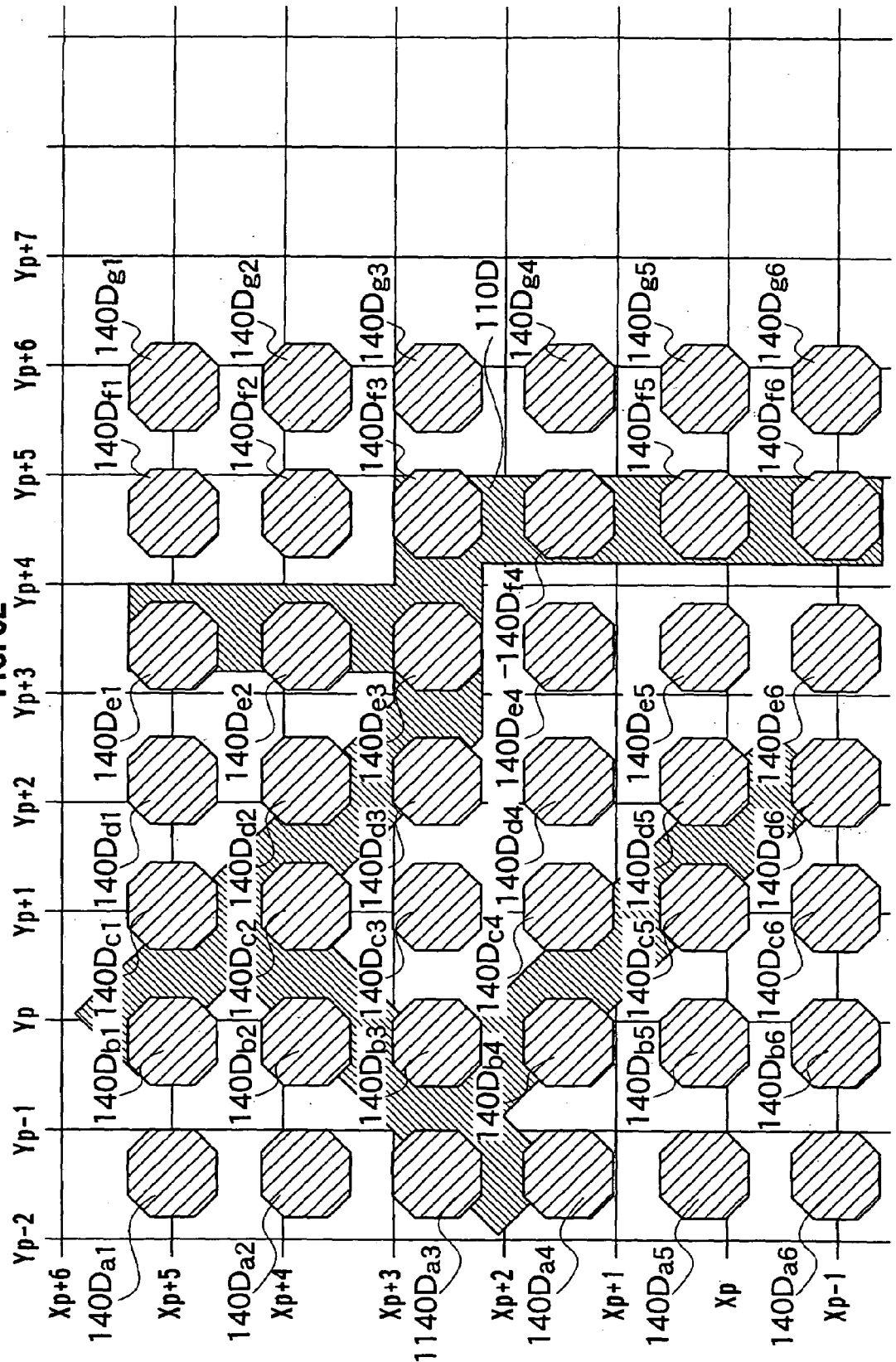
Figure 63:
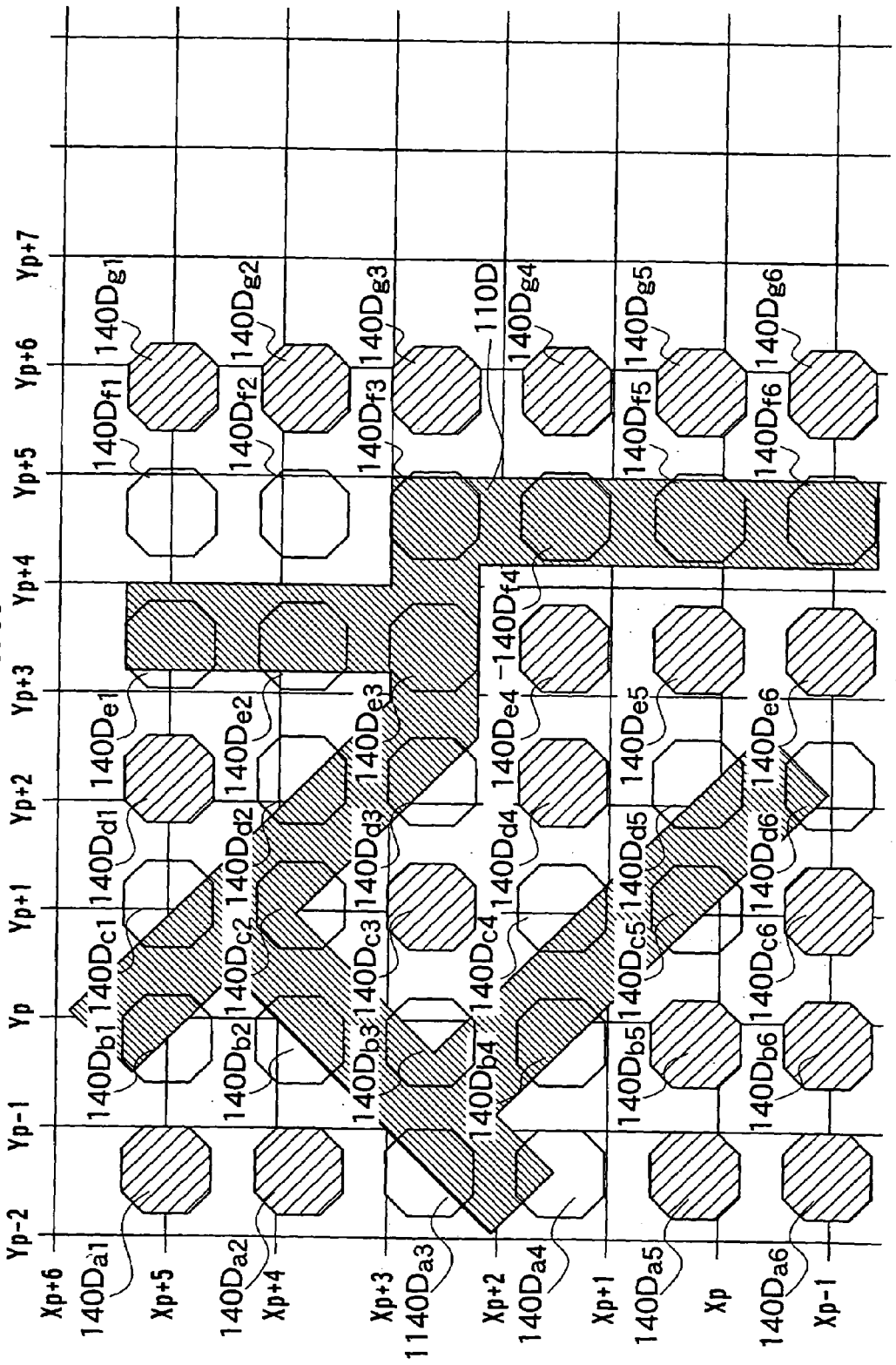
Figure 65:
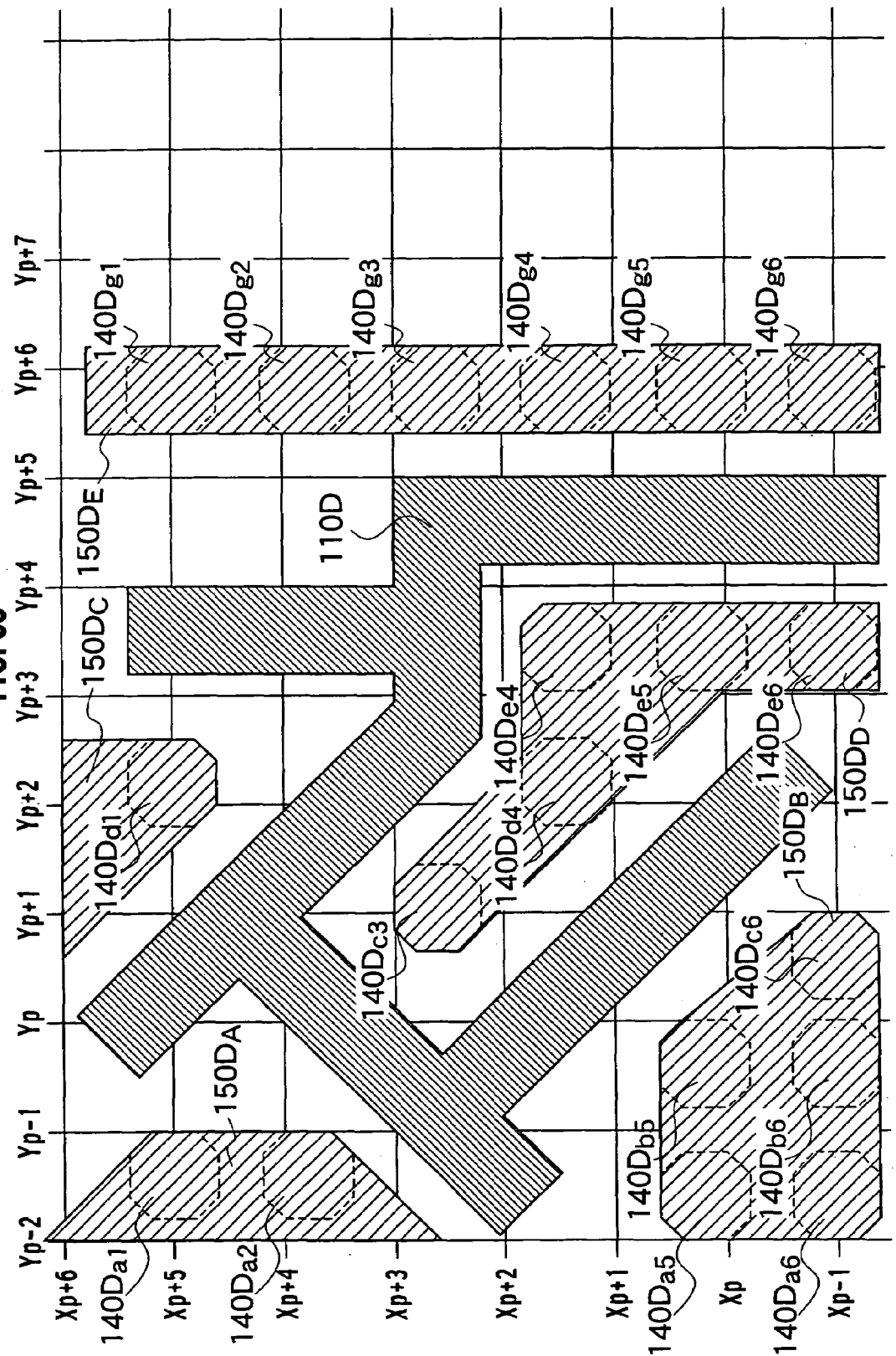

As shown in FIG. 60B, the lower layer (layer k) dummy pattern design section 24X includes a lower layer (layer k) dummy pattern generating subsection $24X_1$, a lower layer (layer k) dummy pattern correcting subsection $24X_2$, and a lower layer (layer k) dummy line generating subsection $24X_3$. The lower layer (layer k) dummy pattern generating subsection $24X_1$ generates the octagon dummy patterns $140D_{a1}, 140D_{a2} \ldots, 140D_{g6} \ldots$ in an array above the first wiring 110D arranged on the layout virtually set in the memory within the semiconductor IC device as shown in FIG. 62. The lower layer (layer k) dummy pattern correcting subsection $24X_2$ extracts dummy patterns $140D_{a3}, 140D_{a4} \ldots, 140D_{f6} \ldots$, and the like causing design violation among the octagon dummy patterns $140D_{a1}, 140D_{a2} \ldots, 140D_{g6} \ldots$ and deletes the same from the layout. As shown in FIG. 65, the lower layer (layer k) dummy line generating subsection $24X_3$ connects the dummy patterns $140D_{a1}, 140D_{a2} \ldots, 140D_{g6} \ldots$ adjacent to each other and arranges dummy wiring lines $140D_A, 140D_B \ldots, 140D_D \ldots$.

The main storage 2b includes a library information storage section 50b, the optimal via list storage section 55, a layout design information storage section 60b, and the design violation judgment or determination information storage section 70. The library information storage section 50b includes the cell geometry information storage subsection 51, the line geometry information storage subsection 52, the diagonal line geometry information storage subsection 52a, the via geometry information storage subsection 53, and a dummy pattern geometry information storage subsection 54 and stores geometry information for cells, wiring lines, vias, and dummy patterns necessary for layout design.

The layout design information storage section 60b includes the cell design information storage subsection 61, the line design information storage subsection 62, the diagonal line design information storage subsection 62a, the via design information storage subsection 63, and a dummy pattern design information storage subsection 64 and stores basic design information for cells, wiring lines, vias, and dummy patterns necessary for layout design. Other members are the same as those of the computer implemented design system shown in FIG. 29, and the redundant description is omitted.

Figure 66:
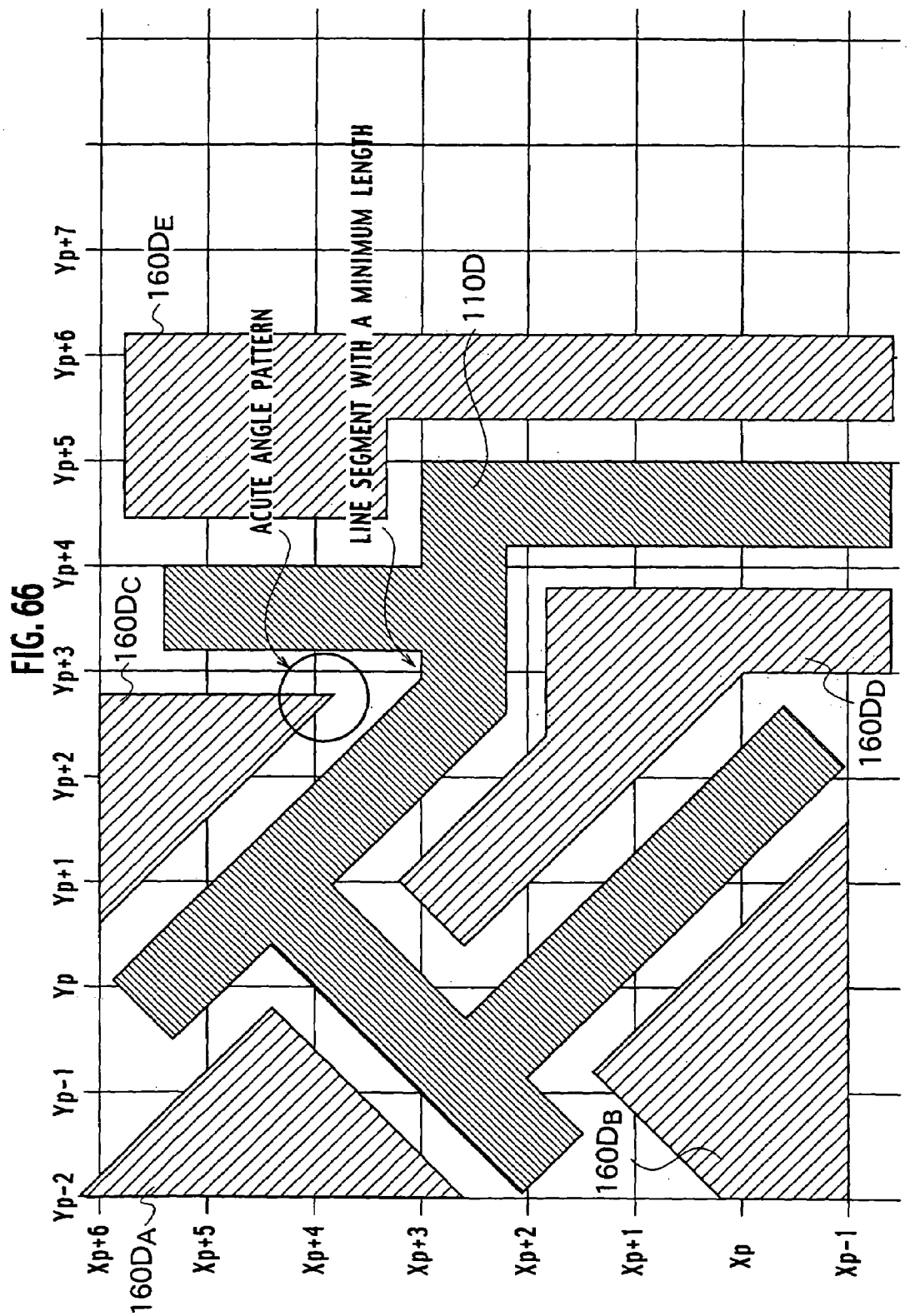
FIG. 66 is a plane view illustrating comparative examples according to the third embodiment of the present invention.

More apparent from the following description of the design method of the computer implemented design system is, with the computer implemented design system according to the third embodiment, the dummy pattern design subunit 24 arranges the octagon dummy patterns $140D_{a1}, 140D_{a2} \ldots, 140D_{g6} \ldots$ on the same layer as the first wiring 110D, which is the k-th layer wiring. Therefore, the distribution of pattern density is uniform in the k-th wiring layer, thus facilitating the planarization of an interlayer dielectric deposited thereon. Moreover, dummy wiring lines $140D_A, 140D_B \ldots, 140D_D \ldots$ are formed by connecting the octagon dummy patterns $140D_{a1}, 140D_{a2} \ldots, 140D_{g6} \ldots$. Accordingly, "acute-angle pattern", which has occurred in early techniques, does not occur in the vicinity of a line segment, with a minimum length, when arranging a dummy pattern or a dummy wiring line on the wiring layer including diagonal figures as shown in FIG. 66. Therefore, it is possible to provide a semiconductor IC using a layout that has few design violations corrected.

-Computer Implemented Design Method-

Next, a description will be given of a computer implemented design system according to the third embodiment with reference to a flowchart of FIG. 71.

Figure 71:
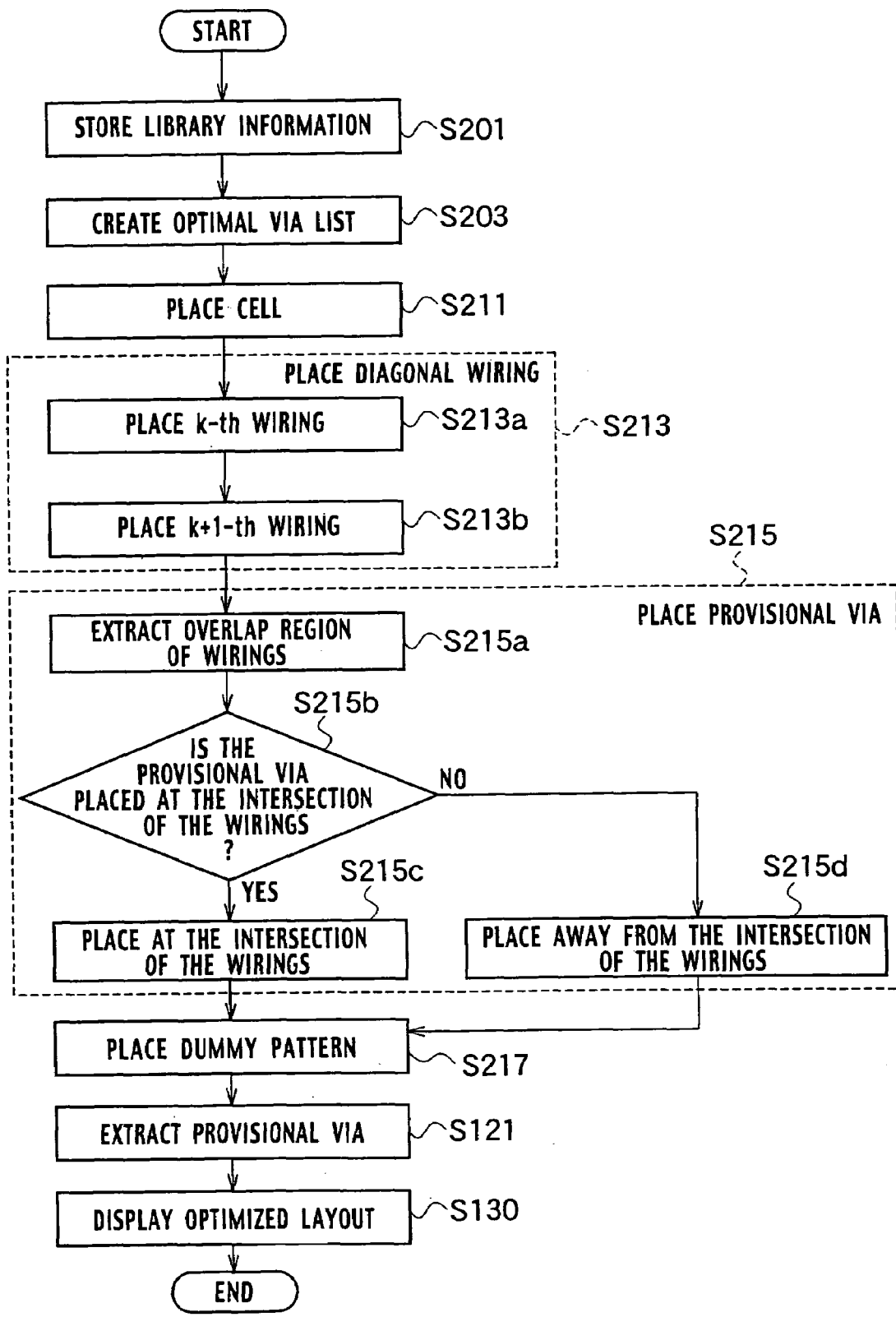
FIG. 71 is a flowchart illustrating an example of the computer implemented design method according to the third embodiment of the present invention.

(a) In step S201 of FIG. 71, the cell geometry information in which various types of geometry information of logical cells, function blocks and the like are recorded is registered in the cell geometry information storage subsection 51 through the input device 3 as the library information necessary for layout design. The line geometry information in which various types of geometry information such as geometries and sizes of wiring line patterns are recorded is registered in the line geometry information storage subsection 52 through the input device 3. The diagonal line geometry information in which various types of geometry information such as geometries and sizes of diagonal wiring line patterns are recorded is registered in the diagonal line geometry information storage subsection 52a through the input device 3. The via geometry information in which various types of geometry information of square vias, rectangle vias, polygon vias, and the like are recorded is registered in the via geometry information storage subsection 53 through the input device 3. The dummy pattern geometry information in which geometry information of octagon dummy patterns is recorded is stored in the dummy pattern geometry information storage subsection 54 through the input device 3.

(b) In step S203, the optimal via list creating unit 10 reads the via geometry information and design information stored in the via geometry information storage subsection 53 and the via design information storage subsection 63 and creates the optimal via list according to the flowchart shown in FIG. 15. Herein, the optimal via list defines sizes and geometries optimal according to the respective arrangement environments of all provisional vias which can be designed by the layout design unit 20b.

(c) In step S211, the cell design subunit 21 extracts necessary cell geometry information from the cell geometry information storage subsection 51 and reads the design information stored in the cell design information storage subsection 61. The cell design subunit 21 then designs logical cells such as I/O cells, basic cells, and macro cells and basic blocks on the semiconductor chip area virtually set in the memory space of the computer implemented design system. Subsequently, in the step S213, the diagonal wiring design subunit 22a extracts necessary diagonal line geometry information from the diagonal line geometry information storage subsection 52a and reads the design information stored in the diagonal line design information storage subsection 62a. The diagonal wiring design subunit 22a then arranges power supply lines and clock lines to be arranged on the semiconductor chip area and signal lines and the like to be arranged in interlayer dielectrics above the semiconductor chip area.

(d) Subsequently, in step S215, the via design subunit 23 extracts necessary geometry information from the via geometry information storage subsection 53 and reads the design information stored in the via design information storage subsection 63 and information on the wiring lines arranged in the step S213. The via design subunit 23 then arranges the provisional vias $120D_1$ and $120D_2$ connecting the first wiring 110D and the second wiring 130D. Subsequently, instep S217, the dummy pattern design subunit 24 arranges dummy patterns or lines on the wiring layer in which the wiring lines are arranged in the step S213 according to the later-described flowchart shown in FIG. 72, and the procedure proceeds to the step S121. Steps after the step S121 are the same as those of the flowchart of FIG. 14, and the description thereof is omitted.

Next, a description will be given of the method of designing dummy patterns according to the third embodiment with reference to the flowchart shown in FIG. 72.

Figure 61:
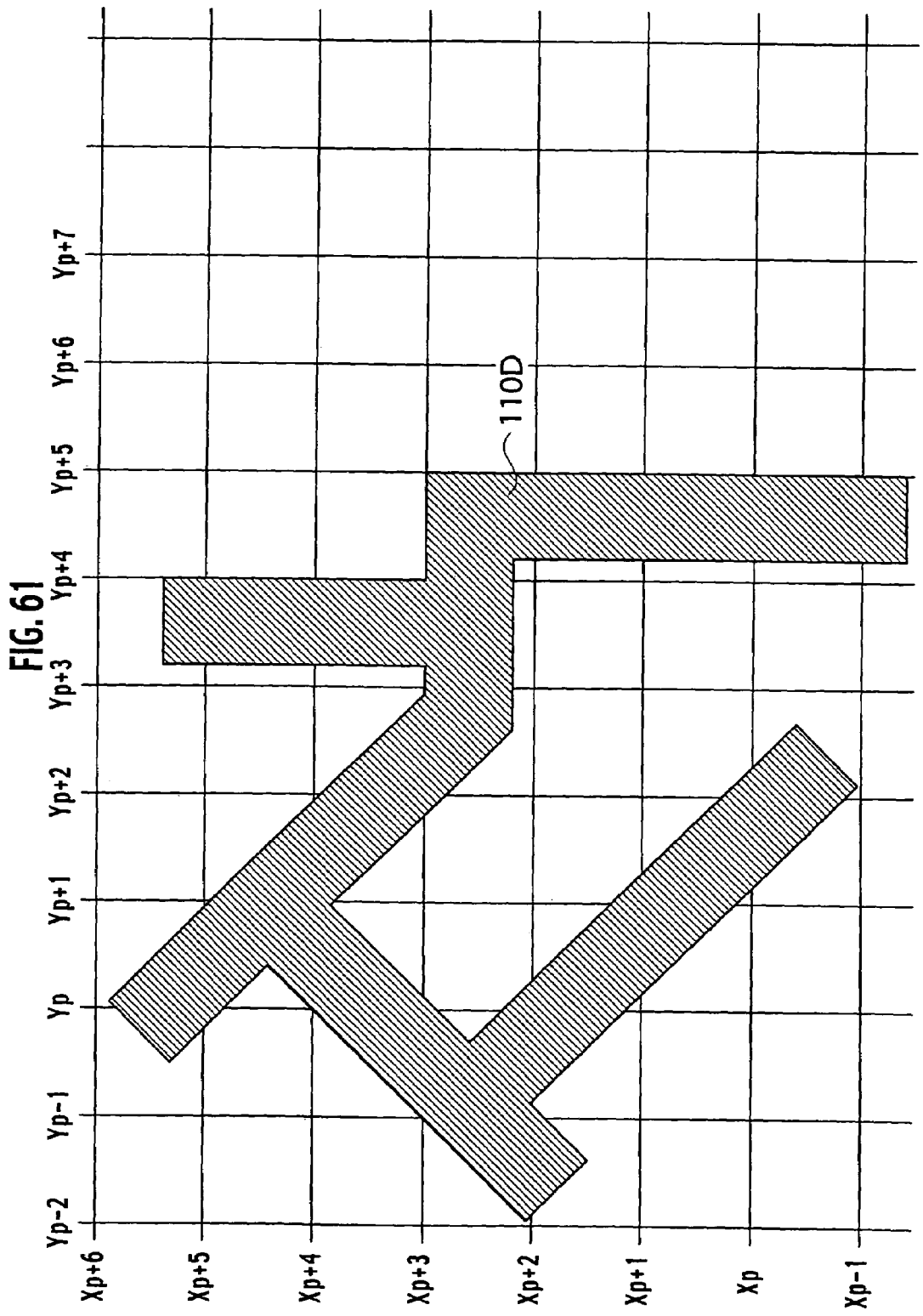
FIGS. 61 to 65 are plane views illustrating an example of the dummy pattern design method according to the third embodiment of the present invention.
Figure 72:
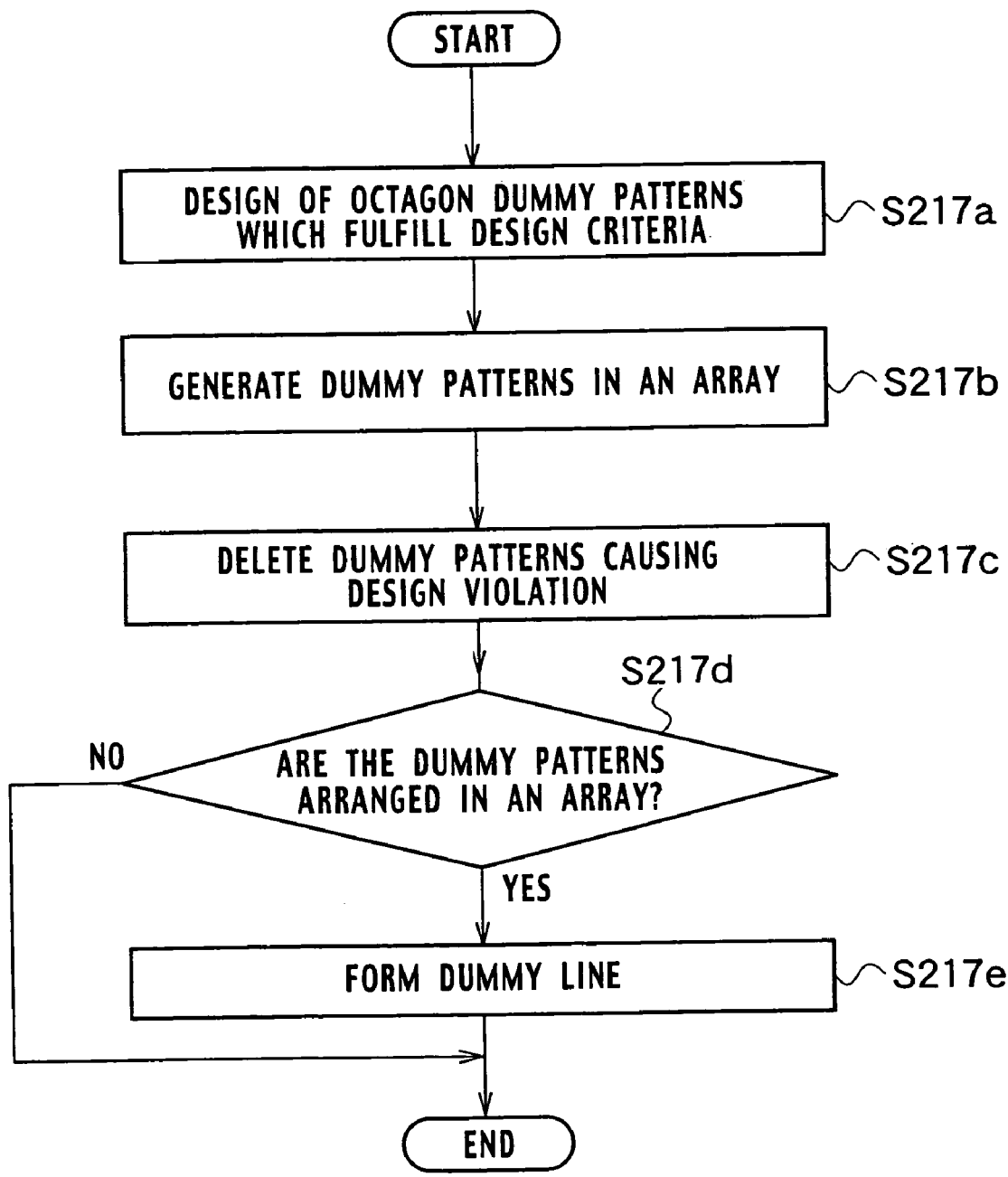
FIG. 72 is a flowchart illustrating the dummy pattern design method as shown in step S217 in FIG. 71.

(a) In step S217a of FIG. 72, the dummy pattern design information extracting section 24A of FIG. 60 extracts layout information of wiring lines arranged on the layout, as shown in FIG. 61. The dummy pattern design information extracting section 24A then extracts geometry information and design information of octagon dummy patterns which fulfill design criteria for the extracted layout information from the dummy pattern geometry information storage subsection 54 and the dummy pattern design information storage subsection 64 of FIG. 59, respectively.

(b) In step S217b, the lower layer (layer k) dummy pattern generating subsection $24X_1$ generates the octagon dummy patterns $140D_{a1}$, $140D_{a2}$ ..., $140D_{g6}$, ... in an array on the layout based on the grid lines $X_{p-1}$, $X_p$, $X_{p+1}$, ... and the grid lines $Y_{p-2}$, $Y_{p-1}$, $Y_p$ ... formed on the layout as shown in FIG. 62. In step S217c, the lower layer (layer k) dummy pattern correcting subsection $24X_2$ of FIG. 60B deletes dummy patterns causing design violation, and specifically, dummy patterns $140D_{a3}$, $140D_{a4}$, $140D_{b1}$ to $140D_{b4}$, $140D_{c1}$, $140D_{c2}$, $140D_{c3}$, $140D_{c4}$, $140D_{d2}$, $140D_{d3}$, $140D_{d5}$, $140D_{d6}$, $140D_{e1}$ to $140D_{e3}$, and $140D_{f1}$ to $140D_{f6}$. The layout shown in FIG. 64 is thus obtained.

(c) In step S217d, the lower layer (layer k) dummy line generating subsection $24X_3$ reads the design information previously inputted by the input device 3 and judges whether the dummy patterns are arranged in an array. In the case where the arrangement of the dummy patterns $140D_{a1}$, $140D_{a2}$ ..., $140D_g$ ... is in an array, the operation is terminated. However, in the case where the arrangement of the dummy patterns is not in an array, the procedure proceeds to step S217e. As shown in FIG. 65, the lower layer (layer k) dummy line generating subsection $24X_3$ connects the adjacent dummy patterns $140D_{a1}$, $140D_{a2}$ ..., $140D_{g6}$ ... to each other to form the dummy wiring lines $150D_A$, $150D_B$ ..., $150D_D$ ....

(d) In FIG. 65, the dummy line $150D_A$ connecting the dummy patterns $140D_{a1}$ and $140D_{a2}$ is formed. The dummy line $150D_B$ connecting the dummy patterns $140D_{a5}$, $140D_{a6}$, $140D_{b5}$, $140D_{b6}$, and $140D_{b6}$ is formed. The dummy line $150D_C$ connecting the dummy patterns $140D_{c1}$ and a not-shown dummy pattern is formed. The dummy line $150D_D$ connecting the dummy patterns $140D_{c3}$, $140D_{d4}$, $140D_{e4}$, $140D_{e5}$, and $140D_{e6}$ is formed, and the dummy line $150D_E$ connecting the dummy patterns $140D_{g1}$ to $140D_{g6}$ is formed.

The computer implemented design method according to the third embodiment can be implemented by the above steps. With the computer implemented design method according to the third embodiment, the dummy pattern design subunit 24 arranges the octagon dummy patterns $140D_{a1}$, $140D_{a2}$ ..., $140D_{g6}$ ... in the same layer as the first wiring 110D which is the wiring of the k-th layer. Therefore, the distribution of pattern density of the k-th wiring layer is uniform, thus facilitating the planarization of an interlayer dielectric deposited thereon. Moreover, the dummy wiring lines $140D_A$, $140D_B$ ..., $140D_D$ ... are formed by connecting the octagon dummy patterns $140D_{a1}$, $140D_{a2}$ ..., $140D_{g6}$ .... Accordingly, "acute angle pattern", which has occurred in early techniques, does not occur in the vicinity of a line segment with a minimum length, arranging dummy patterns or lines in the wiring layer including diagonal figures, as shown in FIG. 66. Therefore, it is possible to provide a semiconductor IC using a layout having few design violations corrected.

Figure 67:
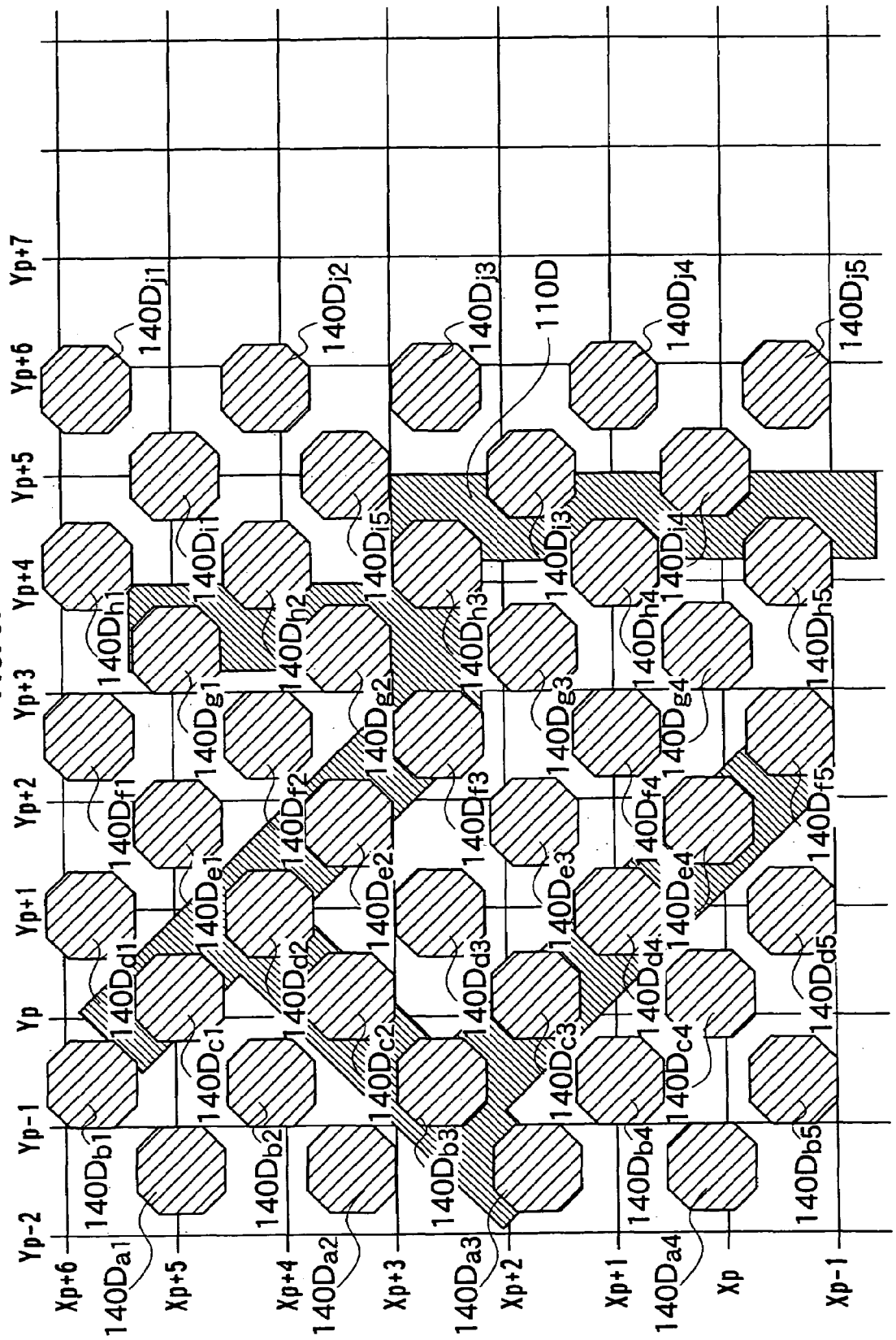
FIGS. 67 to 70 are plane views illustrating another dummy pattern design method according to the third embodiment of the present invention.
Figure 68:
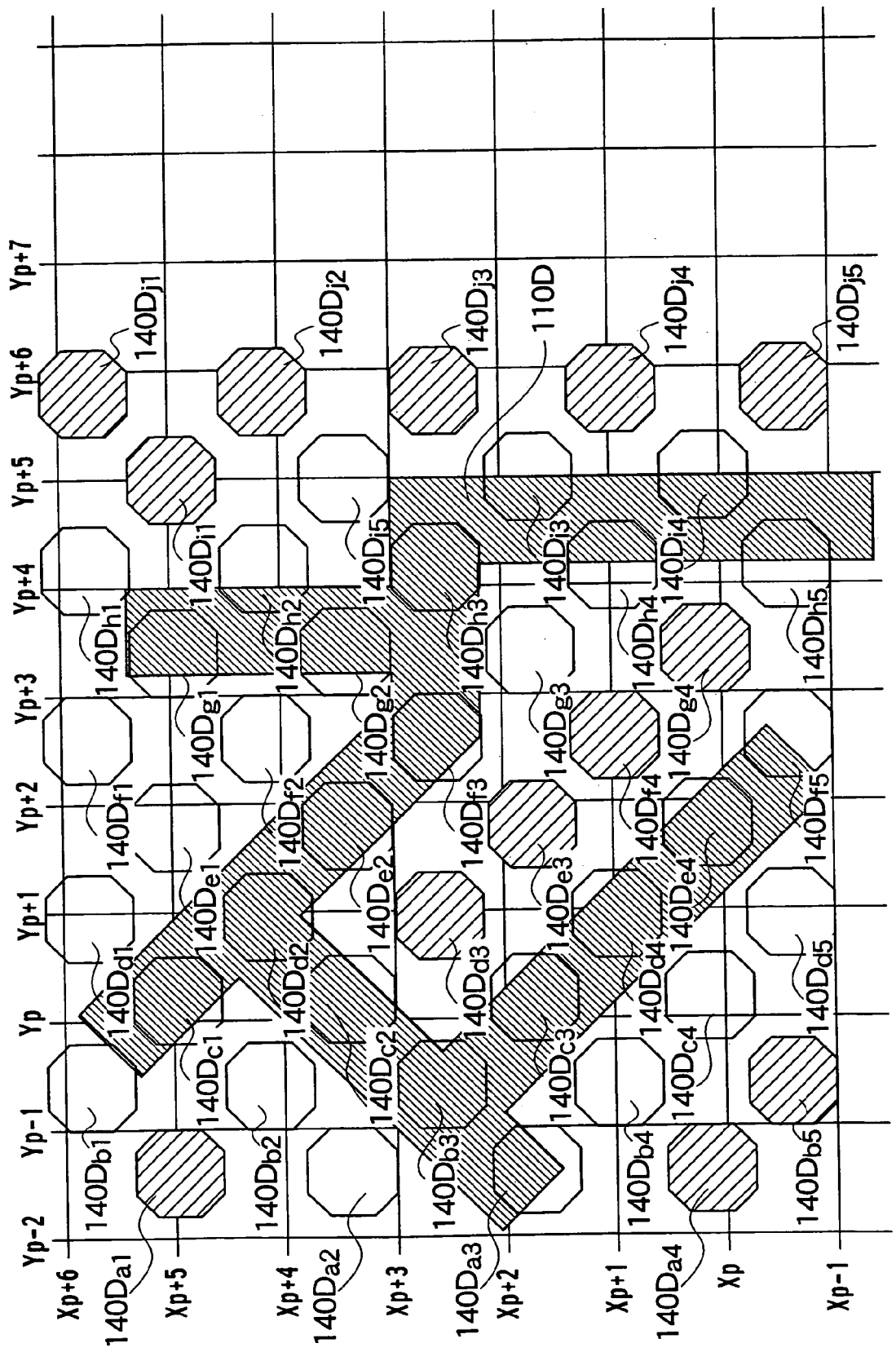
Figure 69:
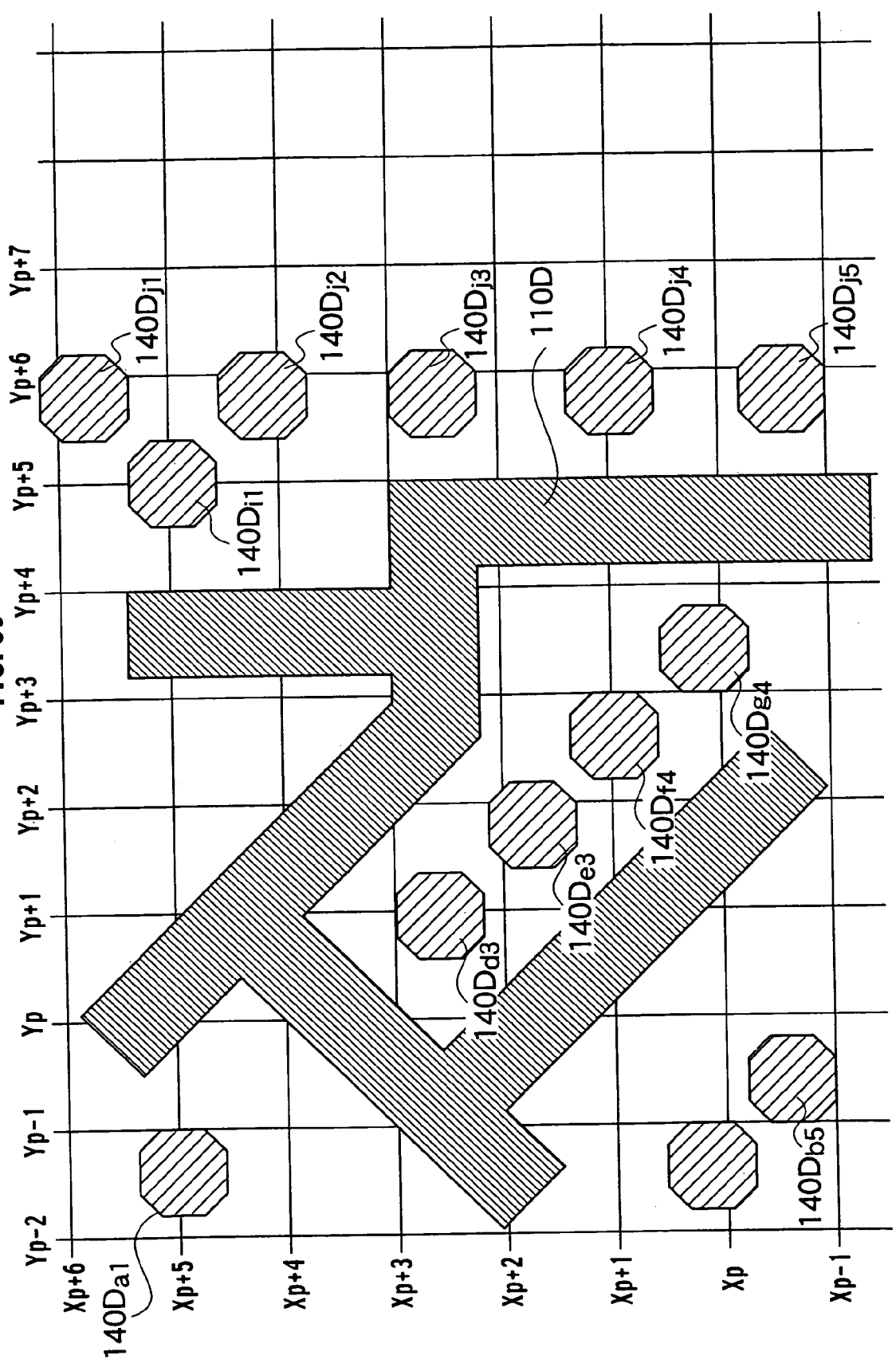
Figure 70:
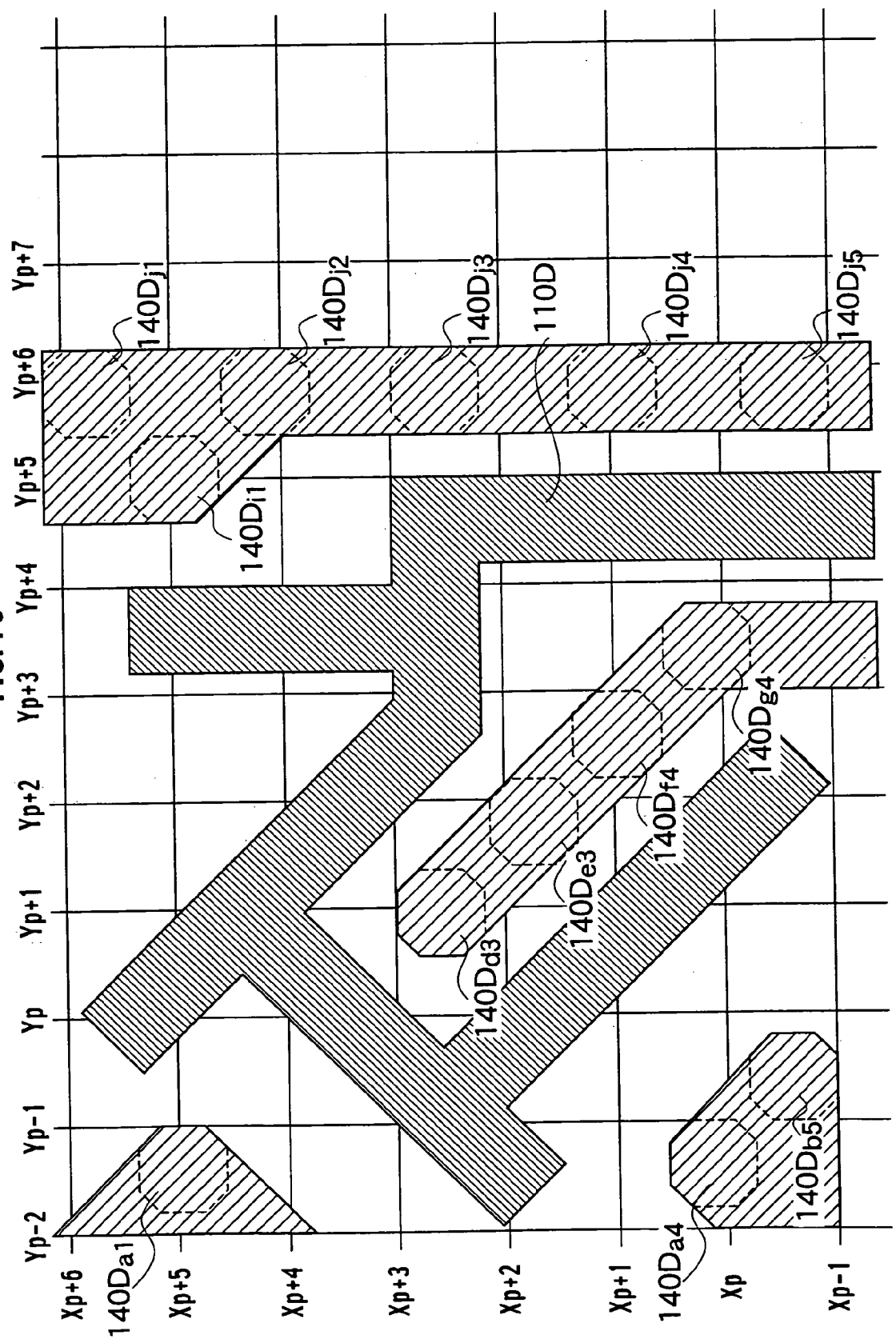

Note that the arrangement of the dummy patterns $140D_{a1}$, $140D_{a2}$ ..., $140D_{g6}$, and so on is not limited to the array fashion, but can be an arrangement as shown in FIG. 67. In this case, as shown in FIG. 68, the lower layer (layer k) dummy pattern correcting subsection $24X_2$ deletes the dummy patterns $140D_{a2}$, $140D_{a3}$, $140D_{b1}$ to $140D_{b4}$, $140D_{c1}$ to $140D_{c4}$ ..., $140D_{d1}$, $140D_{d2}$, $140D_{d4}$, $140D_{d5}$, $140D_{e1}$, $140D_{e2}$, $140D_{e4}$, $140D_{f1}$ to $140D_{f3}$, $140D_{f5}$, $140D_{g1}$ to $140D_{g3}$, $140D_{h1}$ to $140D_{h5}$, and $140D_{i2}$ to $140D_{i4}$, which create design violation. The layout shown in FIG. 69 can thus be obtained. Furthermore, as shown in FIG. 70, the surrounding dummy patterns $140D_{a1}$, $140D_{a4}$, $140D_{b5}$, $140D_{d3}$, $140D_{e3}$, $140D_{f4}$, $140D_{g4}$, $140D_{i1}$, and $140D_{j1}$ to $140D_{j5}$ may be extended to form the dummy lines $140D_A$, $140D_B$, $140D_C$, and $140D_D$.

Figure 73:
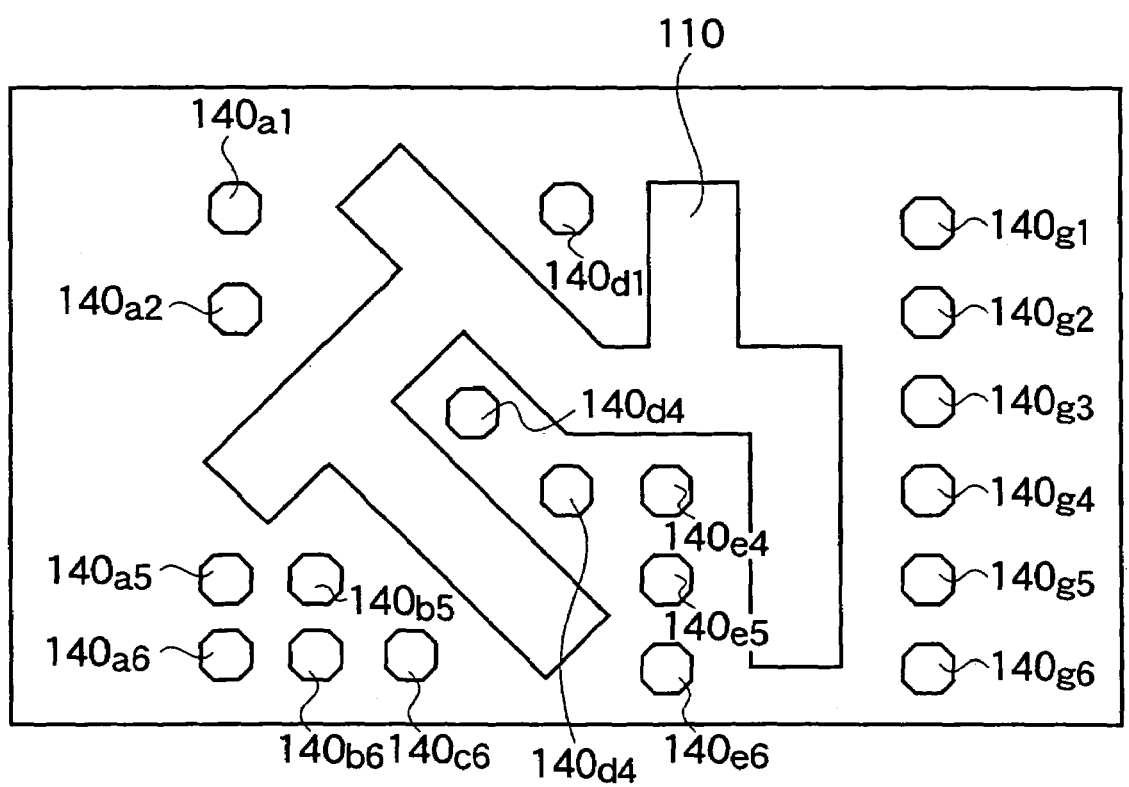
FIG. 73 is a plane view illustrating an example of the reticle set designed by the computer implemented design system according to the third embodiment of the present invention.
Figure 74:
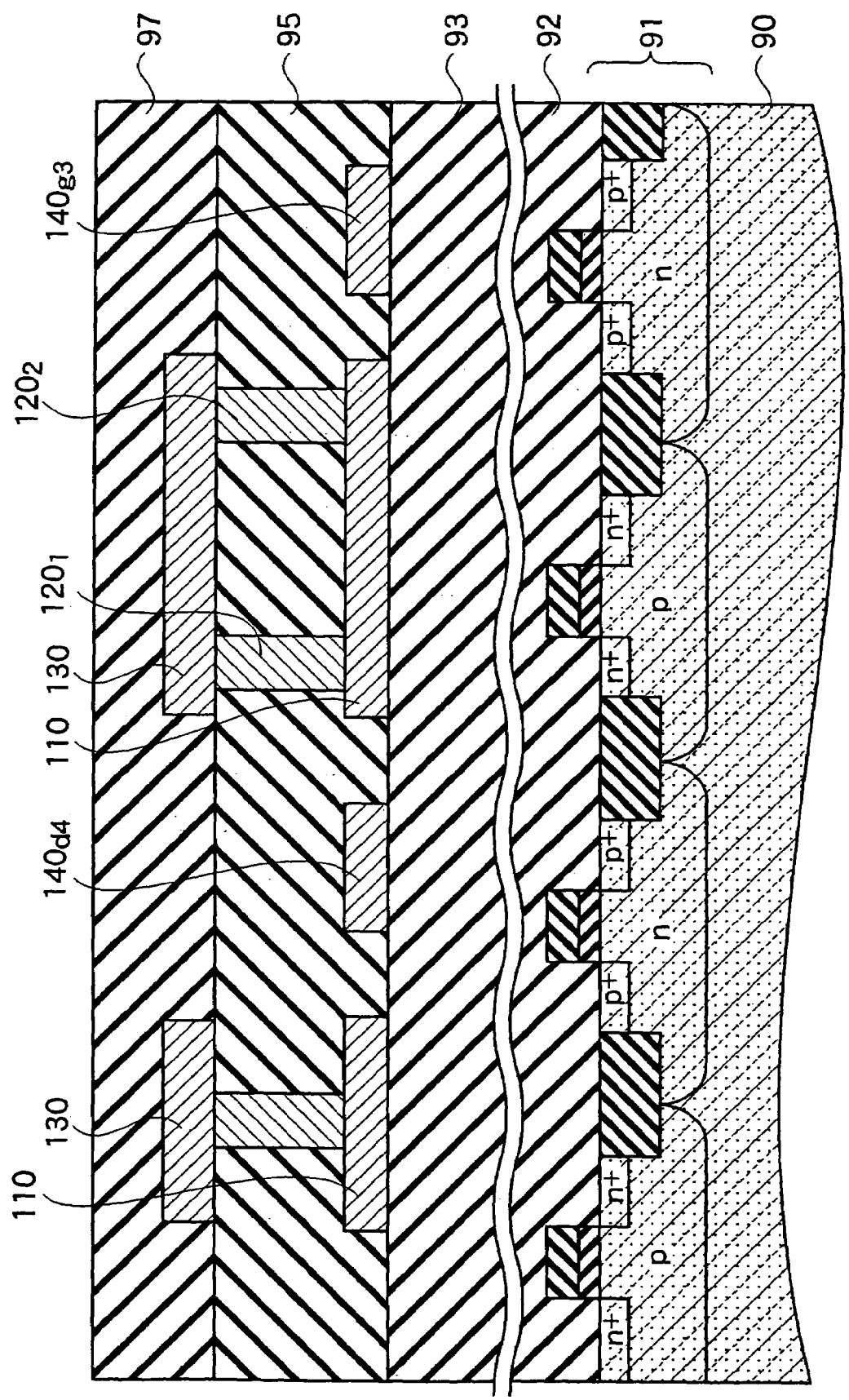
FIG. 74 is a sectional view illustrating an example of the semiconductor IC according to the third embodiment of the present invention.

FIG. 73 is an example showing a small part of a reticle 83 according to the third embodiment, and FIG. 74 shows an example of the semiconductor IC including the k-th wiring 110 and the dummy patterns $140D_{a1}$, $140D_{a2}$ ..., $140D_{g6}$ ... on the k-th interlayer dielectric 93 by using the reticle 83 shown in FIG. 73. According to the semiconductor IC shown in FIG. 74, the octagon dummy patterns $140_{d4}$ and $140_{g3}$ are included in the same layer as the k-th wiring 110. Therefore, the distribution of pattern density of the k-th wiring layer is uniformed, thus facilitating the planarization of an interlayer dielectric formed thereon. Accordingly, in the case where the semiconductor IC has a multilayer wiring structure, the semiconductor IC is manufactured by mask alignment using a projection of the reticle with octagon dummy patterns as shown in FIG. 73. Therefore, it is possible to provide a planarized semiconductor IC.

(Fourth Embodiment)

-Computer Implemented Design System-

Figure 75:
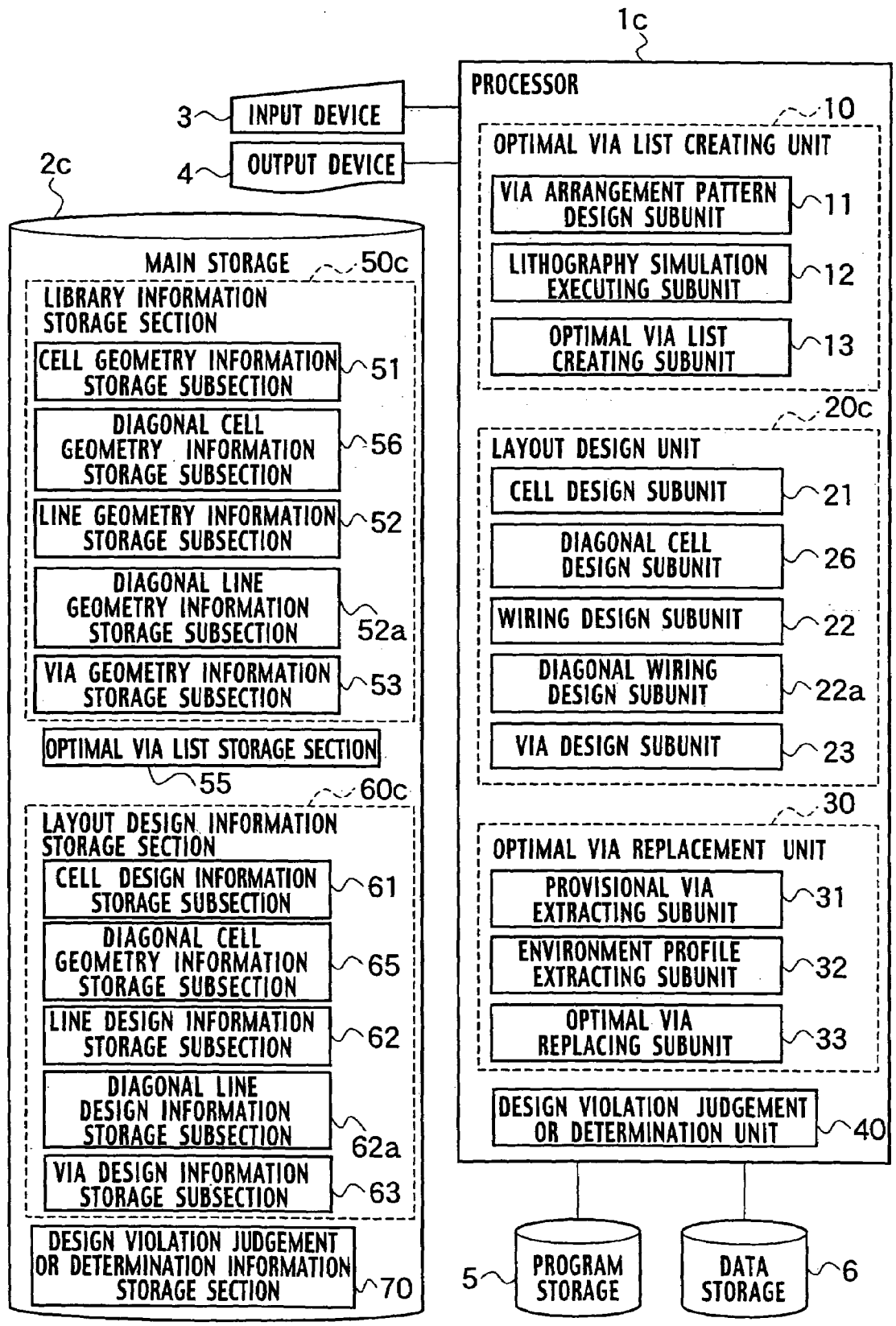
FIG. 75 is a block diagram illustrating the computer implemented design system according to a fourth embodiment of the present invention.

A computer implemented design system according to a fourth embodiment of the present invention is a computer system including the input device 3, the processor (CPU) 1c, the output device 4, a main storage 2c, the program storage 5, and a data storage 6 as shown in FIG. 75. The input device 3 accepts the input of data and instructions from an operator or the like. The CPU 1c executes various operations such as layout design. The output device 4 produces a layout result and the like. The main storage 2c stores predetermined data and the like necessary for the layout design of a semiconductor IC. The main storage 2c, the input device 3, the output device 4, the program storage 5, and the data storage 6 are individually connected to the CPU 1c.

Figure 78:
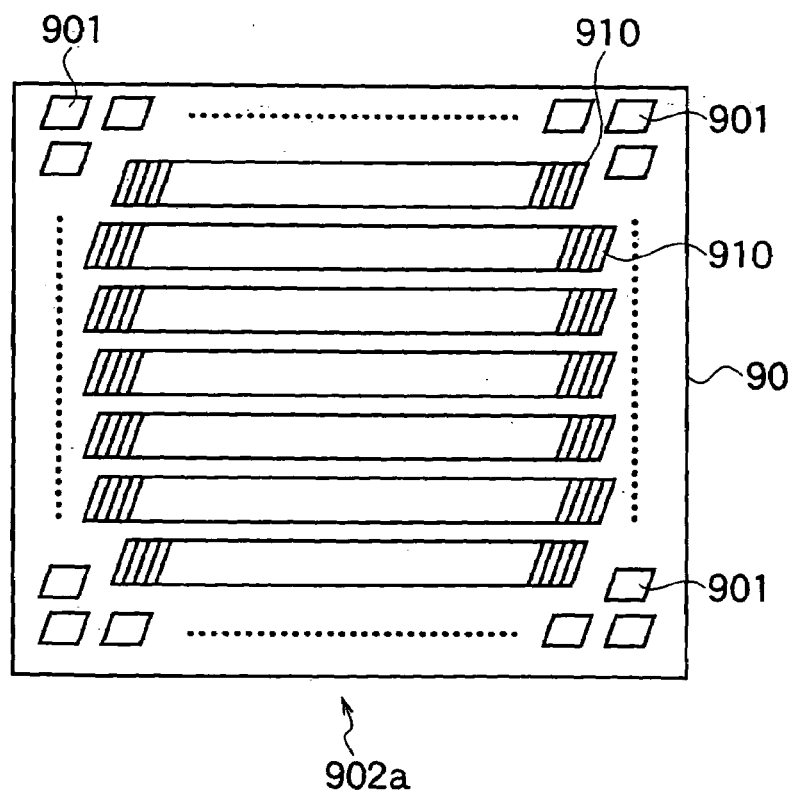
FIGS. 78 to 80 are plane views illustrating a master chip designed by the computer implemented design system according to the fourth embodiment of the present invention.
Figure 79:
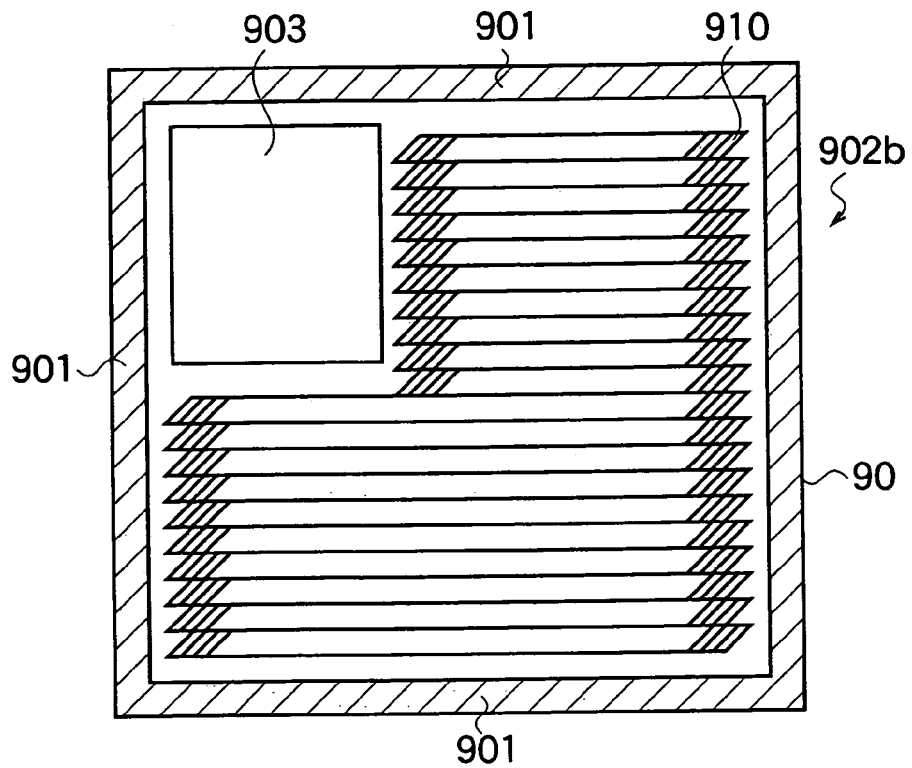
Figure 80:
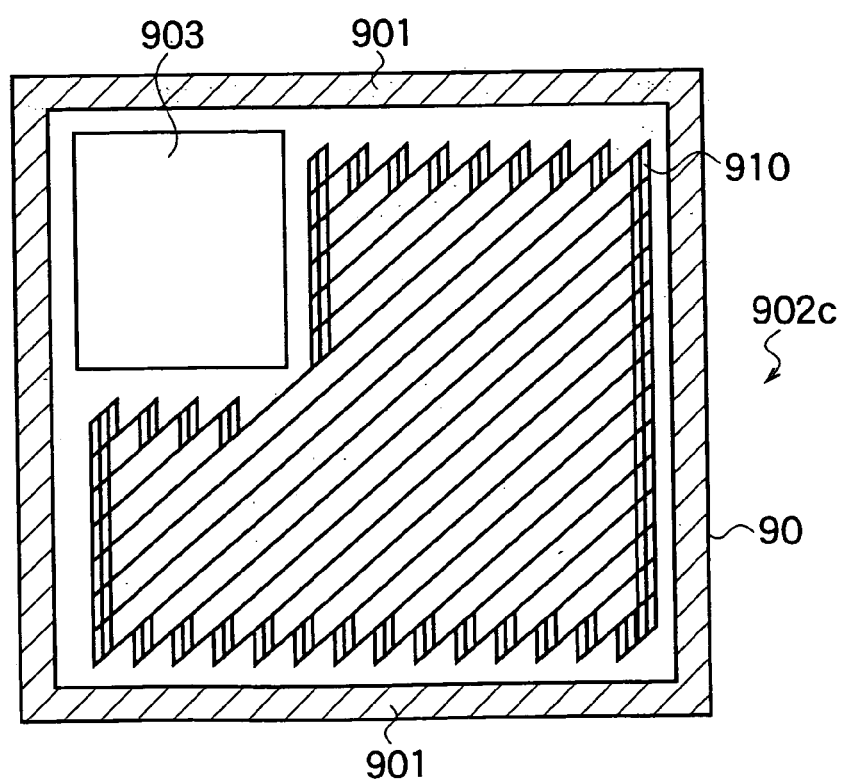

The CPU 1c includes the optimal via list creating unit 10, a layout design unit 20c, the optimal via replacement unit 30, and the design violation judging or determination unit 40. The layout design unit 20c includes the cell design subunit 21, the line design subunit 22, the diagonal line design subunit 22a, the via design subunit 23, and a diagonal cell design subunit 26. The "diagonal cell" indicates a cell with a quadrangle, and defines the geometry of the cell. It includes a pair of acute angles opposite to each other, and specifically indicates a cell with a parallelogram geometry. The diagonal cell design subunit 26 arranges logical cells and function blocks such as parallelogram I/O cells, basic cells, and macro cells in the chip area of the semiconductor IC virtually set within the memory space of the computer implemented design system to form master chips 902a to 902c as shown in FIGS. 78 to 80.

The main storage 2c includes the library information storage section 50c, the optimal via list storage section 55, a layout design information storage section 60c, and the design violation judgment or determination information storage section 70. The library information storage section 50c includes the cell geometry information storage subsection 51, a diagonal cell geometry information storage subsection 56, the line geometry information storage subsection 52, the diagonal line geometry information storage subsection 52a, and the via geometry information storage subsection 53. The diagonal cell geometry information storage subsection 56 stores geometry information necessary for designing the geometries of parallelogram I/O cells, parallelogram micro cells, and the like in addition to geometry information for designing, for example, a parallelogram basic cell 910 with an exterior angle θ of 45 degrees. The layout design information storage section 60c includes the cell design information storage section 61, a diagonal cell design information storage section 65, the line design information storage section 62, the diagonal line design information storage section 62a, the via design information storage section 63. The diagonal cell design information storage section 66 stores design information necessary for designing the master chips 902a, 902b, and 902c shown in FIGS. 78 to 80.

More apparent from the following description of the design method of the computer implemented design system is with the computer implemented design system according to the fourth embodiment, parallelogram cells are arranged in the chip region, thus facilitating design when applying diagonal wiring to the cells. Moreover, changing the cell geometry from the usual rectangle to the parallelogram increases the gate width without changing the cell width. Accordingly, the power supply density of the semiconductor IC can be increased by arranging new wiring in the increased regions.

-Computer Implemented Design Method-

Next, a description will be given of a computer implemented design method according to the fourth embodiment with reference to a flowchart of FIG. 76. The following computer implemented design method exemplifies a design method which arranges a diagonal basic cell 910 shown in FIG. 77 as the basic cell for arranging in the device forming region. Naturally, in addition to the basic cell, the I/O cell 901 may have a parallelogram geometry, and a macro cell 903 may have a parallelogram geometry.

Figure 76:
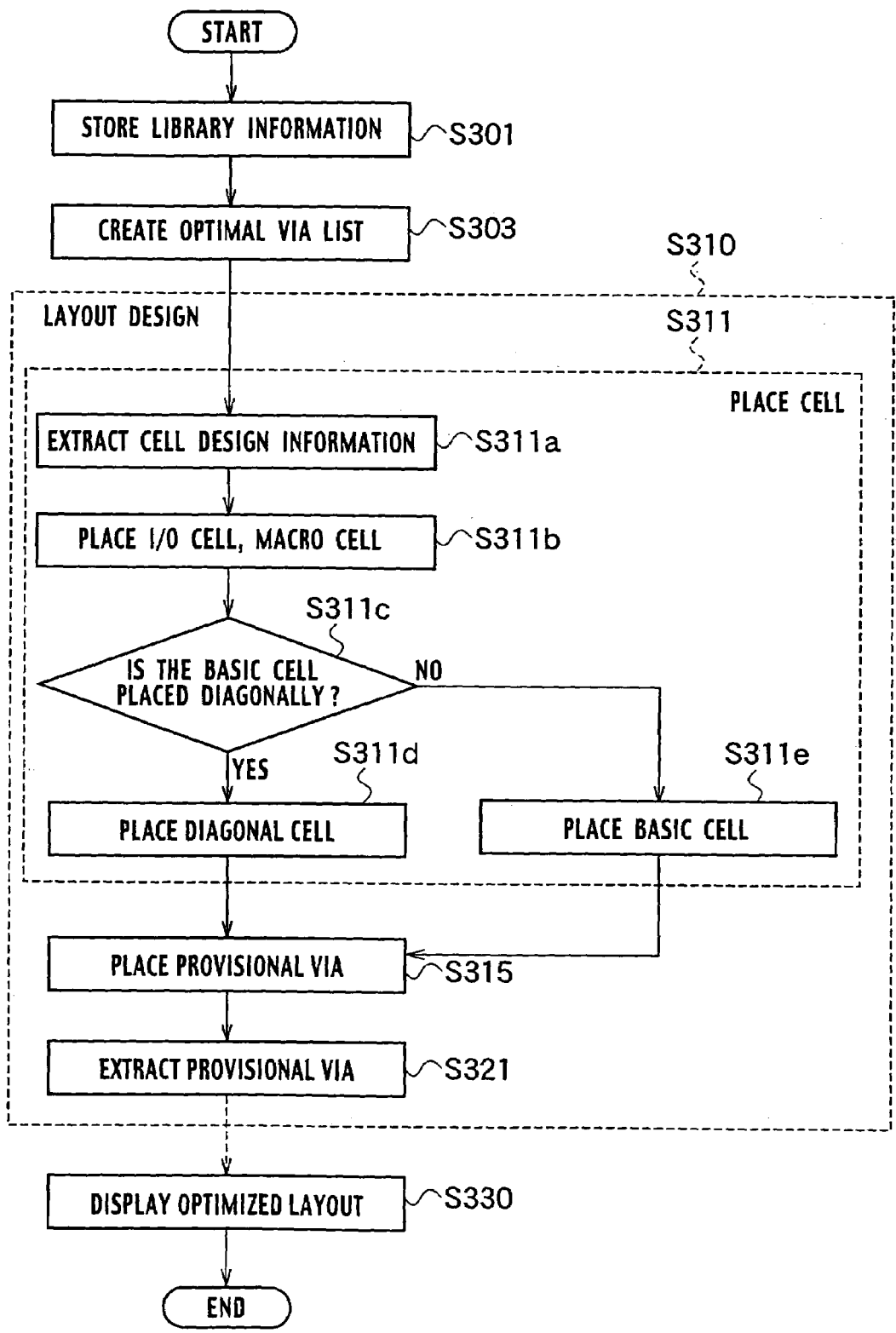
FIG. 76 is a flowchart illustrating an example of the computer implemented design method according to the fourth embodiment of the present invention.

(a) In step S301 of FIG. 76, the cell geometry information in which various types of geometry information of logical cells, function blocks, and the like are recorded is registered in the cell geometry information storage subsection 51 through the input device 3 as library information necessary for layout design. The geometry information on the diagonal cells is stored in the diagonal cell geometry information storage subsection 56 through the input device 3. The line geometry information in which various types of geometry information such as geometries and sizes of wiring line patterns are recorded is registered in the line geometry information storage subsection 52 through the input device 3. The via geometry information in which various types of geometry information of square vias, rectangle vias, polygon vias, and the like are recorded is registered in the via geometry information storage subsection 53 through the input device 3.

(b) In the step S303, the optimal via list creating unit 10 reads the via geometry information and the design information stored in the via geometry information storage subsection 53 and the via design information storage subsection 63 and creates the optimal via list according to the flowchart shown in FIG. 15. Herein, the optimal via list defines sizes and geometries optimal according to the respective arranged environments of all provisional vias which can be designed by the layout design unit 20c.

(c) The layout design is performed in step S310. Specifically, in step S311, the cell design subunit 21 arranges logical cells such as I/O cells, basic cells, and macro cells and basic blocks in the semiconductor chip area virtually set in the memory space of the computer implemented design system. First, in step S311a, the cell design subunit 21 extracts necessary cell geometry information from the cell geometry information storage subsection 51 and the diagonal cell geometry information storage subsection 56. In step S311b, the cell design subunit 21 then arranges the I/O cells 901 along the periphery of the chip area so as to surround the chip area as shown in FIG. 79. Subsequently, the cell design subunit 21 arranges a macro cell 903 in the chip region surrounded by the I/O cells 901 in the periphery thereof.

Figure 77:
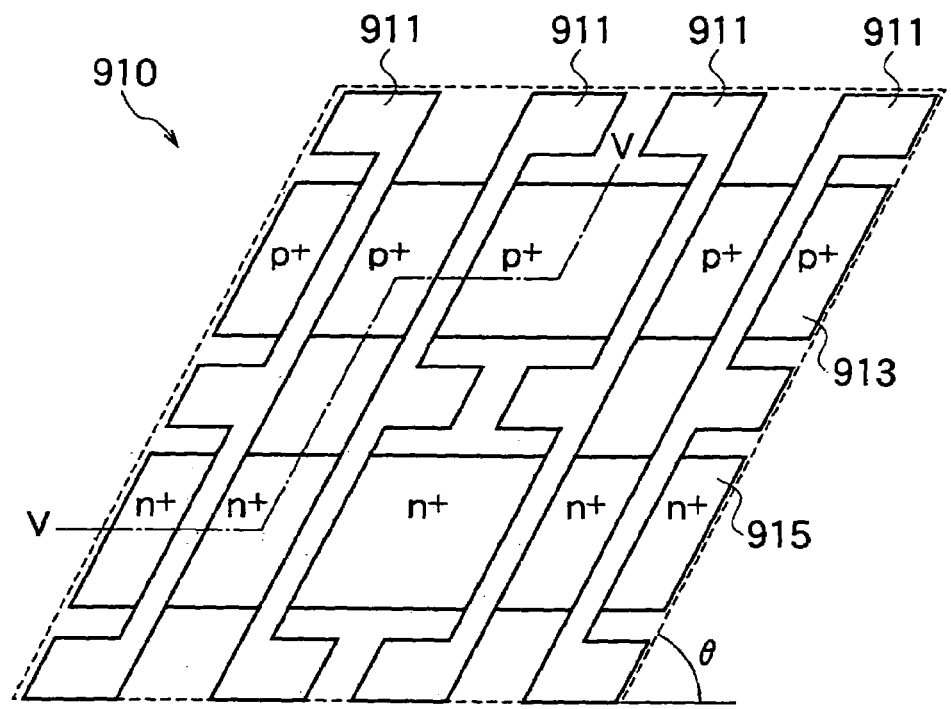
FIG. 77 is a plane view illustrating an example of a basic cell designed by the computer implemented design system according to the fourth embodiment of the present invention.

(d) Subsequently, in step S311c, the cell design subunit 21 judges whether diagonal cells are to be employed for the basic cells arranged in the chip area, based on the design information extracted in the step S311a. In case of arranging the diagonal cells, the procedure proceeds to the step S311d, and a plurality of the basic cells 910 with the geometry defined as a parallelogram as shown in FIG. 77 are arranged in lines around the macro cell 903 in the chip area surrounded by the I/O cells 901. The basic cells 910 may be arranged in lines parallel or perpendicular to the lines in which the I/O cells 901 are arranged around the chip area as shown in FIG. 79. Alternatively, as shown in FIG. 80, the basic cells 910 are arranged in lines diagonal to the lines in which the I/O cells 901 are arranged around the chip area. In the case where the basic cells are not diagonal cells, in step S311e, quadrangle cells are generally used and arranged in the chip area, and the procedure then proceeds to step S315.

Steps S315 to S330 are the same as the steps S115 to S130 shown in FIG. 14, and the redundant description is omitted. With the computer implemented design method according to the fourth embodiment, the cell design subunit 21 arranges parallelogram diagonal cells stored in the diagonal cell geometry information storage subsection 56 in the virtual chip area of the computer implemented design system, thus facilitating design in applying diagonal wiring to layers above the cells. Moreover, changing the cell geometry from the usual rectangle to the parallelogram increases the gate width without changing the cell width. Accordingly, the power supply density of the semiconductor IC can be increased by arranging new wiring in the increased gate region.

Figure 81:
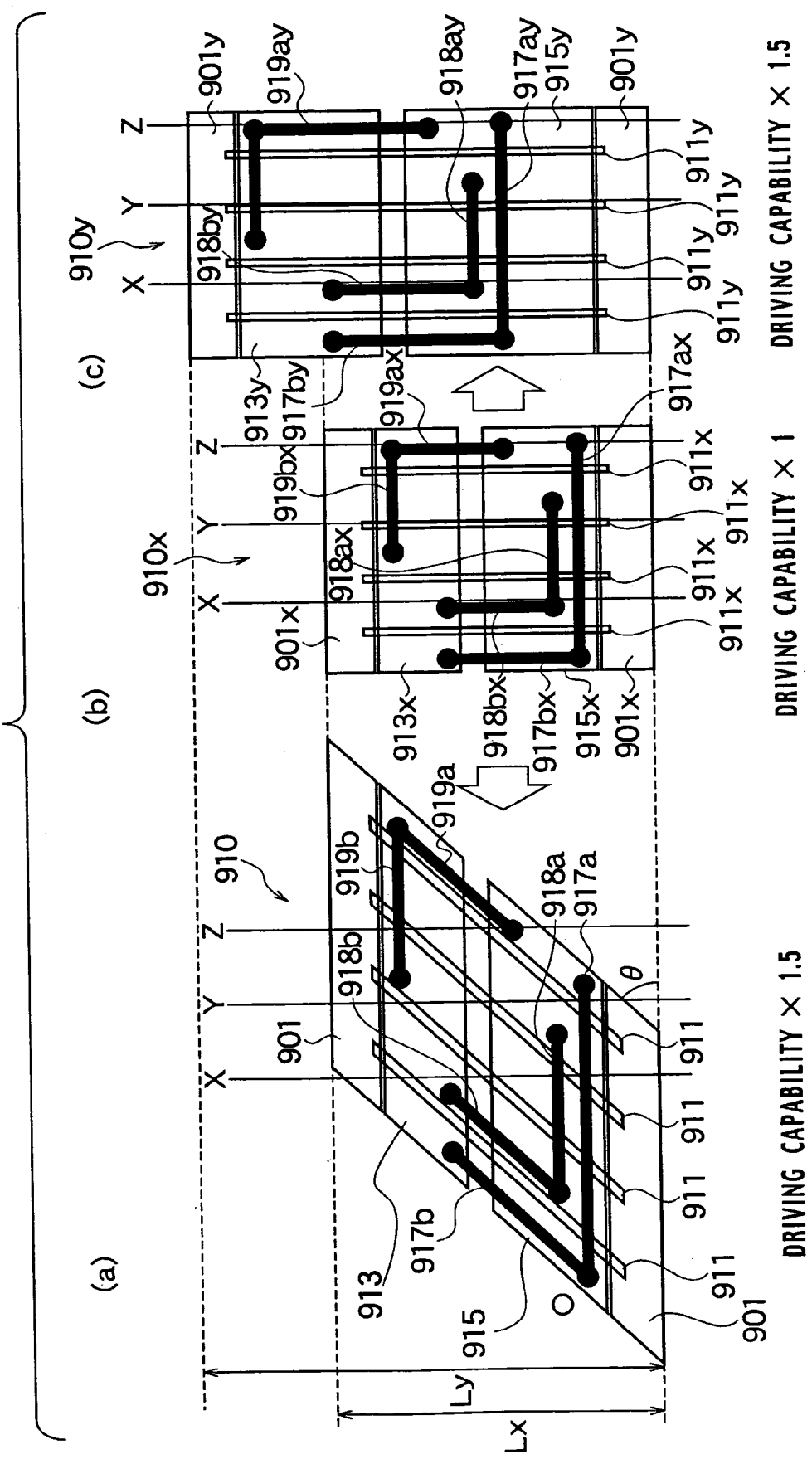
FIG. 81 is a conceptual view illustrating CAD data of the basic cell and comparative examples of the basic cell designed by the computer implemented design system according to the fourth embodiment of the present invention.

FIG. 81A shows an example of CAD data of the basic cell 910 which can be designed based on the computer implemented design system according to the fourth embodiment. As comparative examples, FIGS. 81B and 81C show basic cells 910x and 910y which can be designed by the earlier technique computer implemented design system. In FIGS. 81A to 81C, driving capabilities thereof are compared based on line connection requirements under the same conditions. The basic cell 910 shown in FIG. 81A includes a p+ semiconductor region 913 and an n+ semiconductor region 915 each having a parallelogram geometry. The I/O cells 901 are arranged around the p+ semiconductor region 913 and the n+ semiconductor region 915. Gate electrodes 911 extend in the p+ semiconductor region 913 and the n+ semiconductor region 915. Wiring lines 917a, 917b, 918a, 918b, 919a, and 919b are arranged on a layer above the gate electrodes 911.

When the driving capability of the basic cell 910x shown in FIG. 81B is increased 1.5 times, the cell width Ly of the basic cell 910*y* is made 1.5 times larger than the width Lx of the basic cell 910*x* as shown in FIG. 81C. However, it is apparent from FIG. 81C that increasing the cell width Ly of the basic cell 910*y* may reduce the degree of integration of the wiring lines 917 arranged on the basic cell 910*y* in some cases.

On the other hand, when using the basic cell 910 shown in FIG. 81A according to the fourth embodiment, the gate width can be increased without changing the cell width Lx of the basic cell 910 by diagonally arranging the gate electrodes 911. Furthermore, the basic cell 910 shown in FIG. 81A includes a power supply density comparable to that of the basic cell 910*x* shown in FIG. 81B, whose driving capability has not yet been increased by 1.5 times. Furthermore, in the basic cell 910 shown in FIG. 81A, diagonal arrangement of the gate electrodes 911 increases the space where wiring lines can be arranged. Accordingly, it is possible to implement wiring with a higher density of power supply lines than in the basic cell 910*x* shown in FIG. 81B by drawing new wiring in the increased space.

Comparison is made on the number of lateral wiring lines which cross real lines X, Y, and Z as shown in FIGS. 81A to 81C. In the basic cell 910 shown in FIG. 81A, the real line X crosses two wiring lines, namely, the wiring lines 917*a* and 918*b*, the real line Y crosses a wiring line, namely, the wiring line 917*a*, and the real line Z crosses two wiring lines, namely, the wiring lines 918*a* and 919*b*. On the other hand, in the comparative example shown in FIG. 81B, the real line X crosses two wiring lines, namely, the wiring lines 917*ax* and 918*ax*, the real line Y crosses three wiring lines, namely, the wiring lines 917*ax*, 918*ay*, and 919*bx*, and the real line Z crosses two wiring lines, namely, the wiring lines 917*ax* and 919*ax*. Accordingly, it is found that the use of the basic cell 910 shown in FIG. 81A reduces overlaps of wiring lines in the gate length direction. With the computer implemented design method according to the fourth embodiment, it is possible to provide a semiconductor IC with the power supply density increased by arranging new wiring combining orthogonal and diagonal wiring lines in the gate length direction in the free space.

-Semiconductor IC-

FIGS. 77 to 80 show examples of the basic cell 910 and the master chips 902*a* to 902*c* of the semiconductor IC manufactured based on CAD data which can be designed by the computer implemented design system according to the fourth embodiment. As shown in FIG. 77, each basic cell 910 is a parallelogram with an exterior angle θ of 45 degrees and includes the gate electrodes 911, the p+ semiconductor region 913, and the n+ semiconductor region 915. The p+ semiconductor region 913 and the gate electrodes 911 can constitute p-channel MOS transistors (pMOS transistors). The n+ semiconductor region 915 and the gate electrodes 911 can constitute n-channel MOS transistors (nMOS transistors). The master chip 902*a* shown in FIG. 78 can be constituted by arranging the basic cells 910 shown in FIG. 77 in the chip area of the semiconductor substrate 90 and arranging the I/O cells 901 in the periphery of the basic cells 910 in the chip area.

As shown in FIG. 79, the master chip 902*b* can be constituted by arranging the macro cell 903 in the chip area where the I/O cells 901 are arranged in the vicinity thereof and arranging the plurality of basic cells 910 in lines parallel or perpendicular to the lines which the I/O cells 901 form in the remainder of the chip region of the semiconductor substrate 90 where the I/O cells 901 and the macro cells 903 are arranged. As shown in FIG. 80, the master chip 902*c* can be constituted by arranging the plurality of basic cells 910 at a 45-degree diagonal to the lines composed of the I/O cells 901 in the remainder of the chip area where the I/O cells 901 and the macro cells 903 are arranged.

With the computer implemented design system according to the fourth embodiment, the basic cells 910 whose geometry is defined as a parallelogram are arranged in the device forming region of the semiconductor substrate 90. Changing the cell geometry of the basic cell 910 from the usual rectangle to the parallelogram increases the gate width without changing the cell width. Accordingly, the power supply density of the semiconductor IC can be increased by arranging new wiring in the increased gate region. Furthermore, proper diagonal wiring in accordance with the geometry of the basic cells 910 allows more wiring lines to be arranged. Therefore, it is possible to provide a semiconductor IC with a high power supply density.

-Semiconductor IC Manufacturing Method-

Next, a description will be given of a method of manufacturing the basic cell 910 of the semiconductor IC according to the fourth embodiment. FIGS. 82 to 94 show examples of a cross section of the basic cell 910 shown in FIG. 77 taken along a line V—V. The following method of manufacturing a basic cell is just an example and can certainly be implemented by other various manufacturing methods including modified examples.

Figure 82:
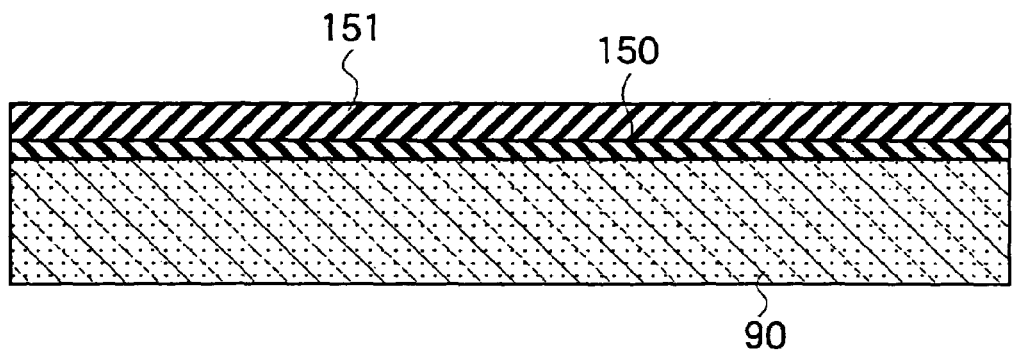
FIGS. 82 to 94 are sectional views illustrating methods of manufacturing the basic cell according to the fourth embodiment of the present invention.
Figure 83:
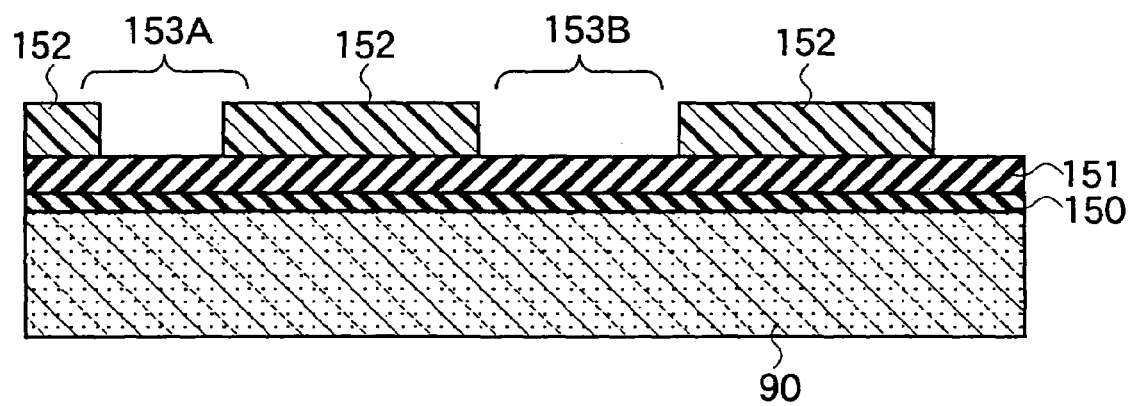

(a) As shown in FIG. 82, a silicon dioxide film ($SiO_2$ film) 150 is formed on the surface of the silicon semiconductor substrate 90 by thermal oxidation or the like. A silicon nitride film ($Si_3N_4$ film) 151 is then grown on the $SiO_2$ film 150 by CVD. On the silicon nitride film 151, a photoresist film 152 is applied. A photoresist film 152 is patterned by a photolithography technology to form openings 153A, 153B, and 153C as shown in FIG. 83.

Figure 84:
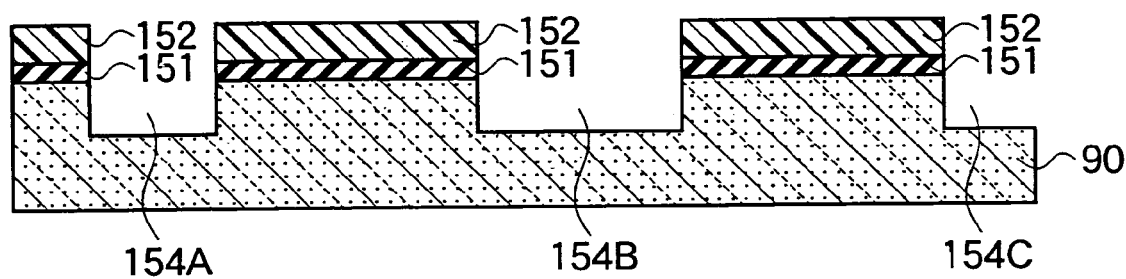
Figure 85:
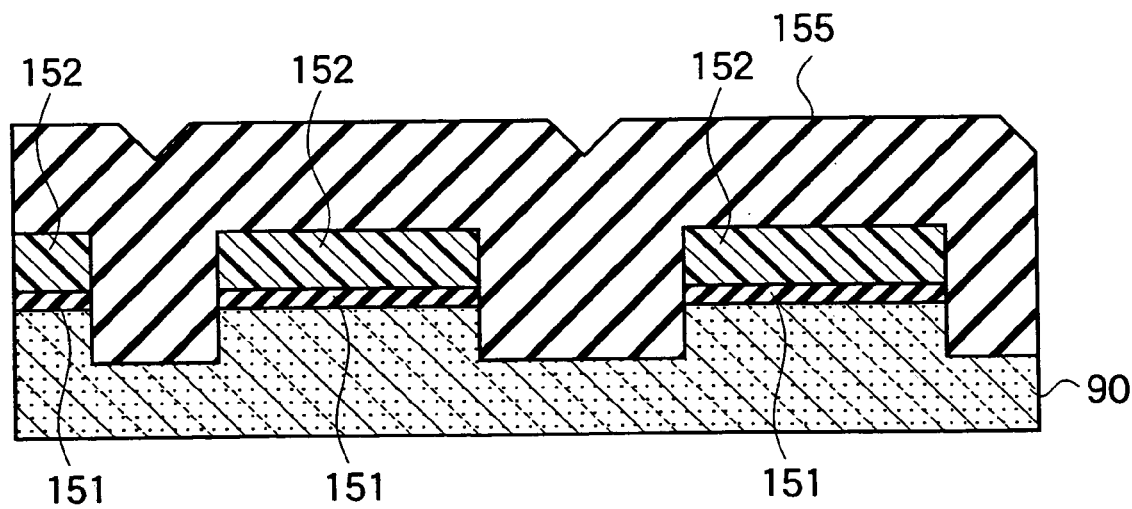

(b) Next, the semiconductor substrate 90 is selectively removed by reactive ion etching (RIE) using the patterned photoresist film 152 as a mask to form device isolation trenches 154A, 154B, and 154C. Subsequently, the photoresist film 152 is removed as shown in FIG. 84, and then an oxidation film is embedded in the device isolation trenches 154A, 154B, and 154C by CVD as shown in FIG. 85. The surface of the oxidation film 155 is polished by CMP to be planarized.

Figure 86:
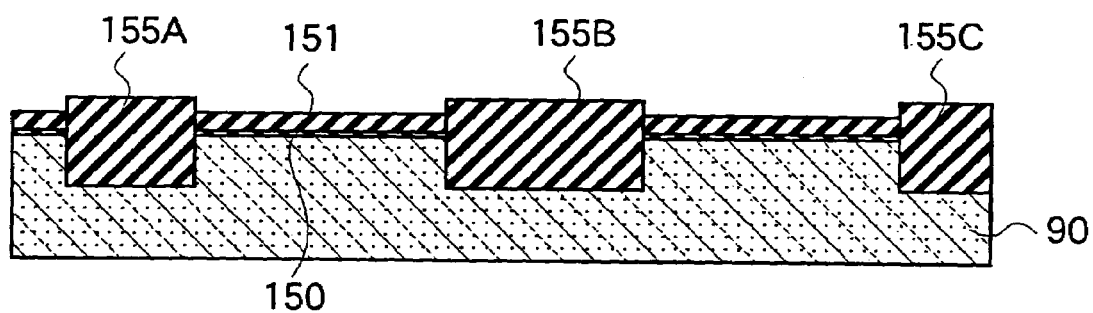
Figure 87:
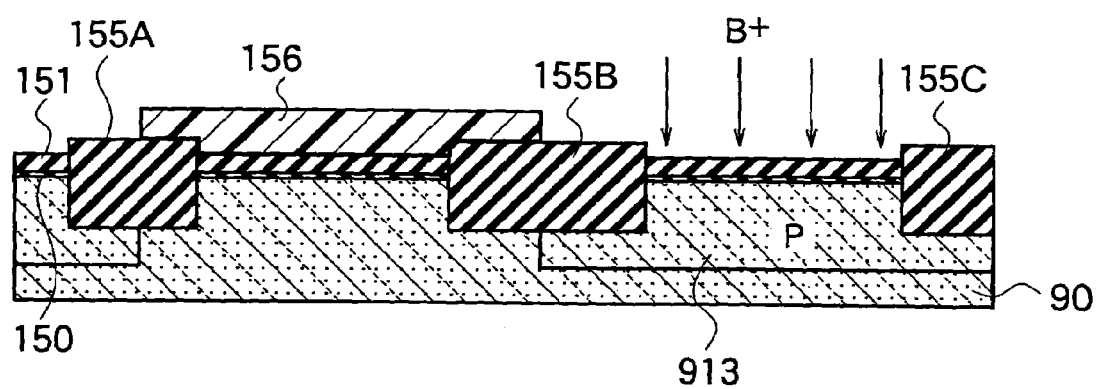

(c) Subsequently, as shown in FIG. 86, the silicon nitride film 151 on the surface of the semiconductor substrate 90 is wet-etched for sacrificial oxidation. As shown in FIG. 87, a photoresist film 156 patterned by a photolithography technology is then formed on the semiconductor substrate 90. Next, p type impurity ions such as boron (B) are selectively implanted into the semiconductor substrate 90, and then the photoresist film 156 is removed by a remover or the like.

Figure 88:
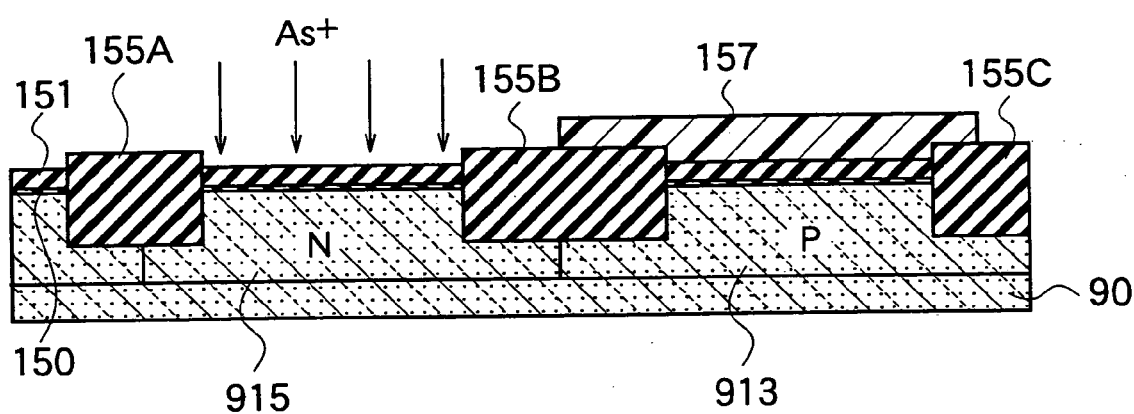
Figure 89:
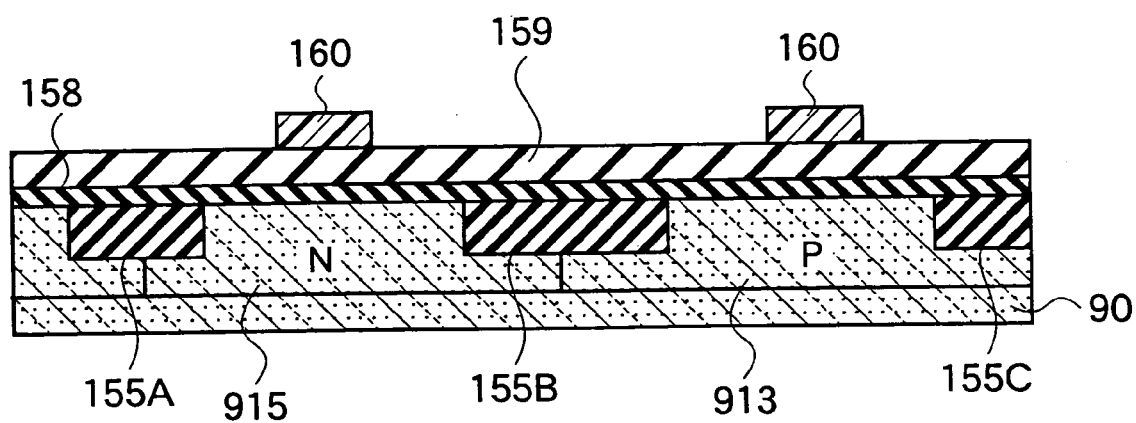

(d) Furthermore, as shown in FIG. 88, a photoresist film 157 patterned by a lithography technology is formed on the semiconductor substrate 90, and n-type impurity ions such as phosphorus ($P^+$) and arsenic ($As^+$) are selectively implanted into the semiconductor substrate 90. The photoresist film 157 is then removed by a remover or the like. Subsequently, the nitride film (sacrificial oxidation film) 151 subjected to sacrificial oxidation is removed by wet etching, and the implanted impurity ions are subjected to heat treatment (drive in). Subsequently, a p-well 90*a* and an n-well 90*b* are formed inside the semiconductor substrate 90 as shown in FIG. 89 without removing the thermal oxidation film (not-shown) formed on the surface of the semiconductor substrate 90.

Figure 90:
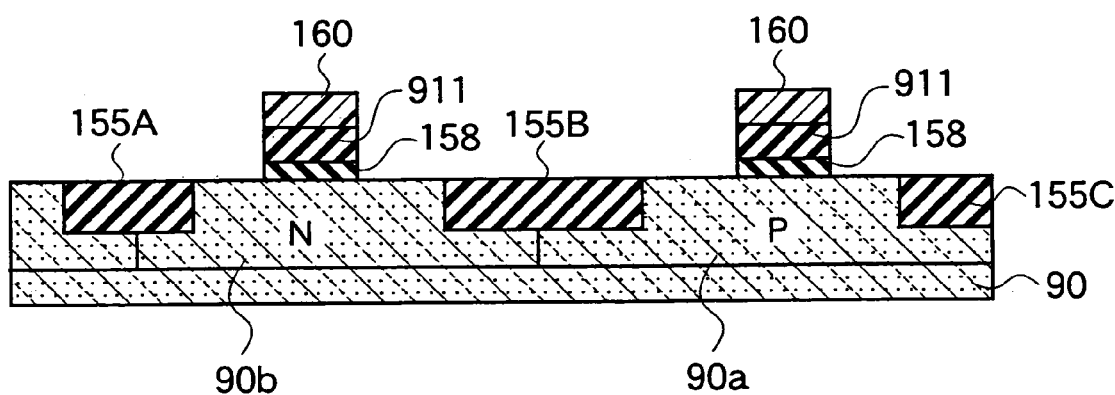

(e) Furthermore, a gate oxidation film 158 is formed on the surface of the semiconductor substrate 90, and a polycrystalline silicon film 159 is deposited on the entire surface of the gate oxidation film 158 by CVD. Subsequently, a photoresist film 160 patterned by a photolithography technology is formed on the polycrystalline silicon film 159. The polycrystalline silicon film 159 is selectively removed by lithography of anisotropic etching by using this photoresist film 160 as a mask to form gate electrodes 911 as shown in FIG. 90. The photoresist film 160 formed on each gate electrode 911 is then removed by a remover.

Figure 91:
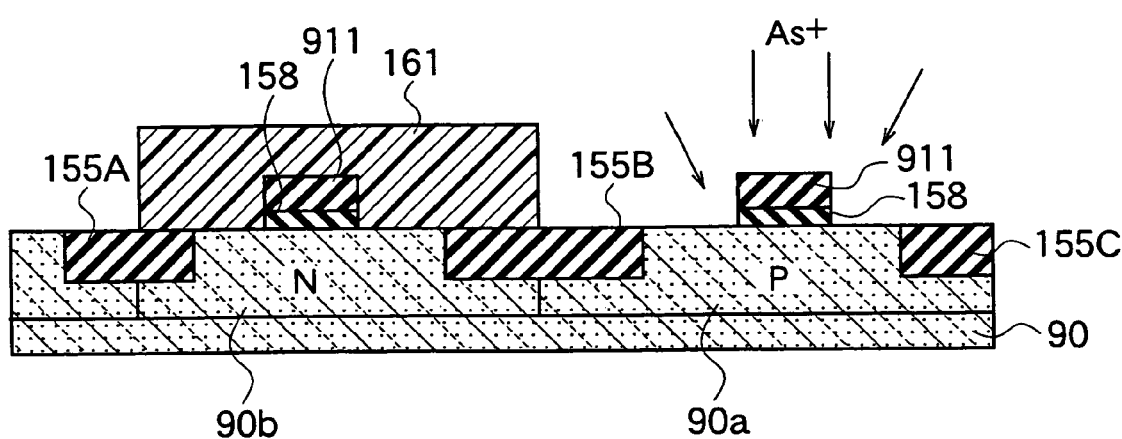

(f) Next, as shown in FIG. 91, a photoresist film 161 patterned by a lithography technology is formed on the n well 90b. N type impurity ions such as $P^+$ and $As^+$ are selectively implanted by using the photoresist film 161 and the gate electrode 911 on the p well 90a as a mask. The photoresist film 161 is then removed by a remover.

Figure 92:
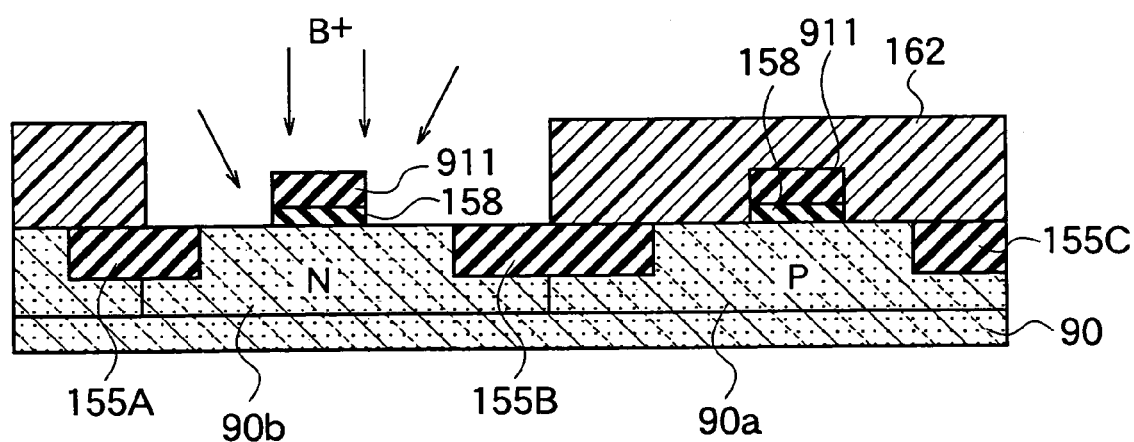

(g) Subsequently, as shown in FIG. 92, a photoresist film 162 patterned by a lithography technology is formed on the p well 90a, and p-type impurity ions such as B are selectively implanted by using the photoresist film 161 and the gate electrode 911 on the n well as a mask. The photoresist film 162 is then removed by a remover.

Figure 93:
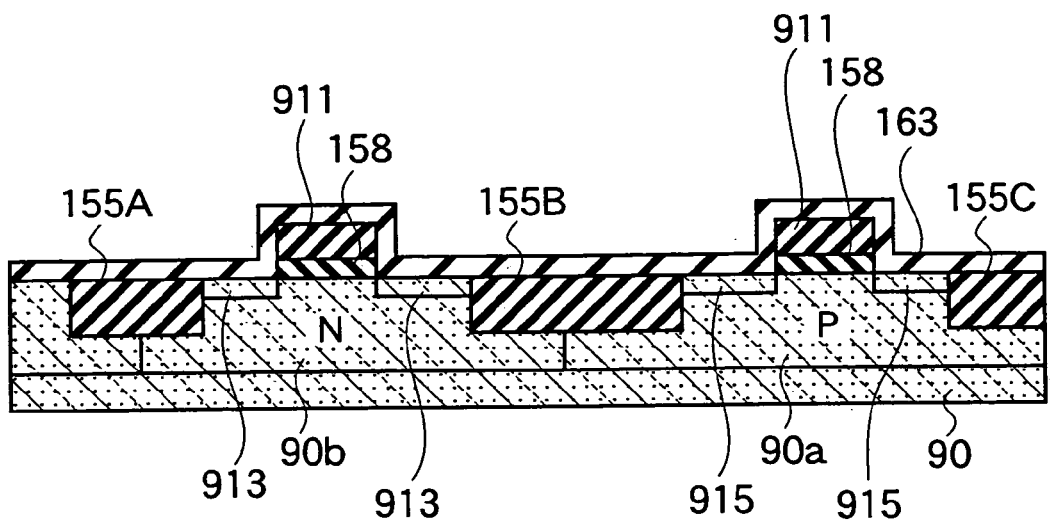

(h) Next, $n^+$ and $p^+$ type source/drain regions 913 and 915 are formed as shown in FIG. 93 by activating and diffusing the impurity ions by a thermal treatment (Rapid Thermal Anneal: RTA) to form an n-channel MOS transistor and a p-channel MOS transistor, respectively. Subsequently, after the upper surfaces of the gate electrodes 911 are made into a silicide, a contact etch stop layer 163 is deposited on the entire surface.

Figure 94:
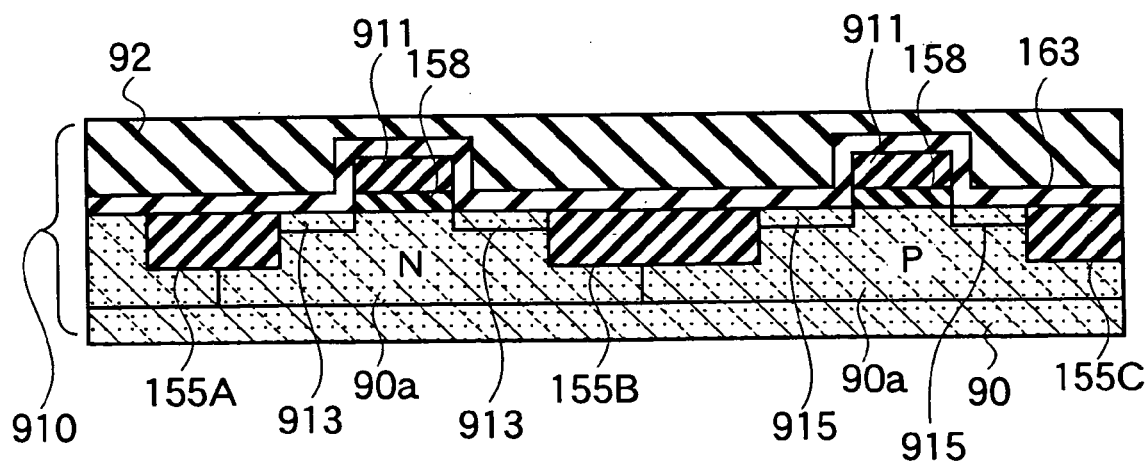

(i) Next, the first interlayer dielectric 92 is deposited on the contact etch stop layer 163 by CVD, and the surface of the k-th interlayer dielectric 93 is polished by CMP to be planarized as shown in FIG. 94. Subsequently, contact holes connecting transistors are formed in the k-th interlayer dielectric 93, and necessary wiring of copper (Cu) or the like is embedded so as to form the basic cell 910 according to the fourth embodiment.

Figure 95:
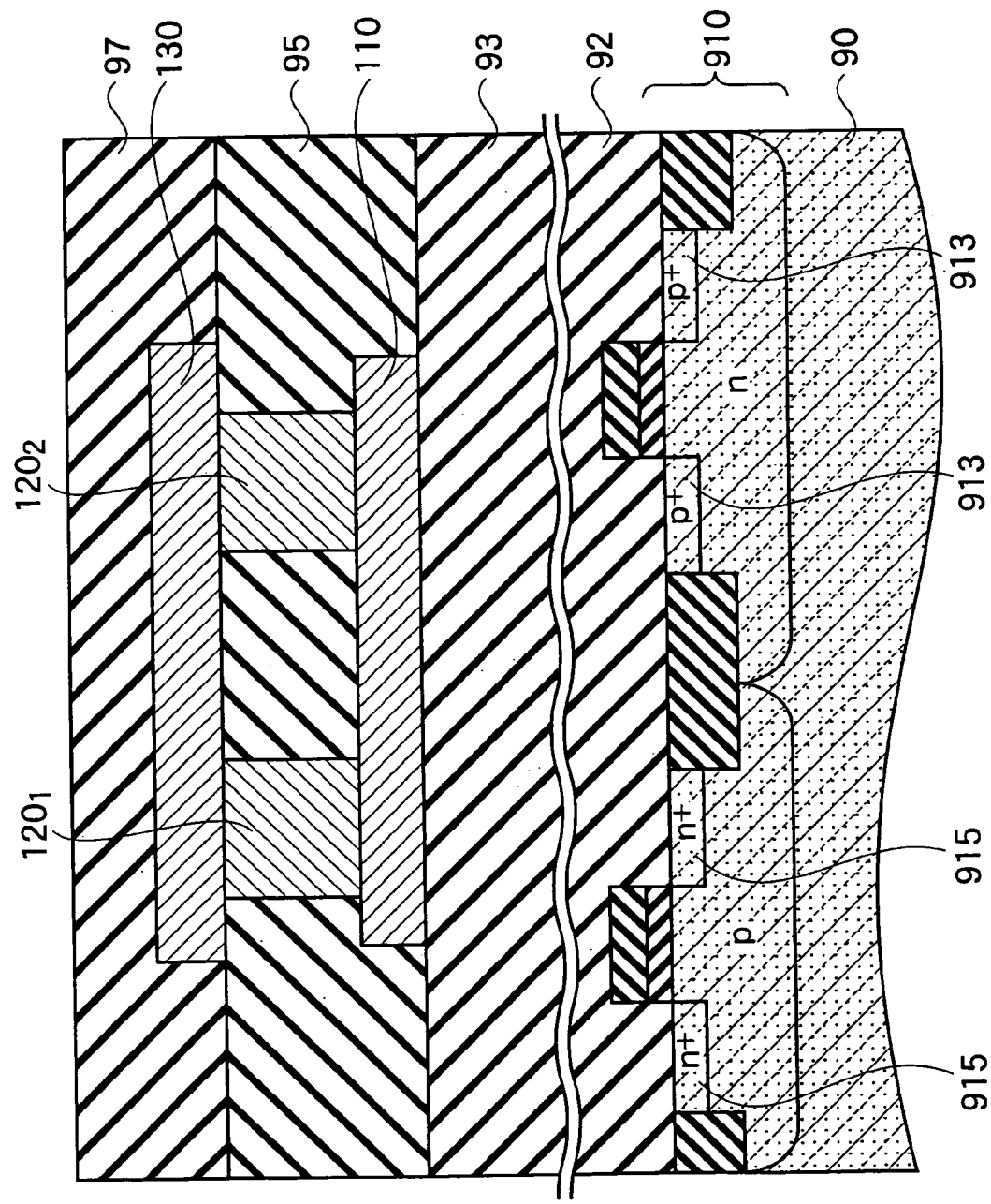
FIG. 95 is a sectional view illustrating an example of the semiconductor IC according to the fourth embodiment of the present invention.

Furthermore, the basic cell 910 shown in FIG. 94 is arranged in the device forming region of the semiconductor substrate 90 to provide the semiconductor IC shown in FIG. 95. The structure of layers above the first interlayer dielectric 92 of FIG. 95 is the same as that of the semiconductor IC shown in FIG. 46. With the semiconductor IC using the basic cell 910 according to the fourth embodiment, the parallelogram basic cell 910 with a pair of opposite angles of 45 degrees is arranged in the device forming region of the semiconductor substrate 90, thus facilitating design by arranging diagonal wiring in the layers above the basic cell 910. Changing the cell geometry of the usual basic cell 910, which was a rectangle, to a parallelogram increases the gate width without changing the cell width of the basic cell. Accordingly, it is possible to provide a semiconductor IC with power supply density increased by arranging new wiring in the increased gate region.

(Other Embodiments)

Various modifications will become possible for those skilled in the art upon receiving the teachings of the present disclosure without departing from the scope thereof. For example, the vias or via plugs may not be the only ones connecting two wiring layers adjacent to each other but also stacked vias or stacked via plugs penetrating a plurality of wiring layers are also possible.

What is claimed is:

1. A reticle set comprising:
    a first reticle including a first wiring pattern having a strip-shaped first termination pattern;
    a second reticle including a plurality of via patterns so as to overlap with the first termination pattern; and
    a third retiele including a second wiring pattern having a strip-shaped second termination pattern and a second line pattern connected to an end of the second termination pattern, the second termination pattern being extended in the same direction as the first termination pattern so as to overlap with the first termination pattern, and the second line pattern extends diagonal to die direction the second termination pattern extends.

2. The reticle set of claim 1, wherein the via patterns are arranged at positions overlapped away from a connecting portion of the second tenninalion pattern and the second line pattern.

3. The reticle set of claim 1, wherein the via patterns include an octagonal via pattern.

4. The reticle set of claim 1, further comprising an octagonal dummy pattern arranged apart from the first wiring pattern.

* * * * *